United States Patent [19]
Hunter

[11] Patent Number: 6,048,813
[45] Date of Patent: Apr. 11, 2000

[54] SIMULATED DIAMOND GEMSTONES FORMED OF ALUMINUM NITRIDE AND ALUMINUM NITRIDE: SILICON CARBIDE ALLOYS

[75] Inventor: Charles Eric Hunter, Hilton Head Island, S.C.

[73] Assignee: Cree, Inc., Durham, N.C.

[21] Appl. No.: 09/169,385

[22] Filed: Oct. 9, 1998

[51] Int. Cl.⁷ .............................. C03B 29/36; C03B 29/38
[52] U.S. Cl. .............................. 501/86; 501/92; 501/98.4; 63/32
[58] Field of Search .............................. 501/86, 92, 98.4; 63/32; 117/951, 952

[56] References Cited

U.S. PATENT DOCUMENTS

| | | | |
|---|---|---|---|
| Re. 34,861 | 2/1995 | Davis et al. ............................ | 501/86 |
| 5,723,391 | 3/1998 | Hunter et al. ............................ | 437/100 |
| 5,858,086 | 1/1999 | Hunter ............................ | 117/84 |
| 5,882,786 | 3/1999 | Nassau et al. ............................ | 63/32 |
| 5,954,874 | 9/1999 | Hunter ............................ | 117/84 |
| 5,972,109 | 10/1999 | Hunter ............................ | 117/204 |

OTHER PUBLICATIONS

Hurlbut, Cornelius S. and Kammerling, Robert C. "Gemology" 2nd Edition pp. 309–324 (1991) no month.

*Primary Examiner*—Karl Group
*Attorney, Agent, or Firm*—Richard S. Faust

[57] ABSTRACT

Simulated diamond gemstones are produced by faceting and polishing bulk single crystals of colorless synthetic aluminum nitride or aluminum nitride:silicon carbide alloys.

8 Claims, 32 Drawing Sheets

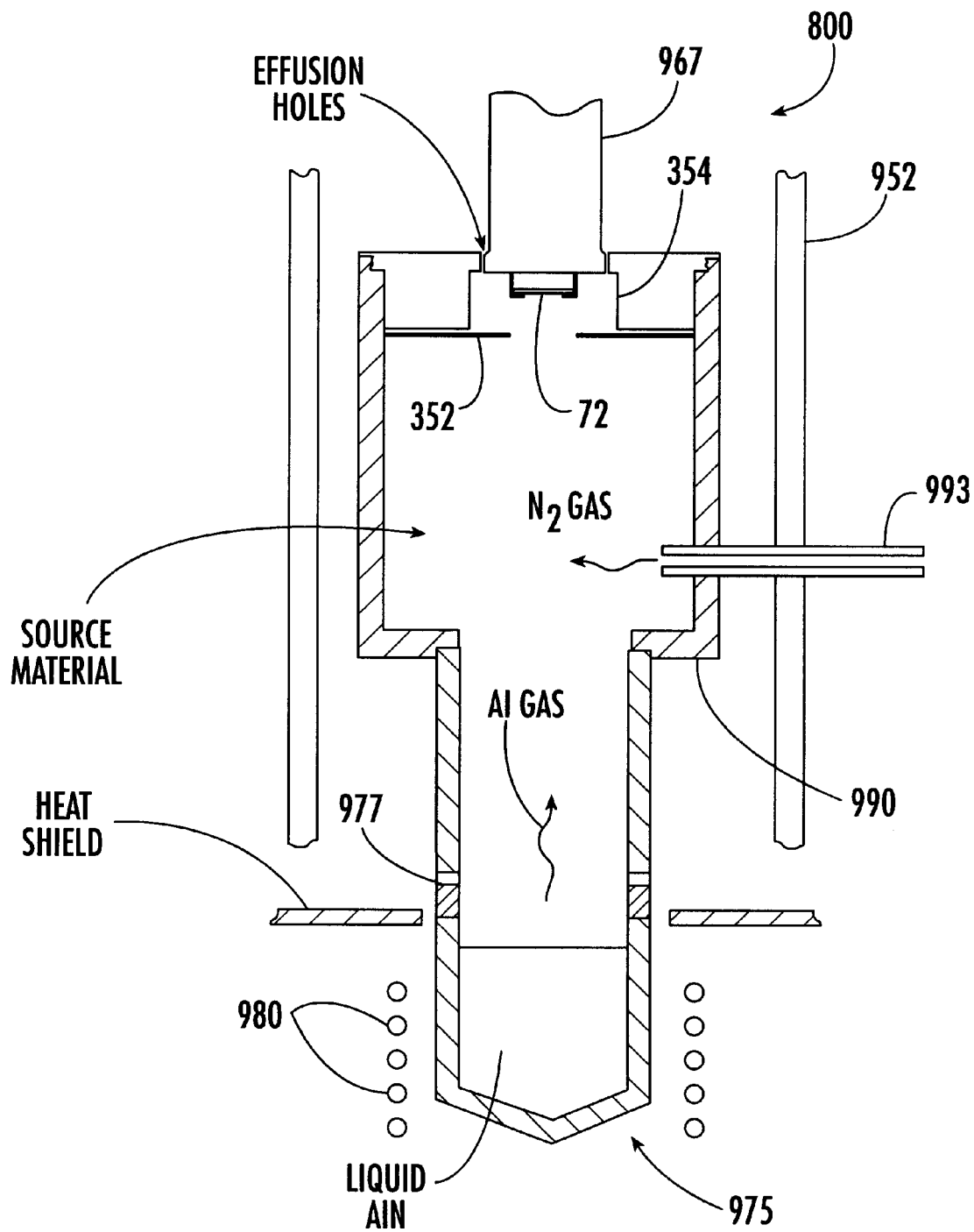
FIG. 8B1.

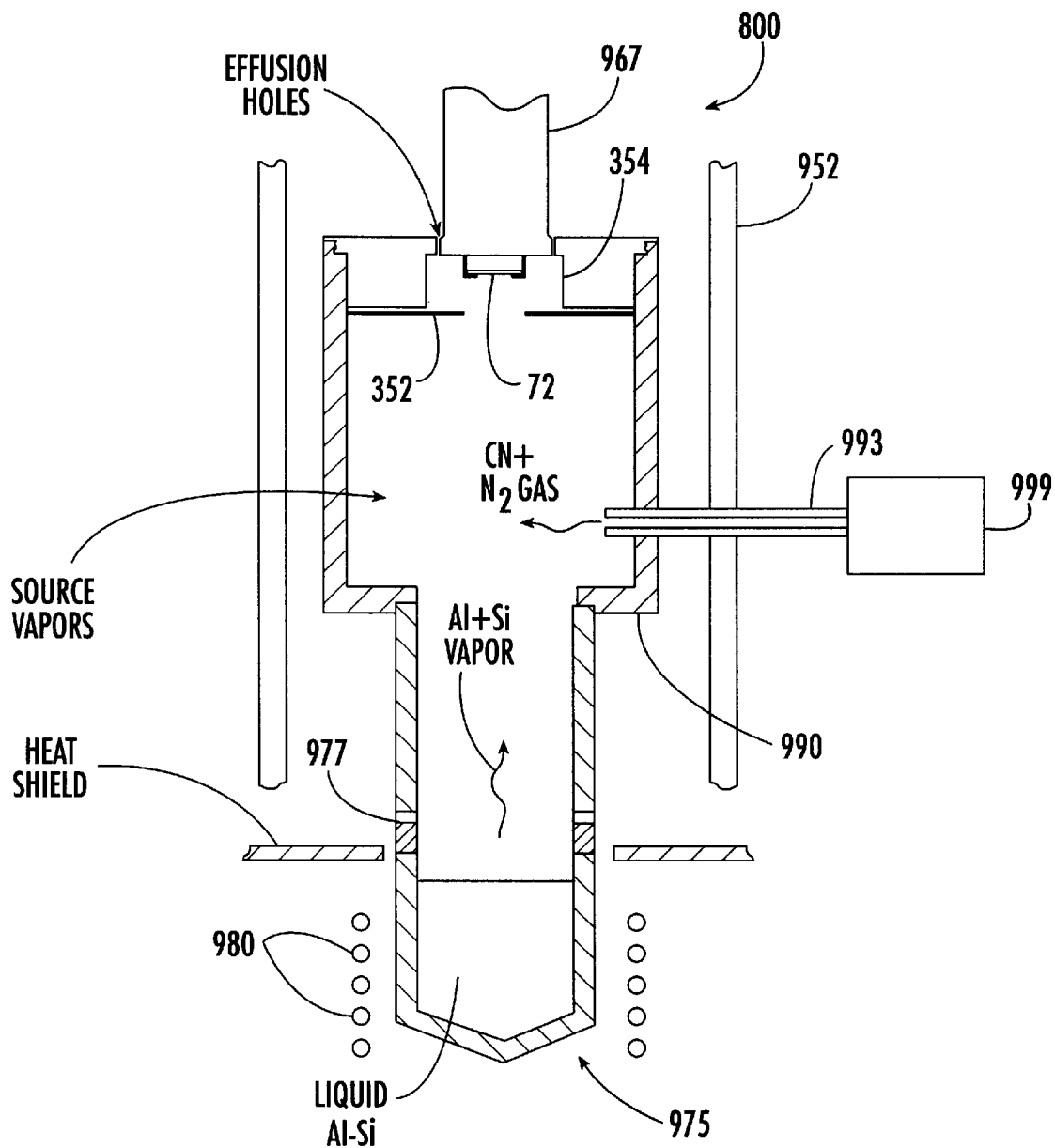
FIG. 8B2.

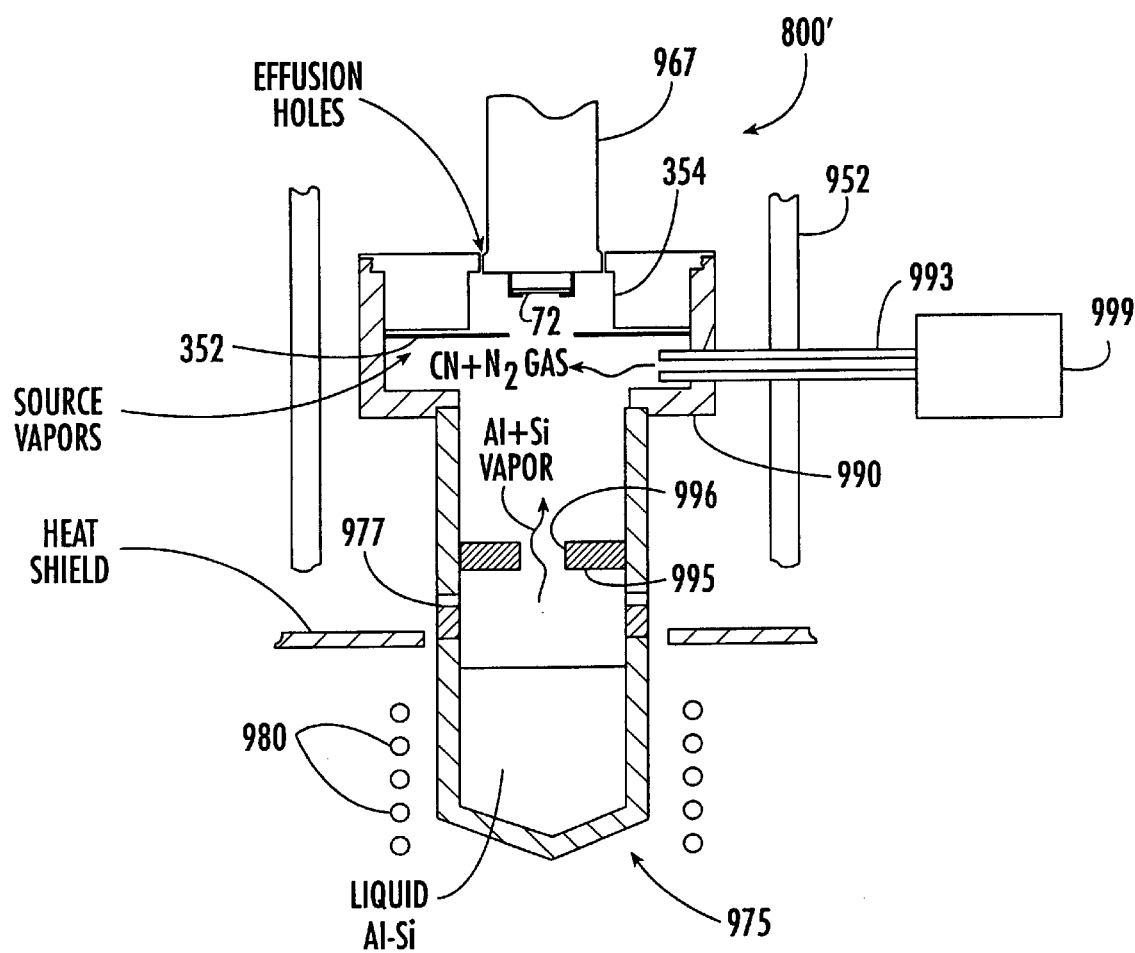

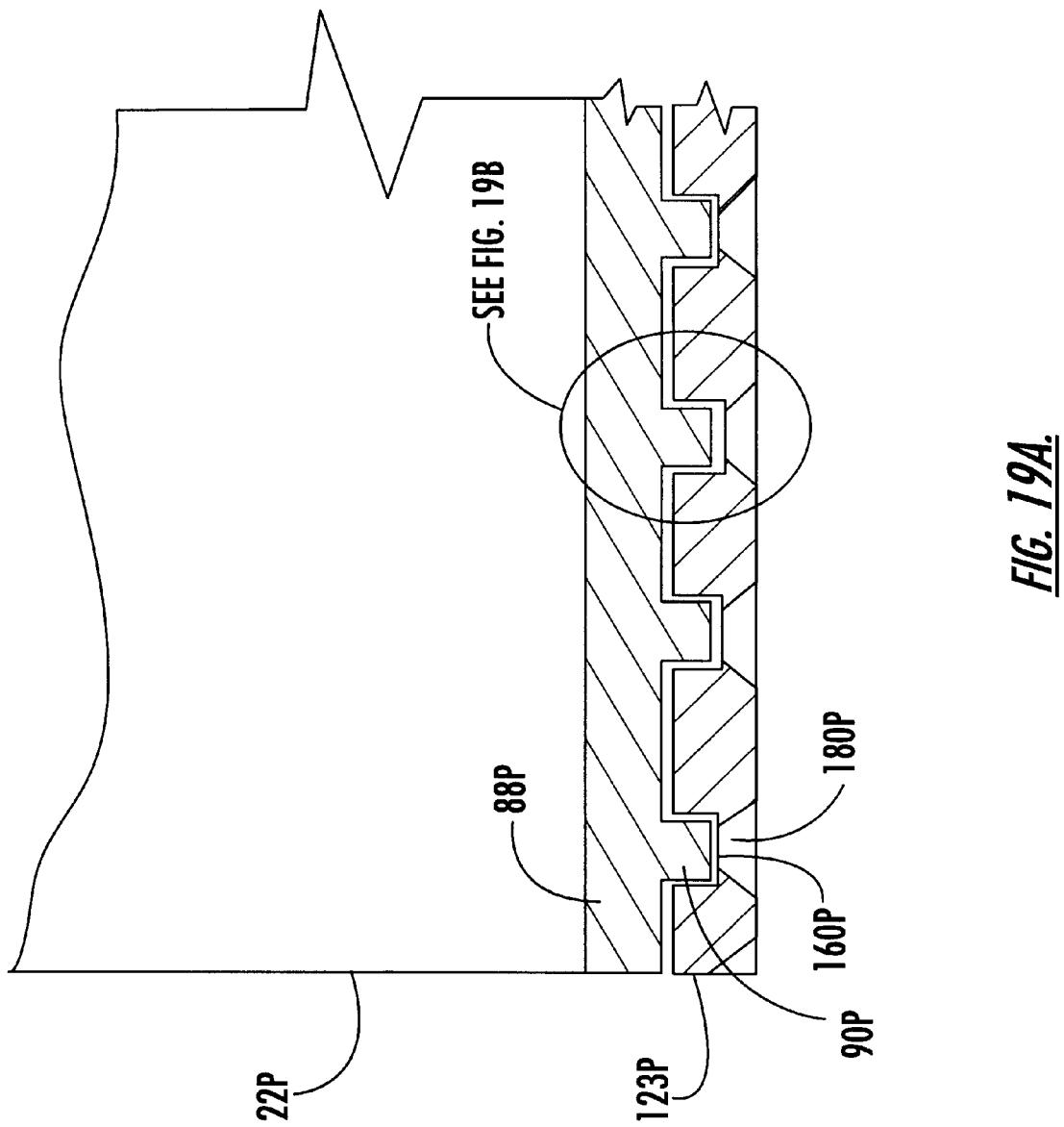

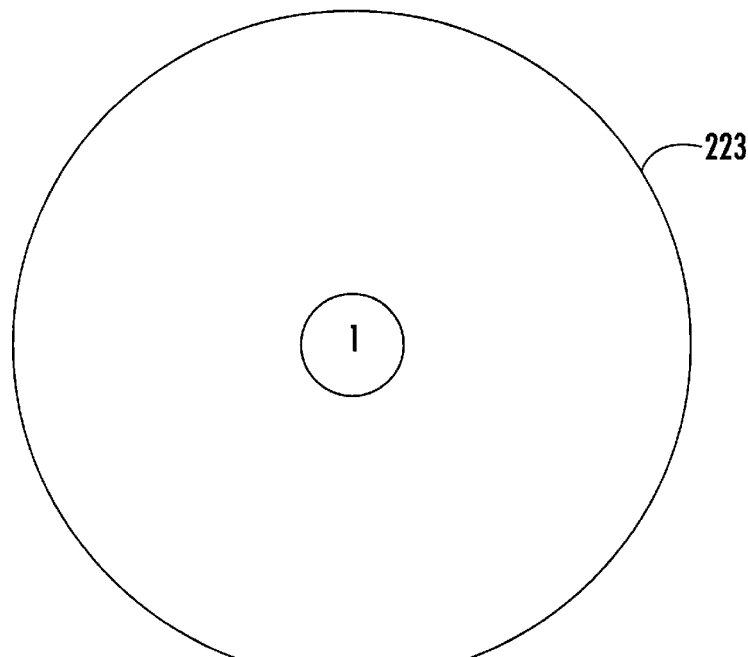
FIG. 26A.   t = 0
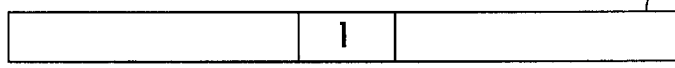
FIG. 26B.
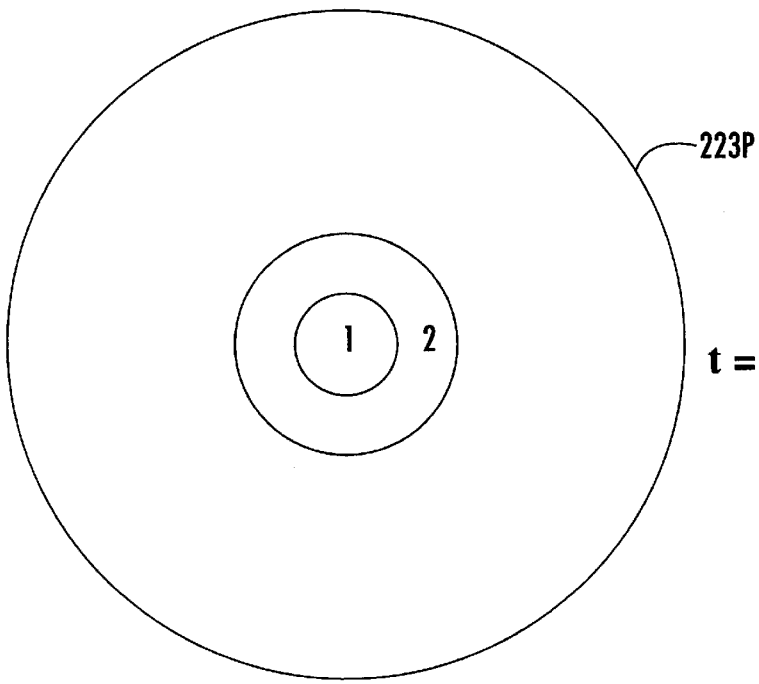
FIG. 27A.   t = 1 HOUR
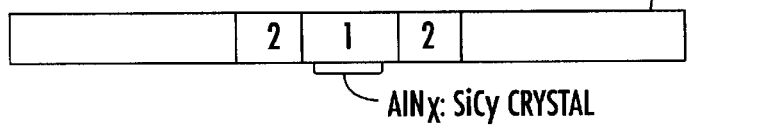
FIG. 27B.

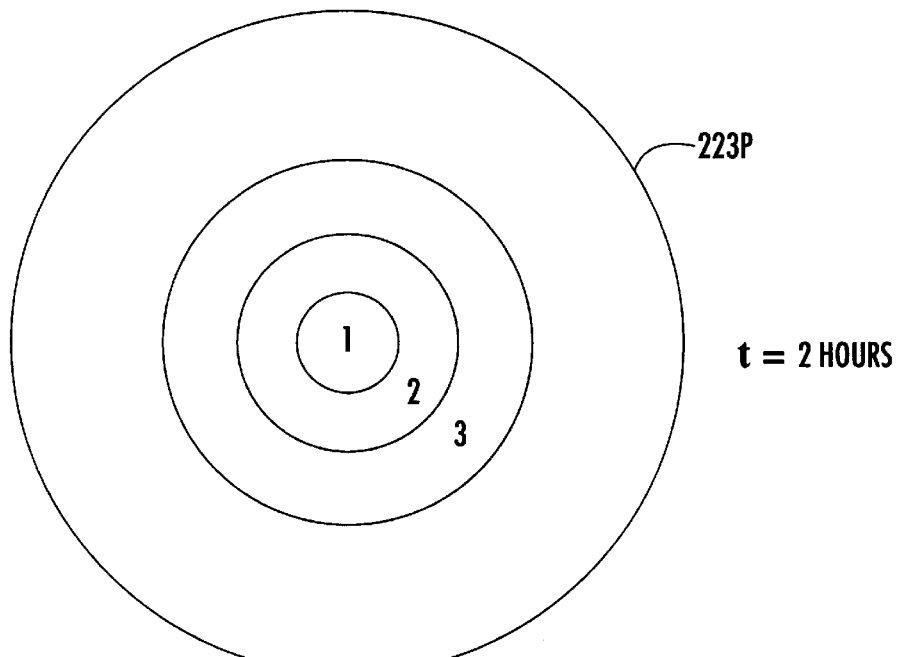
*FIG. 28A.*  t = 2 HOURS
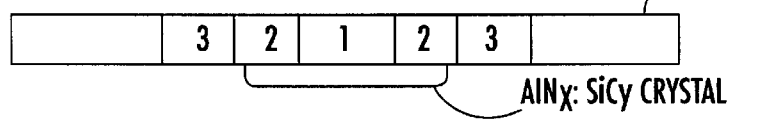
*FIG. 28B.*
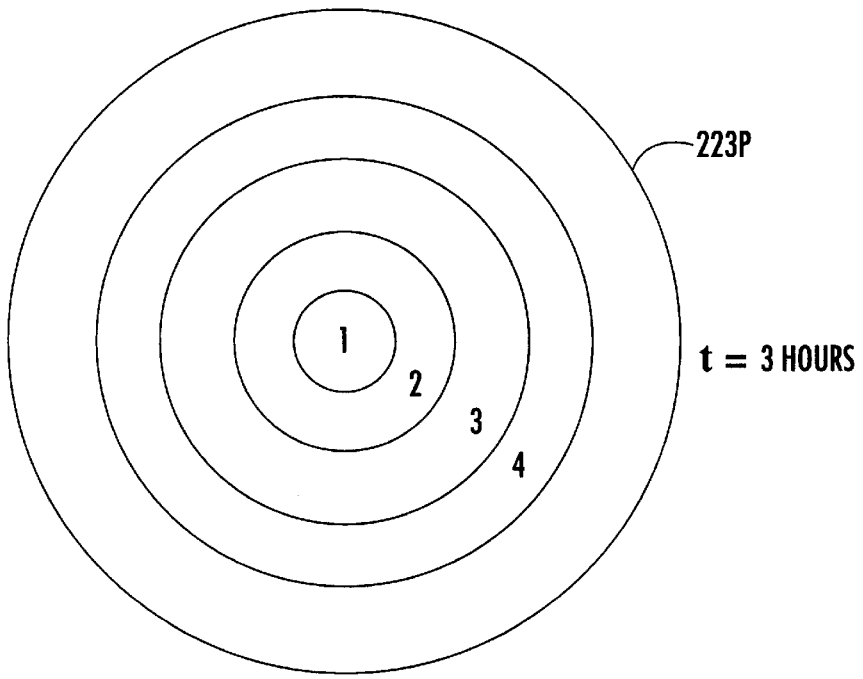
*FIG. 29A.*  t = 3 HOURS
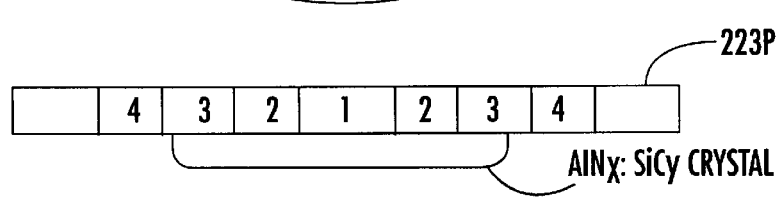
*FIG. 29B.*

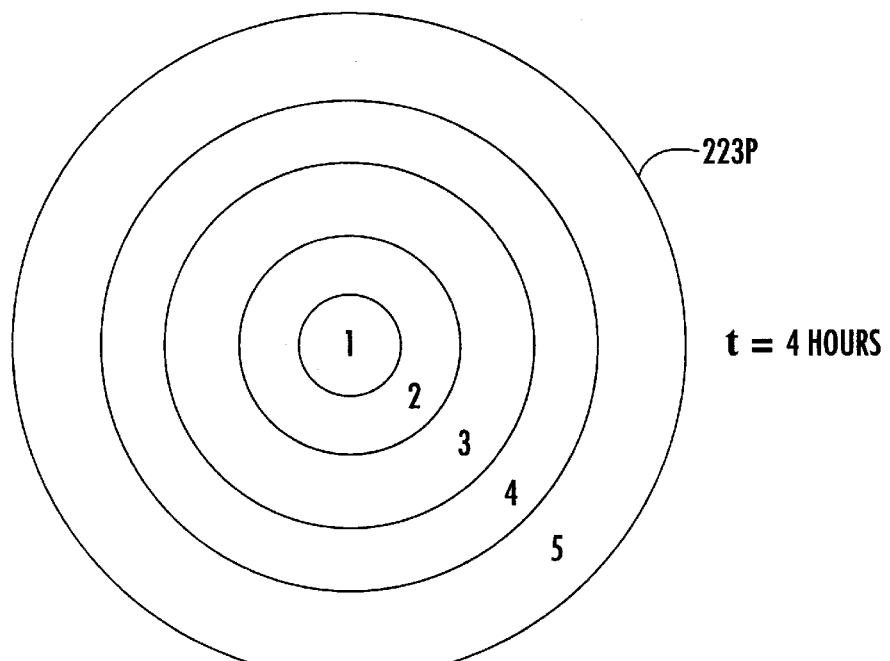
FIG. 30A.   t = 4 HOURS
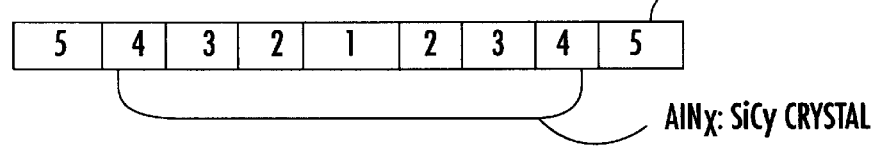
FIG. 30B.   AlN$_x$: SiC$_y$ CRYSTAL
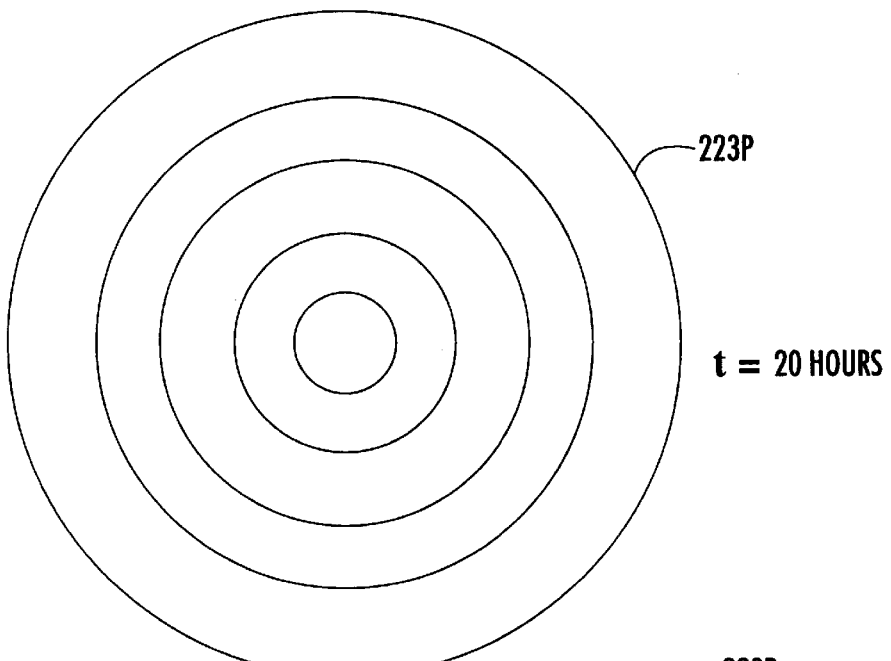
FIG. 31A.   t = 20 HOURS
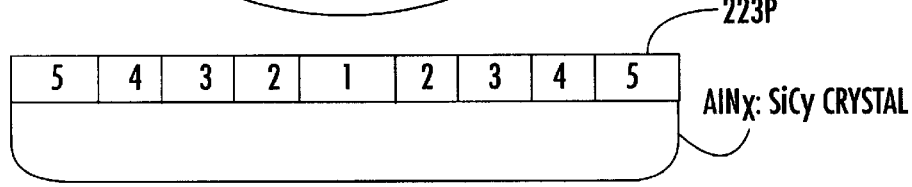
FIG. 31B.   AlN$_x$: SiC$_y$ CRYSTAL

SIMULATED DIAMOND GEMSTONES FORMED OF ALUMINUM NITRIDE AND ALUMINUM NITRIDE: SILICON CARBIDE ALLOYS

FIELD OF THE INVENTION

The invention relates to synthetic gemstones. More particularly, the invention relates to simulated diamond gemstones formed from colorless aluminum nitride (AlN) single crystals and colorless aluminum nitride:silicon carbide (AlN:SiC) alloy single crystals.

BACKGROUND OF THE INVENTION

Gemstones Generally

There are a limited number of elements and chemical compounds that have the physical characteristics to be useful as gemstones. The physical characteristics that are generally accepted as being most important are hardness, refractive index and color, although thermal stability, chemical stability and toughness are also considered important in many gemstone applications.

To date, the only chemical substances technically considered precious stones are diamonds (single crystalline carbon) and corundum (sapphire and ruby [single crystalline aluminum oxide]) because their hardness when measured on the Mohs scale is approximately 9 or higher. The Mohs system is a scale for ranking hardness of a mineral with diamond being the hardest at 10, sapphire at 9, topaz , 8, down to the softest mineral, talc, which is 1. Emerald, because it is rare, is accepted as a precious stone even though its hardness is 7.5, while other gems, such as chrysoberyl, topaz and garnet, are usually classified as semiprecious stones because of their lower hardness. Hardness has practical value in that it defines the ability of a gemstone to resist scratching.

Refractive index is important because it defines the ability of a gemstone to refract light. When materials with a high refractive index are fashioned into finished gemstones they sparkle and appear brilliant when exposed to light. The characteristic sparkle of a diamond is due mainly to its high refractive index.

The color of a gemstone is determined by a variety of factors, from the impurity atoms that are available to be incorporated into the crystal lattice to the physical and electronic structure of the crystal itself. A ruby, for instance, is simply a sapphire single crystal (aluminum oxide) that contains a small concentration of chromium impurity atoms.

The thermal and chemical stability of a gemstone can be important during the process of mounting stones into jewelry. In general, it is beneficial if stones can be heated to high temperatures without changing color or reacting with ambient gases (that mar the surface finish).

The toughness of a gemstone relates to the ability of the gemstone to absorb energy without breaking, chipping or cracking. A gemstone must be able to withstand those impact forces normally encountered during a lifetime of use mounted on a ring or other jewelry item.

Hardness, refractive index, color, thermal/chemical stability and toughness are all characteristics that, in combination, determine the usefulness of a material as a gemstone.

Synthetic Diamond Gemstones

Dating from the 1960's, an effort to produce gem-quality synthetic diamonds was pursued by General Electric Company as evidenced by numerous patents, including U.S. Pat. No. 4,042,673. These efforts centered around the use of very high pressure/high temperature environments for growth of monocrystalline diamonds on seed crystals. Gem-quality synthetic diamonds generally have not gained commercial acceptance.

Synthetic Silicon Carbide Gemstones

As described in U.S. Pat. No. 5,762,896, it has been discovered that relatively low impurity, translucent, single crystal silicon carbide may be grown with a desired color and thereafter fashioned by faceting and polishing into synthetic gemstones. These gemstones have extraordinary hardness, toughness, chemical and thermal stability, and a high refractive index and dispersion that produce unparalleled brilliance. The single crystals from which the gemstones are produced have been grown by sublimation according to techniques of the type described in U.S. Pat. No. Re. 34,061.

Aluminum Nitride Crystals

For some time, it has been recognized that the physical and electronic properties of aluminum nitride (AlN) give it a significant potential in a wide variety of semiconductor applications. In addition, the high thermal conductivity and high optical transmissivity (i.e. low optical density) of AlN make AlN an excellent candidate semiconductor substrate material. Although AlN has extraordinary properties for a semiconductor material and has tremendous commercial potential, AlN-based semiconductor devices have been limited by the unavailability of large, low defect AlN single crystals. Slack and McNelly demonstrated a method for growing AlN single crystals by sublimation in *AlN Single Crystal* (Journal of Crystal Growth 42, 1977). However, the time required to grow a 12 mm by 4 mm crystal was approximately 150 hours. This growth rate is far too low to ever allow the commercial production of AlN single crystals for electronics or any other end use.

Aluminum Nitride: Silicon Carbide Alloys

AlN has been alloyed with silicon carbide (SiC) in monocrystalline thin films produced, for example, by liquid phase epitaxy. Polycrystalline AlN:SiC alloys have also been produced by isostatic pressing processes. However, bulk single crystalline alloys of AlN:SiC have not been commercially produced.

SUMMARY OF THE INVENTION

The present invention, in one broad aspect, is the fashioning of bulk single crystals of AlN or AlN:SiC into simulated diamond gemstones. These gemstones exhibit excellent gemstone properties and, as explained below, may be produced in colorless form that make them an excellent simulated diamond.

According to the present invention, AlN bulk single crystals are grown by one of several techniques, for example:

1. Preferential sublimation of solid polycrystalline AlN and recondensation of the sublimed Al and N vapors on the growing crystal interface that is typically afforded by a seed crystal.
2. Vaporization of aluminum in a liquid bath to produce source vapor species of Al that are combined in a growth crucible with an injected nitrogen-containing gas that provides the N source vapor species so that the Al and N species may condense on the crystal growth interface.

3. Pulling the bulk AlN single crystal from a melt of aluminum into which an N-containing gas is bubbled.

4. Bulk synthesis of AlN single crystals by a low cost, high output batch process employing multiple preferentially cooled nucleation sites.

The bulk AlN single crystals so produced have a very wide energy bandgap on the order of 6 eV. Thus, when the crystals are grown at low impurity levels, they can be grown colorless and thereafter fashioned into simulated diamonds with a color in the range of D–J on the Gemological Institute of America (GIA) color scale.

An AlN crystal is fashioned into a finished simulated diamond gemstone by faceting and polishing the crystal with shape and polish characteristic of finished diamond gemstones so that light may enter the gemstone and reflect from inside the gemstone.

While gemstones formed of single crystalline AlN form one aspect of the invention, the invention also contemplates that the bulk single crystalline material may also be formed with silicon carbide substituting for some of the AlN in the lattice structure to produce an AlN:SiC alloy bulk single crystal, typically a "2H" hexagonal lattice structure. To this end, the above described deposition processes for producing the bulk single crystals of AlN may be modified by making source vapor species of Si and C available at the growing crystal interface. Gemstones formed of certain AlN:SiC alloy crystals exhibit enhanced properties over unalloyed single crystals, for example, enhanced hardness and a higher refractive index. While varying atomic percentage(s) of AlN and SiC in the alloy may be used, alloys in the range of $AlN_{0.99}:SiC_{0.01}$ to $AlN_{0.5}:SiC_{0.95}$ are preferred, with alloys in the range of $AlN_{0.8}:SiC_{0.2}$ to $AlN_{0.5}:SiC_{0.5}$ being most preferred.

Lastly, instead of alloying the AlN bulk single crystal with, for example, SiC, the AlN crystal may be grown with intentionally introduced dopants that are not electronically active in the lattice structure (i.e. isoelectronic impurities) that also enhance hardness and increase the refractive index. Certain dopants may also be used to add aesthetically desirable color to the crystal, when desired.

BRIEF DESCRIPTION OF THE DRAWINGS

Some of the features of the invention having been stated, other features will appear as the description proceeds, when taken in connection with the accompanying drawings, in which

FIG. 8B1 shows a crystal growth system with a vapor source apparatus that is used to create a constant flow of Al source vapor and a gas injector for introducing gas(es) that provide an N source.

FIG. 8B2 shows a crystal growth system with a vapor source apparatus that is used to create a constant flow of Al and Si source vapor and a gas injector for introducing gases that provide N and C source gases.

FIG. 8C show a crystal growth system similar to the system of FIG. 8B, but with a different geometry and the addition of a horizontal baffle plate above the molten liquid Al—Si to facilitate introduction of Al and Si source vapor into the portion of the crucible containing the growing crystal interface.

FIG. 19A is a view similar to FIG. 18 showing an alternative upper furnace plate with seeded nucleation sites.

FIGS. 26A, 26B through 31A, 31B schematically show an alternative system for sequentially preferentially cooling radially expanding nucleation sites over the course of a twenty hour crystal growth cycle.

DETAILED DESCRIPTION OF THE INVENTION

While the present invention will be described more fully hereinafter with reference to the accompanying drawings, in which aspects of the preferred manner of practicing the present invention are shown, it is to be understood at the outset of the description which follows that persons of skill in the appropriate arts may modify the invention herein described while still achieving the favorable results of this invention. Accordingly, the description which follows is to be understood as being a broad, teaching disclosure directed to persons of skill in the appropriate arts, and not as limiting upon the present invention.

The description will first discuss various processes for producing bulk single crystalline aluminum nitride and aluminum nitride:silicon carbide alloys followed by a discussion of processes for fashioning finished gemstones from the bulk single crystals.

Figure 1:
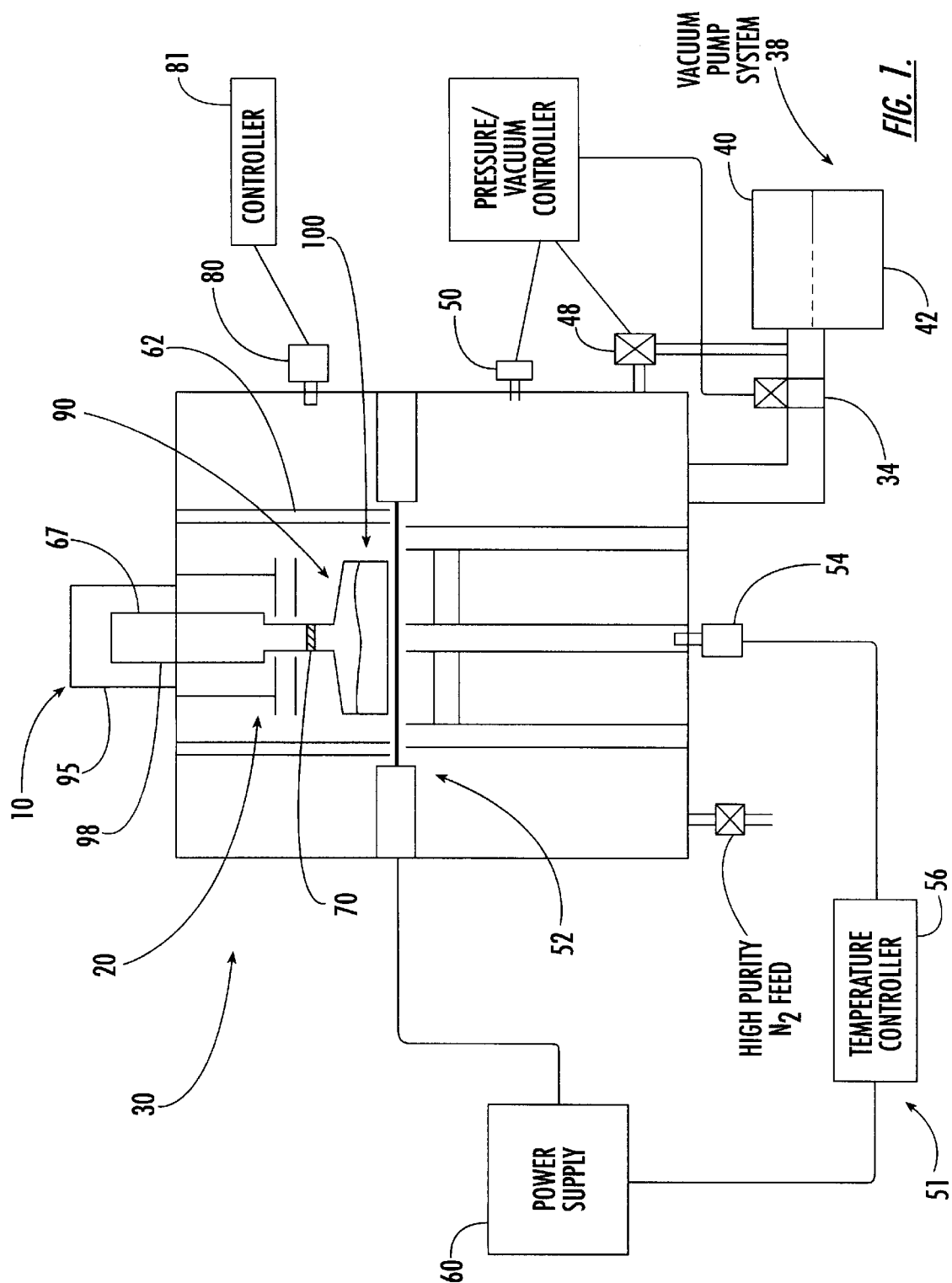
FIG. 1 is a schematic representation of one overall system for growing bulk single crystals of AlN or AlN:SiC alloy.
Figure 2:
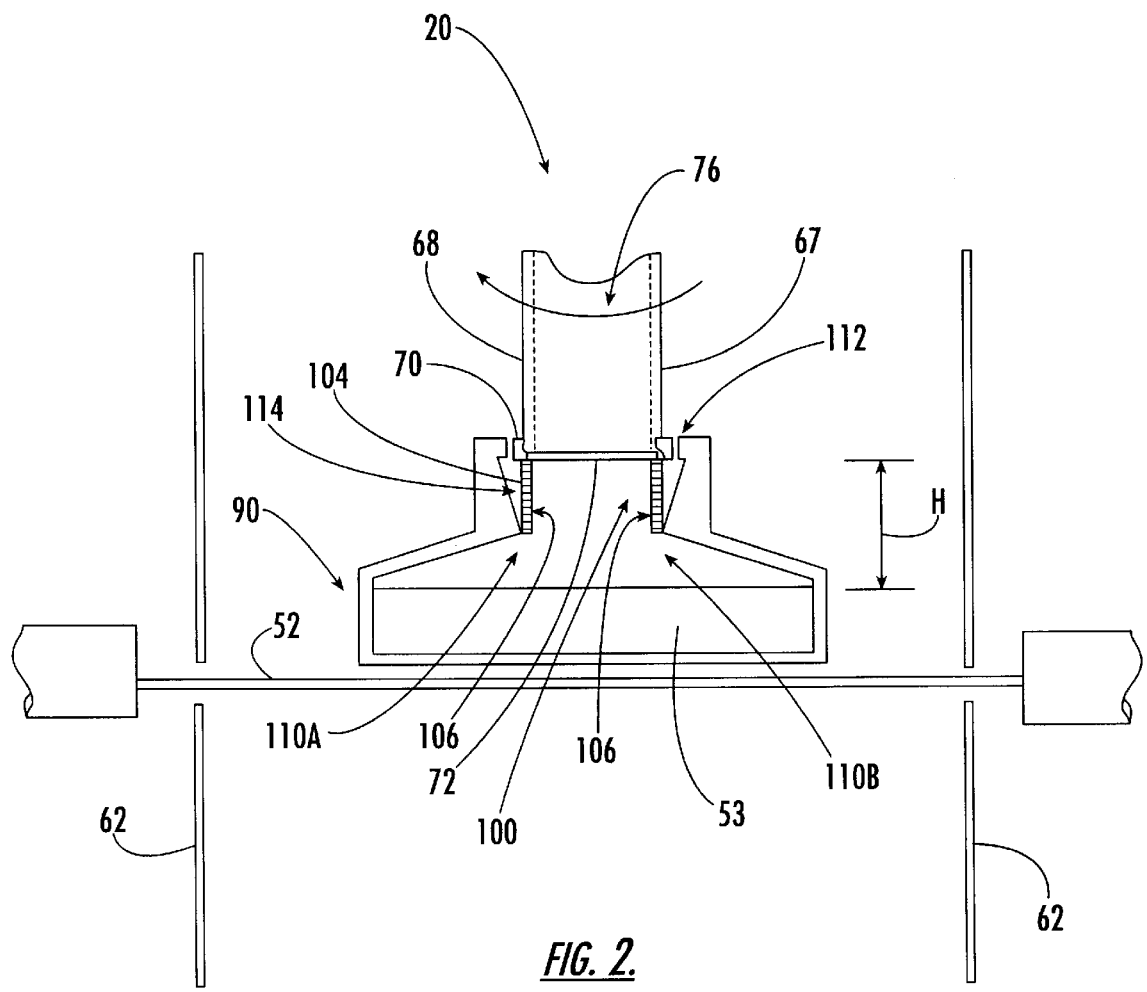
FIG. 2 is a view of the central subassembly of FIG. 1 showing details of a first embodiment of the effusion system.

(1) Production of Aluminum Nitride Bulk Single Crystals by Depositing Source Vapor Species of Al and N on a Growing Crystal Interface Referring to the drawings, and particularly to FIG. 1, there is shown a schematic for the principal components of the overall system 10 for growing bulk single crystals of AlN according to the present invention. Growth system 10 includes a central subassembly generally indicated at 20. This subassembly incorporates the crucible 90, heating apparatus 51, thermal sink 67, seed holder 70, effusion system 100 and related structure, all of which serve to support the seed crystal and control the environment at the growing crystal interface during crystal growth operations. The central subassembly, and particularly the effusion system, may take various forms within the general parameters of the invention. Several embodiments are illustrated in the drawings. In the overall schematic of FIG. 1, the subassembly 20 of FIG. 2 is shown and will now be described in detail along with the remaining components of growth system 10.

System 10 includes a furnace chamber 30 that is fabricated from 316 stainless steel or other suitable material. Chamber 30 is water cooled (detail not shown) according to principles well known in the art. System pressure within chamber 30 below 10 torr is controlled via a throttle valve 34 (for example, a 3 inch diameter throttle valve manufactured by MKS Instruments, Inc. of Andover, Mass., USA) located in series with a vacuum pumping system 38. In accordance with techniques known in the art, the vacuum pumping system 38 is composed of a mechanical pump 40 to reduce the system pressure to the $10^{-3}$ torr and a turbo-molecular pump 42 to pump the system down to $10^{-5}$ torr. Pressure control above 10 torr is maintained through a magnetic control valve 48 that is also in series with vacuum pumping system 38. System pressure is measured from $10^{-3}$ torr to 1,000 torr with a highly accurate temperature controlled absolute capacitance manometer 50 such as the MKS Instruments, Inc., model no. 390.

Heat to system 10 is supplied by a resistance heating apparatus 51 including a horizontal thin plate heating element 52, preferably formed of graphite or tungsten. Heating element 52 may take the form of a single horizontal plate as illustrated in FIG. 2, or in the alternative, a pair of horizontal plates with one plate located below the crucible 90 and one plate above the crucible, or other forms discussed below. Temperature control is facilitated by an optical pyrometer 54 (FIG. 1) sited on the back of the heating element. Pyrometer 54 provides a constant input signal to a digital temperature controller 56 that maintains the temperature at a set point by controlling the output of a power supply 60. According to principles known in the art, heat generated by heating element 52 is shielded from the stainless steel walls of chamber 30 by heat shields 62, preferably formed of graphite. The temperature at the source should be held in the range from about 2025° C. to about 2492° C.

Regardless of the precise form taken by the horizontal plate heating element, such an arrangement enables the system to maintain a highly uniform thermal profile across a large diameter growing crystal interface allowing the growth of large diameter bulk single crystals and the use of a crucible having a very low ratio of height (H) to diameter (D), where H is the distance from the seed to the source (e.g., source material 53 in FIG. 2) and D the diameter of the crucible in the space between the seed and the source. Where this diameter is not constant, an average diameter is used. In those cases where the crucible does not have a circular or near circular cross section between the seed and the source, an equivalent diameter may be calculated by determining the internal volume of the crucible from the seed to the source (a volume having a height, H) and then calculating the diameter of an upright cylinder having the same height, H, and the same volume. This diameter is an equivalent diameter that may be used as the diameter, D, in the aspect ration H:D. Thus, as used herein the term "diameter, D," or "D" when used in conjunction with an aspect ratio shall refer to an actual crucible diameter, an average crucible diameter or an equivalent crucible diameter as set forth above. The low aspect ratios of the invention, preferably a ratio less than about 6:1, virtually eliminate the vexing mass transport problems caused by viscous interaction of the source vapor with the crucible walls and permits improved vapor stoichiometry at the growing crystal interface, as discussed in more detail herein. More particularly, according to one structure in the form illustrated in FIG. 2, the height (H) from source material 53 to the growing crystal interface may be on the order of 7.5 cm and the diameter (D) of the crucible on the order of 20 cm, resulting in an H:D aspect ratio of approximately 0.375:1. This geometry, coupled with a typical temperature difference between the source material and seed crystal of approximately 82° C., results in a relatively steep thermal gradient of approximately 11° C./cm. This structure offers numerous advantages as discussed herein, including high growth rates and the ability to grow large diameter, high purity crystals.

It will be appreciated that while aspect ratios of the invention may be broadly designated as less than about 6:1, lower aspect ratios are more desirable, for example, aspect ratios on the order of 1:3 and lower.

The mechanism for aligning, supporting and transferring heat away from the seed crystal 72 includes a thermal sink 67 comprising a tube 68 that has a lip structure 70 at the bottom thereof for receiving the seed 72. Thermal sink 67 also includes a thermal sink rod 76 that is threaded into tube 68 and is tightened down upon the seed so as to press firmly upon the seed. Tube 68 and rod 76 are preferably formed of high density graphite having a very high thermal conductivity.

Figure 3:
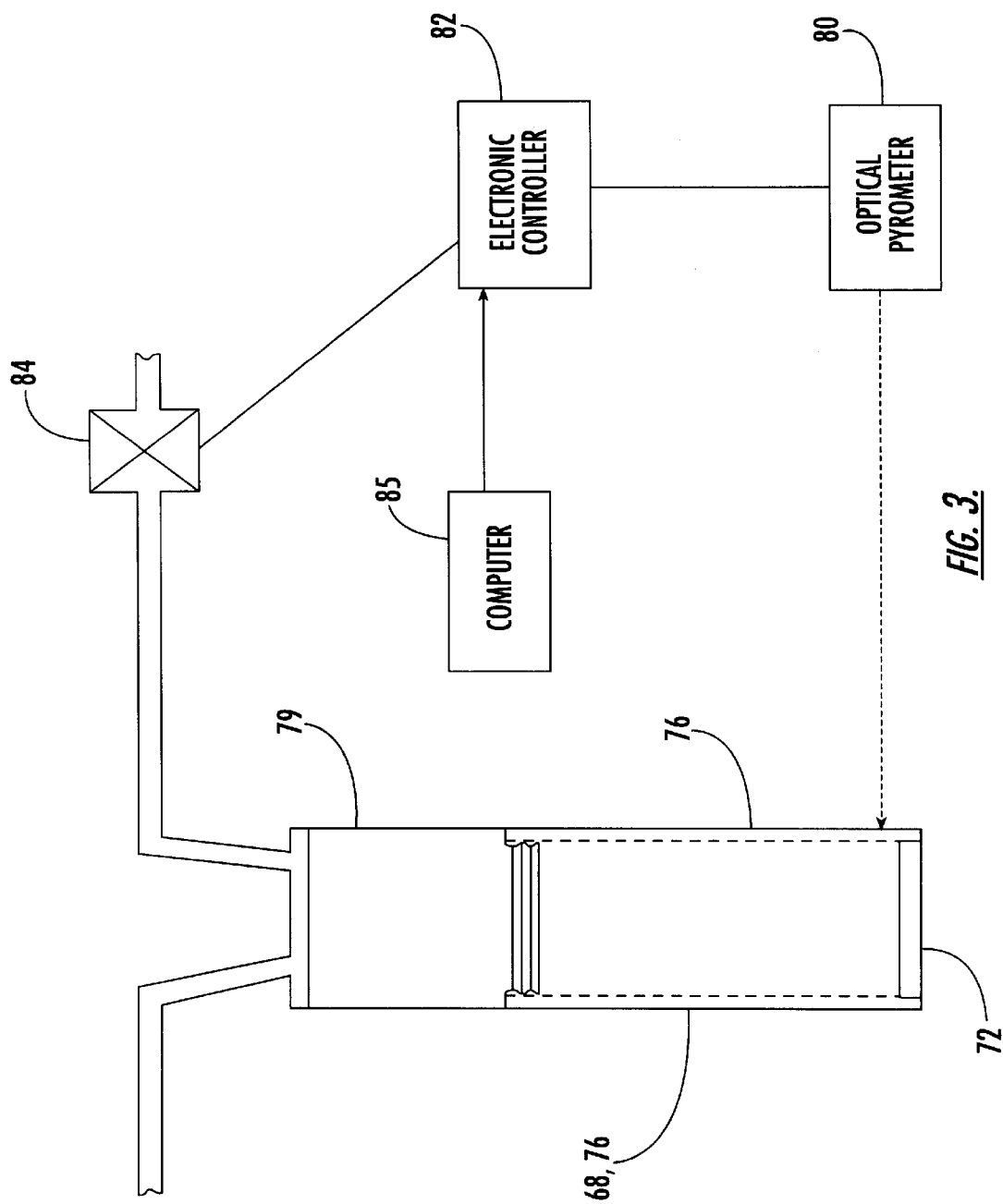
FIG. 3 is a simplified depiction of the thermal sink of the central subassembly of FIG. 2 shown in conjunction with a schematic representation of the closed loop temperature control system for the crystal interface.

Referring to FIG. 3, further details of the seed cooling system are shown. This regard, rod 76 is connected to a water-cooled stainless steel rod 79. Water flow through stainless steel rod 79 and rod 76 is adjusted to maintain the desired seed temperature as read by an optical pyrometer 80. Preferably, this system is automated by inputting the signal from optical pyrometer 80 to electronic controller 82 linked electronically to a valve 84 controlling the water flow to the thermal heat sink. The controller 82 receives its command from a computer 85 that includes a look-up table in ROM or other suitable memory location. The look-up table is created from empirically derived data representative of the extent to which the temperature at the point read by optical pyrometer 80 must decrease over the crystal growth cycle in order to maintain a constant temperature at the crystal interface as the growing crystal interface moves closer to the source. Thus, the heat transfer rate of the thermal sink is increased during the crystal growth cycle as necessary to maintain a constant temperature at the growing crystal interface. The temperature at the growing crystal interface should be held in the range from about 1900° C. to about 2488° C.

Referring to FIG. 1, system 10 provides a mechanism 95 (shown schematically) for rotating the seed crystal about a vertical axis during the crystal growth cycle in order to dampen the effect of thermal discontinuities in the heating element and provide a uniform thermal profile across the growing crystal interface. In this regard, the structure of the central subassembly 20 of FIGS. 1 and 2 permits the crucible 90, which is secured to the thermal sink 67, to be suspended within chamber 30 so that the crucible bottom is a selected distance above the flat heating element 52, in one embodiment approximately 2 mm above. To this end, the thermal sink is supported by the top of chamber 30 at 98 and is rotatable by mechanism 95, preferably a stepping motor. Thus, the bottom of crucible 90 rotates above heating element 52 so that thermal discontinuities in heat transfer from the heating element to the crucible are dampened out.

The system for maintaining effusion at the growing crystal interface will now be described. According to the embodiment illustrated in FIGS. 1 and 2, effusion system 100 includes a cylindrical effusion baffle 104 located directly below seed crystal 72 in the path along which the species vapor from the source material moves to the relatively cooler growing surface of the seed. As mentioned above, the primary purpose of the effusion system is to sweep impurity atoms/molecules and non-stoichiometric vapor constituents away from the growing crystal interface. To this end, effusion baffle 104 includes a series of effusion openings 106 through which a constant flow is maintained for carrying away gases from the crystal growth interface. Openings 106 may take the form of a plurality of symmetrically disposed holes in the cylindrical wall of baffle 104, for example, a plurality of lines of vertically aligned holes located at a selected circumferential spacings on baffle 104. In this regard, the use of two vertical lines of holes at a 180° spacing along the cylindrical baffle wall is one desirable embodiment. Two lines of holes 110A and 110B are shown in FIG. 2. The illustrated effusion system 100 also includes a master effusion outlet 112 formed in the top of crucible 90. Outlet 112 is in fluid communication with the effusion holes of baffle 104 through a tapered ring chamber 114 for the purpose of drawing out gas at the interface. While the master effusion outlet may take any suitable form, it should be symmetrically disposed with respect to the crystal and may consist of, for example, a number of symmetrically disposed vertical openings in the top of the crucible, two of which are shown in FIG. 2. Preferably, the lines of effusion holes at 110A–D, the tapered ring chamber 114 and the master effusion outlet 112 are so configured as to permit a constant, controlled rate of effusion throughout the crystal growth process.

In one preferred embodiment of the effusion system 100 shown in FIG. 2, the vertically aligned holes at 110A and B are sized so that the hole diameter decreases sequentially beginning at the seed down to the bottom of the effusion baffle 104. Thus, as the crystal grows and the growing crystal interface moves toward the source, the larger holes are sequentially covered by the grown crystal so that the gas velocity increases through the remaining holes. As a result, with the proper location and sizing of the holes, and with the proper sizing of chamber 114 according to known fluid dynamics principles, the flow rate of effusion throughout the crystal growth cycle may be maintained substantially constant, while also encouraging the effusion gas to flow upwardly to and across the growing crystal interface before exiting through the holes at 110A and B and the master effusion outlet.

It will be appreciated that the precise geometry of the effusion system 100 shown in FIGS. 1 and 2, including the size of the fluid flow paths therein, may be best determined by taking into account several factors, primarily, the size and total vapor flow rate of the growth system, system pressures both inside and outside of the crucible, the flow rate of any effusion-assist gas, and system temperature. In operation of an effusion system such as system 100 without an effusion-assist gas, an effusion rate greater than 2% of the total vapor flow rate is desirable, typically in the range of about 2% to about 80%. More particularly, an effusion rate in the range of about 20% to about 50% of the total vapor flow rate is deemed more desirable, while a rate in the range of about 30% to about 35% is preferred.

While not illustrated, one desirable way to maintain constant effusion in a system such as the illustrated system 100, or other such systems, is to link the master effusion outlet to a very high accuracy low pressure absolute capacitance manometer located outside of the chamber, with the manometer being linked to an electronic controller and associated control valve and vacuum pump to bleed gas as necessary to maintain a predetermined constant pressure reading at the manometer. Using the same apparatus, a very high accuracy differential capacitance manometer measuring the pressure drop across a fixed orifice or other suitable technique could be substituted for the absolute manometer. Also, a thermal mass flow controller could be used as the means for maintaining constant effusion.

Figure 4:
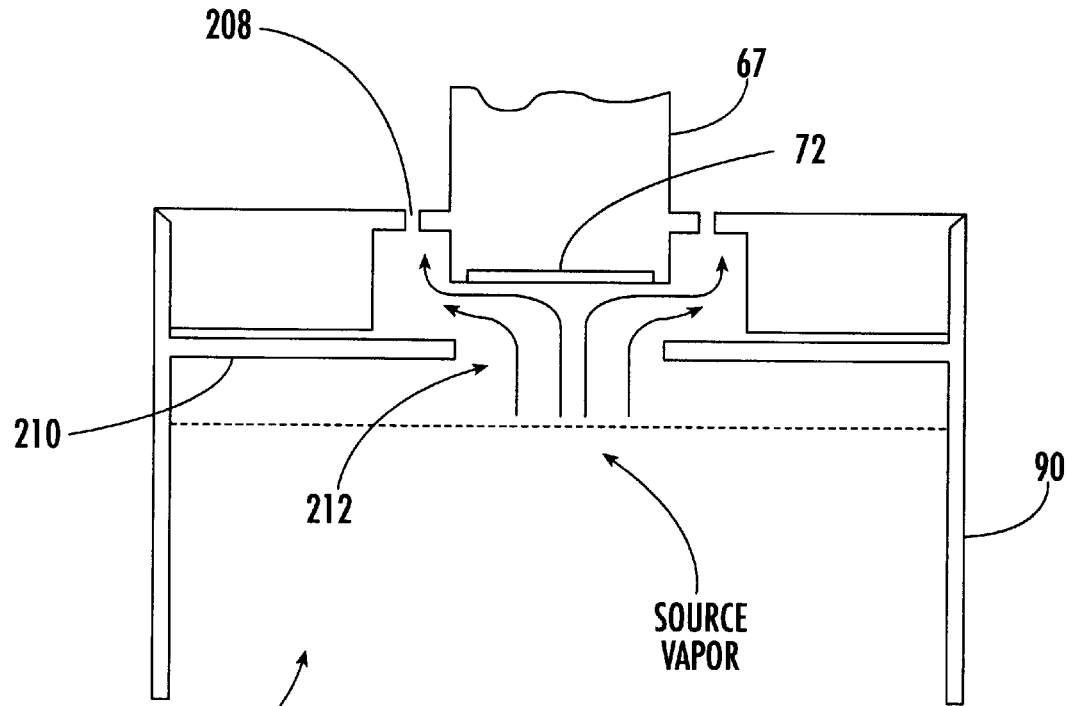
FIG. 4 shows a first alternative embodiment of the effusion system.

In another embodiment shown in FIG. 4, effusion system 200 includes a master effusion outlet 208 that is located beyond the periphery of the seed crystal at approximately the same level or higher than the seed so that the source vapor must travel onto, across, and off of the crystal growth interface to reach the effusion outlet. As illustrated, effusion outlet 208 is higher than the seed. In order to achieve desirable effusion, effusion system 200 includes a horizontal effusion baffle 210 including one large opening 212 centered directly in front of the seed through which the source vapor and any effusion-assist gas must pass prior to reaching the seed. As alternatives to having one central opening in the effusion baffle, the baffle may include a series of symmetrically disposed smaller openings centered directly in front of the seed, or the baffle may be formed from porous graphite or other suitable porous material centered directly in front of the seed.

Figure 5:
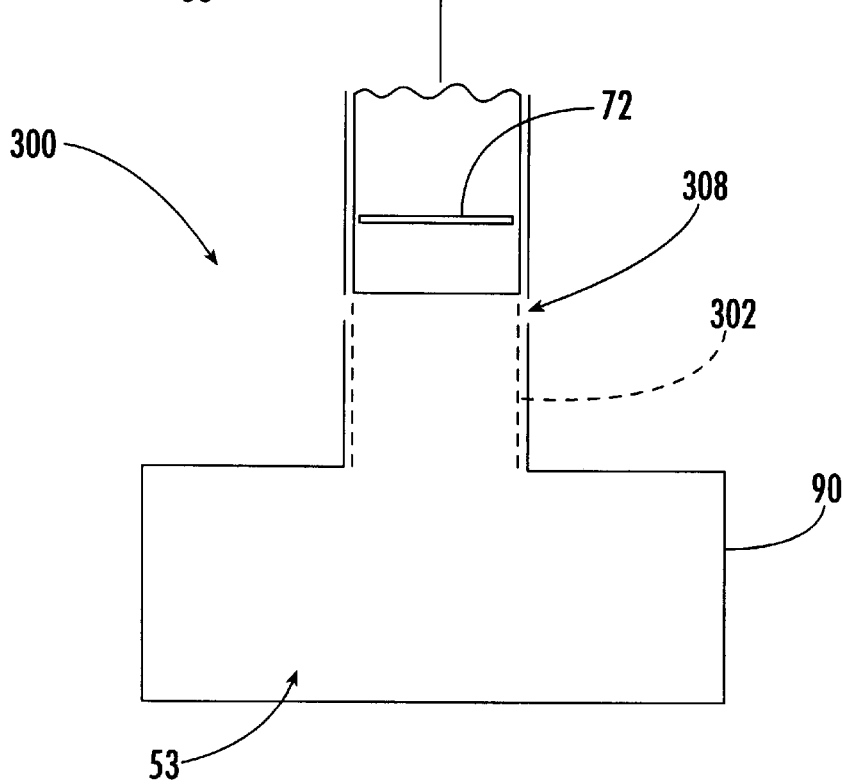
FIG. 5 shows a second alternative embodiment of the effusion system.

In yet another embodiment shown in FIG. 5, effusion system 300 includes a cylindrical insert tube 302 that contains vertical columns of symmetrically disposed effusion outlets, grooves or vertical slots. This cylindrical insert tube is pulled upwardly by a raise/lower mechanism (shown schematically) past a fixed master effusion outlet 308 in the crucible sidewall so that an outlet for effusion of impurity atoms is always present just below the crystal growth interface.

Figure 6:
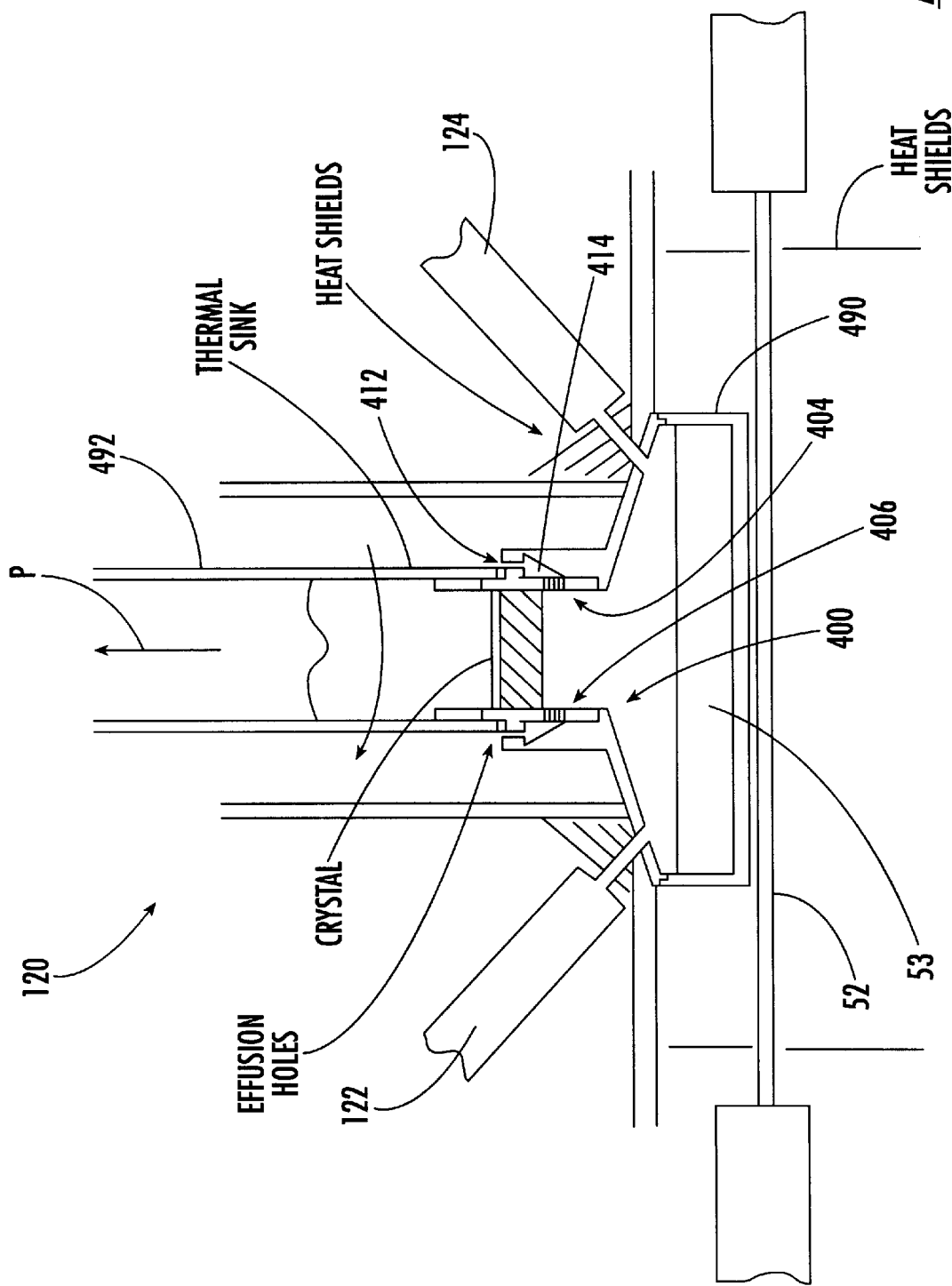
FIG. 6 shows a third alternative embodiment of the effusion system that is used in conjunction with a fixed crucible and a crystal pulling mechanism.

Referring now to subassembly 120 of FIG. 6, there is shown another embodiment of the central subassembly that has several structural and functional differences from the subassembly 20 of FIG. 2. In this regard, FIG. 6 illustrates another effusion system 400 that is used in conjunction with a pulling mechanism that raises the crystal as it grows, thereby maintaining the growing crystal interface in the same relative position throughout the growth cycle. According to the embodiment of FIG. 6, crucible 490 is fixedly supported within the growth chamber by an outer sleeve 492, while the thermal sink and seed are suspended from the top of the chamber. Thus, the thermal sink and seed are detached from the crucible so that they may be pulled upwardly (arrow P) at a rate corresponding to the rate at which the crystal grows. The pulling of the seed may be accomplished by a closed loop control coupled to a stepping motor. As an alternative, the growth rate may be calculated or estimated from observed historical growth information, with the pulling mechanism programmed to match the calculated or observed rate. When the crystal is pulled the system for controlling the temperature at the crystal growth interface may take the form of a control as illustrated in FIG. 3 without utilizing the computer. Because the optical pyrometer 80 will be directed to the same position relative to the crystal growth interface throughout the growth cycle, the sensed temperature will always directly reflect the temperature at the crystal interface without requiring the use of a computer and look-up table to correct for movement of the interface due to crystal growth.

The effusion system 400 includes a cylindrical effusion baffle 404 having effusion openings 406 in the baffle sidewall at symmetrically disposed locations therearound and just below the growing crystal interface. Openings 406 communicate through a tapered chamber 414 to a master effusion outlet 412 in the crucible top wall. Because the pulling mechanism locates the growing crystal interface at the same position throughout the growth cycle, the interface does not move with respect to the effusion system, thereby providing reliable flow characteristics facilitating a constant effusion rate.

It will be appreciated that other effusion system geometries may be utilized, with the understanding that the primary purpose of the effusion system is to provide effusion at the crystal growth interface to sweep away impurity atoms/molecules and stoichiometric excess.

Subassembly 120 of FIG. 6 also includes a pair of gas injectors 122, 124 that are provided in order to (i) supply an effusion-assist gas, or (ii) supply a source gas or (ii) supply a gas that serves both purposes by supplementing the supply of vapor species from another source (e.g., solid source 53) while also assisting effusion.

When using the gas injectors 122, 124 of subassembly 120 to inject an effusion-assist gas (e.g., nitrogen or argon), the flow rate preferably is maintained at a continuous level sufficient to assist in removing impurity atoms/molecules and stoichiometric excess from the crystal growth interface.

When the gas injectors 122, 124 of subassembly 120 are used to provide source material, the growth system can run for much longer times without the variation in growth chemistry that occurs when crystalline solids sublime preferentially. In addition, utilizing a gas injection system for a continuous flow of source material also offers the flexibility to optimize growth rates by supplying source material in different ratios and forms such as $N_2$ and N ions. Because the $N_2$ atomic bond is very strong, the addition of nitrogen ions or excited $N_2$ to the source vapor will significantly increase the growth rate of AlN single crystals. In this regard, the growth of AlN single crystals involves the significant rate limiting reaction $\frac{1}{2}N_{2(g)} \rightarrow \frac{1}{2} N_{2(ads)} \rightarrow N_{(ads)}$. The presence of atomic nitrogen, nitrogen ions or excited $N_2$ in the growth crucible aids in overcoming this limitation on the growth rate. The addition of atomic nitrogen, nitrogen ions or excited nitrogen may be facilitated by the use of a laser or other system to create atomic nitrogen, nitrogen ions or excited nitrogen either before or after injection into the growth crucible.

The use of an effusion-assist gas such as nitrogen or argon may be employed to increase the effusion rate. In this regard, the effusion-assist gas may be injected directly below or directly at the crystal growth interface to increase the gas flow rate across the growing crystal interface and through the effusion baffle. The effusion-assist gas may also be injected directly into the area between the effusion baffle outlet and the master effusion outlet to increase the effusion rate through the effusion baffle. In gas-assisted effusion operations, effusion at the growing crystal interface should be in the range from about 12% to about 99.9% of the total vapor flow rate. In this regard, the term "total vapor flow rate" as used herein refers to the total gas flow, including (i) source vapor flow supplied from sublimation, source gas injection, vaporized liquid Al, or otherwise and (ii) effusion-assist gas flow.

The effusion system may also be operated in such a way that the gas pressure in the growth chamber is decreased during the growth run so as to maintain a constant effusion rate as the crystal grows down the effusion baffle. in this regard, the master effusion hole or holes may be located beside the seed where effusion is maintained at a constant rate by decreasing the gas pressure in the growth chamber during the crystal growth run by use of the pressure controls shown in FIG. 1.

Figure 7:
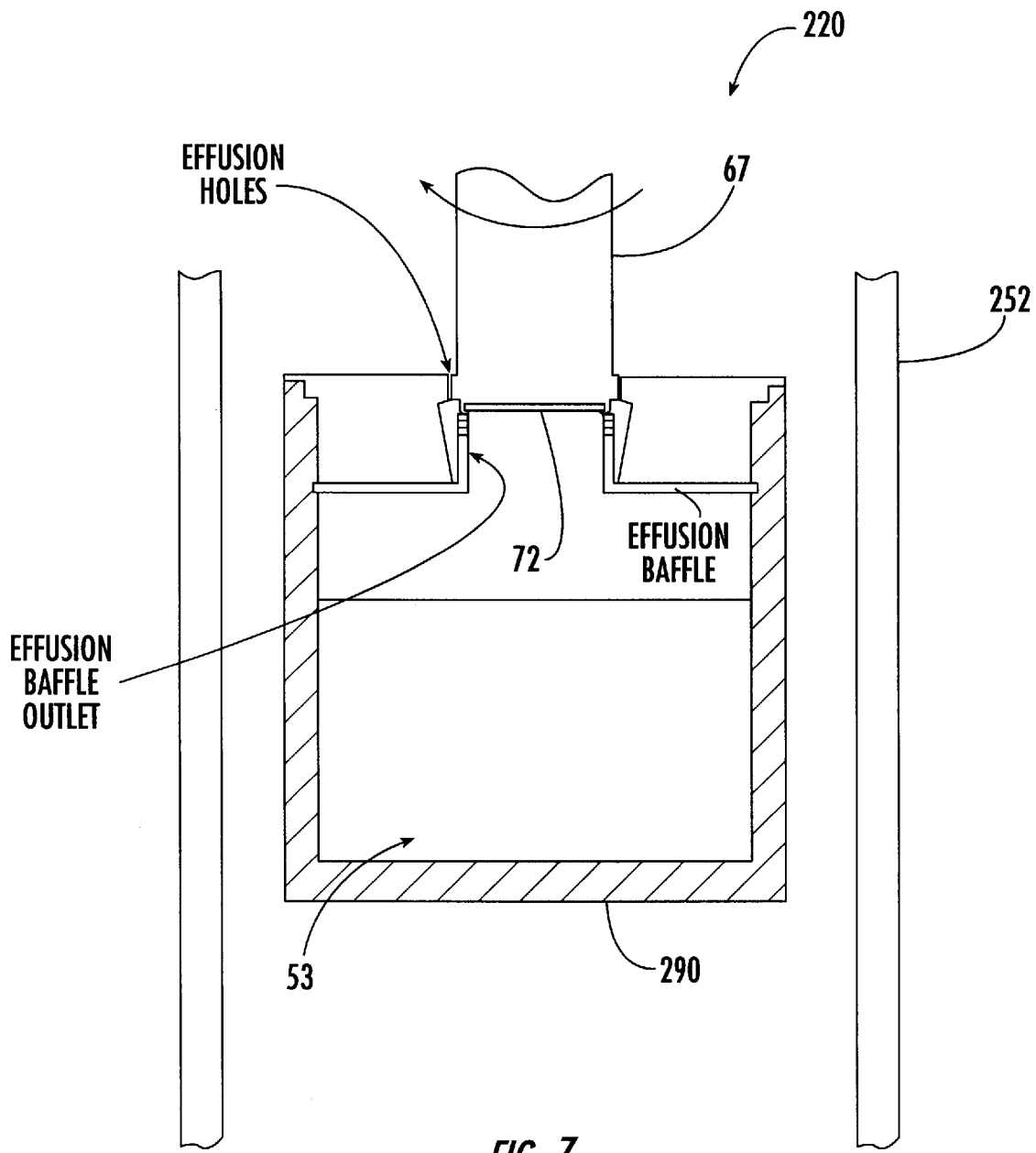
FIG. 7 shows a crystal growth system with a cylindrical resistance heating element.

Referring now to FIG. 7, there is shown yet another central subassembly 220 that includes a cylindrical resistance heating element 252 that is encased within a water-cooled furnace chamber not shown. Heating element 252 is utilized to heat the seed crystal located within a crucible 290 that is similar to the crucibles described above, but crucible 290 has a substantially greater height due to the heat transfer capabilities of the vertical cylindrical heating element.

Figure 8A:
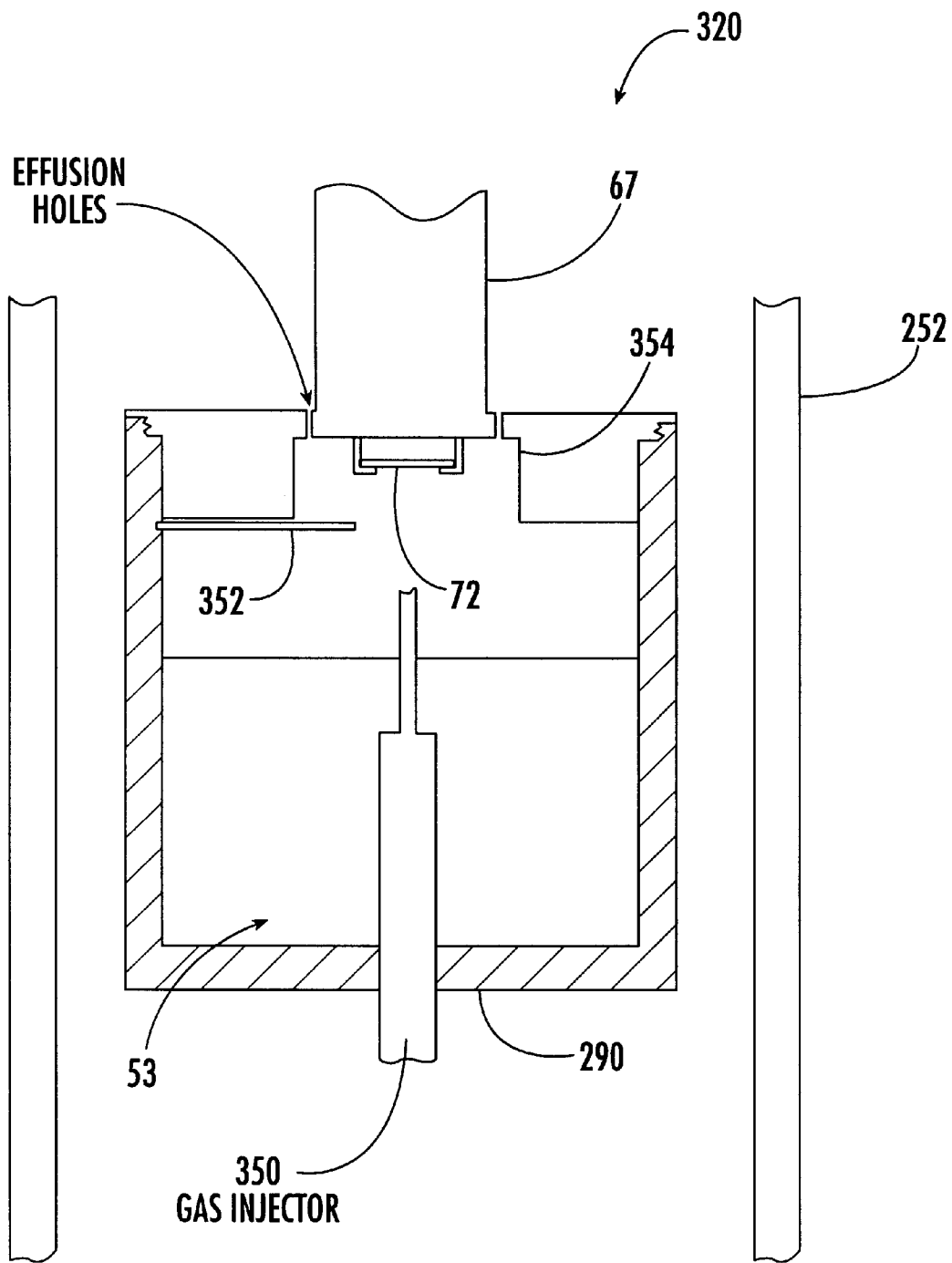
FIG. 8A shows a crystal growth system similar to that of FIG. 7, but with a gas injector and a modified form of effusion system.

FIG. 8A illustrates a subassembly 320 that is similar in general shape and construction to the subassembly of FIG.

7 with the exception that a gas injector 350 is utilized to inject argon or nitrogen into the crucible to serve as an effusion-assist gas. The injected gas is directed by an effusion baffle 352 into a cylindrical housing 354 that provides a gas flow conduit leading to the seed crystal. A plurality of effusion holes are located at the top of housing 354 for sweeping away impurities at a gas flow rate that corresponds to the injected gas input rate.

While not illustrated, it will be appreciated that heat may be supplied to the growth system by a combination heating arrangement including both a horizontal flat plate heater such as heater 52 of FIG. 2 and a cylindrical heater such as heater 252 of FIGS. 7 and 8A. In such a structure, the primary heat to the system and the creation of a uniform (horizontal) thermal profile in the crucible is accomplished by heater 52, while vertical cylindrical heater 252 is used to provide a heat source to accommodate edge effects on the upstanding crucible walls. As a refinement to this combination heating system, the vertical cylindrical heater may be replaced with a plurality of stacked heater rings (not shown) surrounding the crucible. The rings are electrically and physically isolated from each other and independently controlled so that the thermal gradient may be varied as desired up the vertical axis of the crucible.

FIG. 8B1 illustrates a vapor source apparatus 800 that is utilized to create a constant flow of aluminum and $N_2$ source vapor. In this system Al vapor produced by heating liquid Al to a specific temperature is combined with $N_2$ in the growth crucible to produce the desired flow and stoichiometry of source vapor. Therefore, by controlling the vapor pressure of the Al liquid by controlling its temperature in combination with controlling the injected $N_2$ gas with a thermal mass flow controller, this system provides excellent control of the effusion rate and vapor stoichiometry. More particularly, vapor source apparatus 800 includes a graphite crucible 990 having the shape shown in FIG. 8B1, a cylindrical resistance heating element 952, a thermal sink 967 holding a seed 72 and an effusion system similar to the effusion system shown in FIG. 4. Liquid Al is contained in a lower crucible 975 that is electrically insulated at 977 by a BN insulator ring, or a physical gap, or other suitable means. Crucible 975 may be a cold crucible, for example, a water-cooled copper crucible the contents of which is heated by a water-cooled induction heating coil 980 as shown in FIG. 8B1. Alternatively, crucible 975 may be formed of high density graphite, pyrolytic graphite, silicon carbide coated graphite or boron nitride. These crucibles may be heated by either resistance heating or induction heating, as appropriate. Al gas enters crucible 990 from the liquid Al while $N_2$ gas is injected through injector 993. The liquid Al is maintained at a temperature sufficient to create a suitable vapor flow under the conditions maintained in the crucible, particularly crucible pressure. Typically the liquid Al temperature will be maintained between about 1000° C. and 2400° C. to create a suitable vapor flow rate under system conditions, with a temperature below about 2200° C. being preferred. The temperature within the crucible is maintained at a temperature higher than that of the liquid Al. The area inside the crucible becomes saturated with Al and $N_2$ vapor that condenses at the cooler seed growing interface. While not illustrated, a horizontal baffle plate with a central opening may extend across crucible 990 above insulator ring 977 to create a pressure gradient thereacross and a velocity increase to the Al vapor moving into crucible 990, thereby reducing the back diffusion of $N_2$ toward the liquid Al.

It will be appreciated that the system of FIG. 8B1 permits the use of very pure source vapors and the ability to carefully control the stoichiometry. These factors, coupled with the preferential placement of the seed crystal near the molten Al, makes possible the operation of a system such as that shown in FIG. 8B1 with little or no effusion, with it being understood that effusion is preferred.

Figure 9A:
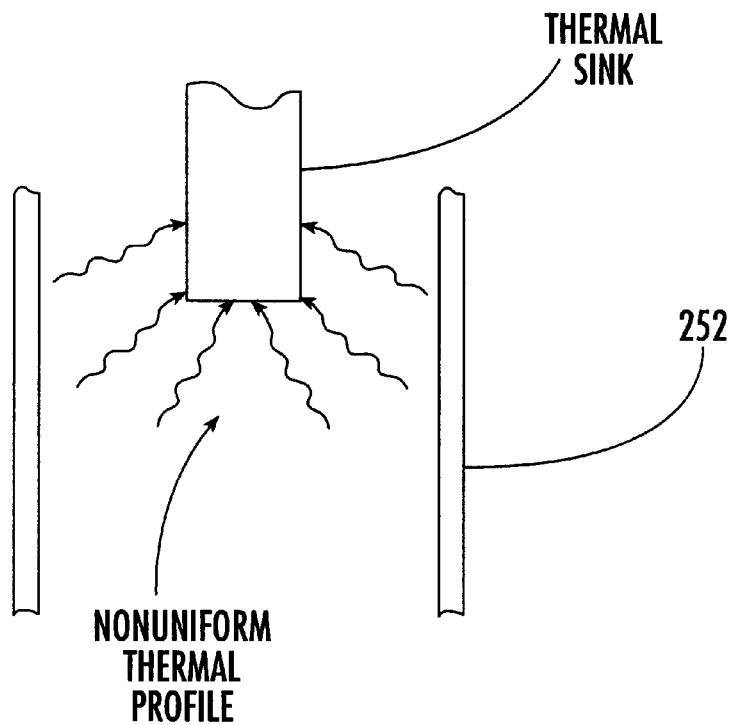
FIG. 9A shows the thermal profile between a cylindrical heating element and a thermal sink.
Figure 9B:
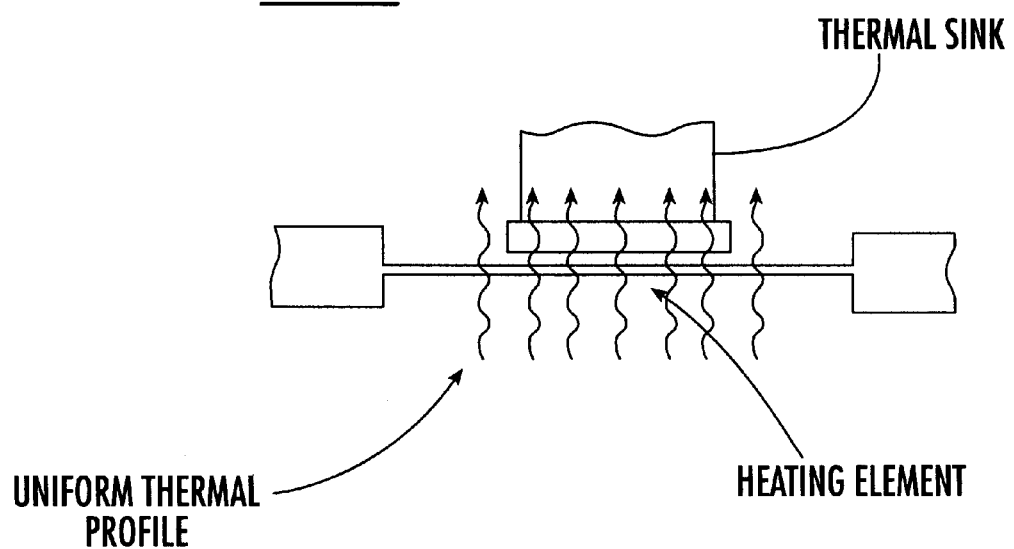
FIG. 9B shows the thermal profile between a flat plate heating element and a thermal sink.

FIG. 9A illustrates the non-uniform thermal profile between the cylindrical heating element 252 and the thermal sink, while FIG. 9B illustrates the uniform thermal profile between the horizontal heating element 52 of the earlier-described embodiments and the thermal sink.

Figure 10:
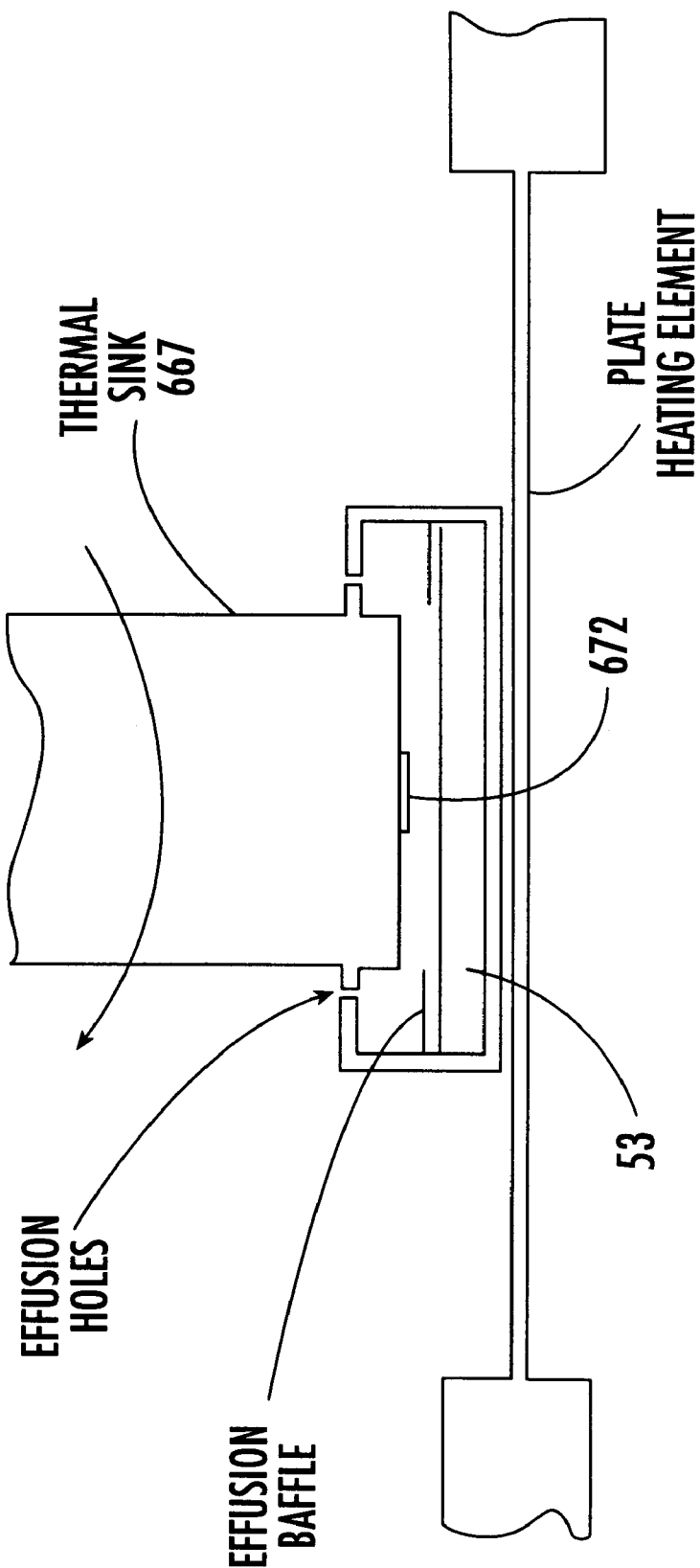
FIG. 10 shows portions of a crystal growth system with a crucible having a very low height-to-diameter aspect ratio.
Figure 11A:
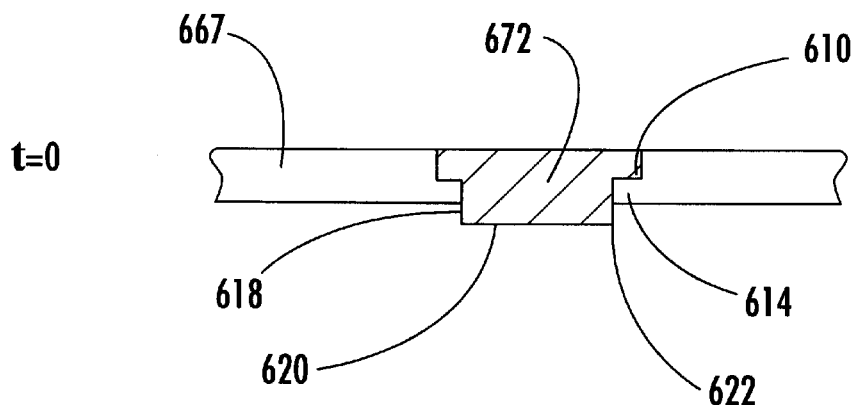
FIGS. 11A–D are enlarged views of the bottom of the thermal sink of FIG. 10, the seed crystal secured to the thermal sink and the advancing crystal growth interface at four points in a representative growth cycle.

FIG. 10 illustrates portions of a crystal growth system having a crucible with a very low height to diameter (H:D) aspect ratio and other features specifically designed to grow large diameter AlN crystals. The source material 53 is a solid material that is spaced very closely to the seed crystal 672 to produce an H:D aspect ratio less than about 2.5:1, typically below 1:3, and most preferred on the order of 1:8. The effusion system is similar to the effusion system shown in FIG. 4 and described above. In order to encourage growth of a large diameter crystal, the seed crystal is mounted to the thermal sink 667 so that a portion of the seed extends below the lower, polished flat surface of the thermal sink. To this end, the seed is cut to create an outwardly projecting circumferential lip 610 (FIG. 11A) that rests on a circular shoulder 614 formed at the periphery of an opening 618 extending through the bottom of the thermal sink. This arrangement permits the lower portion of the seed to protrude beyond the thermal sink to expose not only the seed growth surface 620, but also the circumferential outer wall portion 622 of the seed. The growth of the seed directly outwardly from the wall portion 622 (i.e., in a horizontal plane) facilitates growth of a large diameter crystal, especially in those cases where, as is preferred, the main growth direction (i.e., vertical) is off the basil plane of the seed. This seed orientation produces an even faster growth rate in the horizontal direction.

The low aspect ratio system of FIG. 10 may be utilized according to the invention with a very pure source material 53 to grow bulk crystals of AlN without use of effusion. In this regard, the source material in solid or liquid form preferably has less than 0.08% excess Al content, less than about 0.05% non-dopant/non-alloying electrically active impurity content, and less than about 400 ppm oxygen content by weight. The H:D aspect ratio is less than about 2.5:1, typically less than 1:3, and most preferably less than 1:8.

According to the invention, the system of FIG. 10 may also be used little or no effusion to grow bulk AlN crystals by utilizing a low H:D aspect ratio below 1:3, and preferably below 1:8, with a horizontally disposed flat plate heater located directly below the flat bottom of the crucible.

Figure 11B:
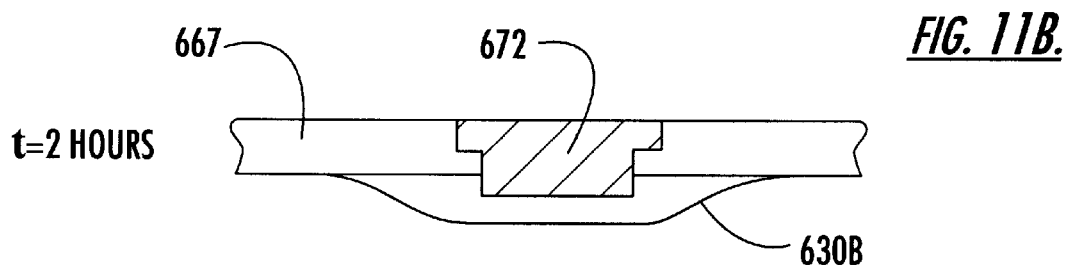
Figure 11C:
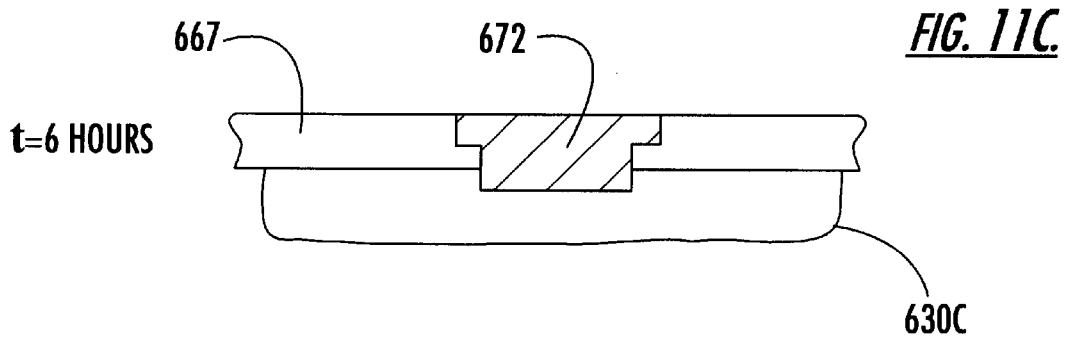
Figure 11D:
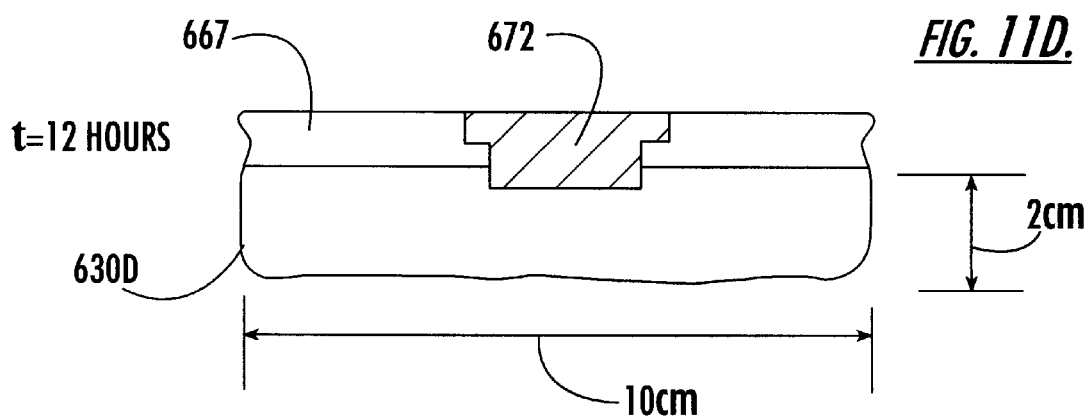

FIGS. 11B–D are enlarged views of the seed and thermal sink of FIG. 10 showing the advancing crystal growth interface 630B, 630C, 630D at growth cycle times t=2 hours, t=8 hours and t=12 hours, respectively. For a representative example, the seed has an exposed diameter of 25 mm and the bottom of the thermal sink has a diameter of 112.5 mm. At the conclusion of a twelve hour growth cycle the grown crystal has a diameter of 100 mm and a height of 20 mm.

It will be appreciated that the appropriate selection of source material and source material form (i.e., solid or gas or a combination) and the intentional introduction of doping materials may be used to specifically tailor the operation of the crystal growth system to produce a desired crystal structure and composition. Examples are as follows:

(1) Use of solid undoped AlN as a source material to intentionally grow intrinsic AlN.

(2) Use of solid AlN intentionally doped with a specific impurity level as a source material to intentionally grow compensated AlN or AlN with dopants that are not non-electrically or optically active to intentionally increase the hardness and/or refractive index of the single crystalline AlN.

(3) Use of a combined source consisting of solid AlN doped or undoped with impurities in combination with injected source gas or gases.

(4) Use of atomic nitrogen, $N_2$, nitrogen ions, $Al(CH_3)_3$, $NH_3$, $AlCl_3$ Al vapor or other gas sources alone or in combination with the materials in (3), above.

(5) Use of atomic nitrogen, $N_2$, nitrogen ions, $Al(CH_3)_3$, $NH_3$, $AlCl_3$, Al vapor or other gases alone or in combination as the source material.

(6) Use of a microwave, laser or other system to create atomic nitrogen, nitrogen ions or excited nitrogen either before or after injection into the growth crucible.

It will be appreciated that the seed crystal on which the bulk single crystal of aluminum nitride is grown may be an aluminum nitride seed crystal or a silicon carbide seed crystal or a seed crystal formed from other suitable material such as single crystalline tungsten, single crystalline $Al_2O_3$ (below 2,040° C.) and alloys or other chemical combinations containing AlN.

EXAMPLE I

Bulk AlN single crystals are grown using AlN source crystals that have been sublimed at 1,950° C. for 10 hours to reduce the excess aluminum concentration to <0.05%. Next, the pyrolytic graphite growth crucible 90 of FIGS. 1 and 2 is loaded with 720 grams of AlN source crystals in a glove box under purified $N_2$ atmosphere. A 2.25 inch diameter 0.8 mm thick single crystalline on-axis 6H SiC seed (basil plane orientation) is placed in the bottom of the high density graphite thermal sink tube 68 and secured in place by pressure exerted through thermal sink rod 76.

The effusion system components are properly positioned in the crucible and the thermal sink which is connected to the crucible top is screwed into place. The entire apparatus is then loaded into the crystal growth furnace chamber. After sealing the growth chamber, the system is pumped down to $10^{-3}$ torr with the mechanical vacuum pump in a linear ramp of 20 minutes. The turbomolecular pump is used to reduce the chamber pressure to $10^{-5}$ torr in 30 minutes. The growth chamber is back filled with high purity $N_2$ to a pressure of 760 torr. The crucible is then heated to a temperature of 300° C. Next, the growth chamber is pumped down to a pressure of $10^{-3}$ torr. The system is then back filled with high purity N to a pressure of 1,000 torr.

The pressure is held constant at 1,000 torr by throttling gas through the magnetic control valve while the crucible bottom temperature, as measured by the optical pyrometer, is increased from 300° C. to 2,365° C. in a linear ramp over 2 hours and 15 minutes.

Next, the system pressure is reduced to 2 torr in a linear ramp over 30 minutes. The seed temperature, as measured by the optical pyrometer, is held at 2,260° C. by adjusting the water flow to the thermal sink.

The system is then held in this configuration for 14 hours with an effusion rate of $N_e$=28% of $N_t$. Next, the crucible temperature is reduced from 2,365° C. to 1,200° C. in a linear ramp over a period of 1 hour and 30 minutes. The system is then back filled with nitrogen to a pressure of 760 torr in a linear ramp over a period of 1 hour as the power to the heating elements is reduced to zero in a linear ramp at the same time. After two hours the crucible is removed from the crystal growth chamber. The resulting AlN crystal is two inches in diameter and 16–20 mm thick.

EXAMPLE II

Bulk AlN single crystals are grown using AlN source crystals that have been sublimed at 1,950° C. for 10 hours to reduce the excess aluminum concentration to <0.05%. Next, the high-density carbon impregnated graphite growth crucible 490 of FIG. 6 is loaded with 720 grams of AlN source crystals in a glove box under purified $N_2$ atmosphere. A 2.25 inch diameter 0.8 mm thick single crystalline on-axis 6H SiC seed (basil plane orientation) is placed in the bottom of the high density graphite thermal sink tube 68 and secured in place by pressure exerted through the thermal sink rod.

The effusion system components are properly positioned in the crucible and the high density graphite outer sleeve is screwed into place. The entire apparatus is then loaded into the crystal growth furnace chamber and the graphite gas injectors are screwed into the crucible. After sealing the growth chamber, the system is pumped down to $10^{-3}$ torr with the mechanical vacuum pump in a linear ramp of 20 minutes. The turbomolecular pump is used to reduce the chamber pressure to $10^{-5}$ torr in 30 minutes. The growth chamber is back filled with high purity $N_2$ to a pressure of 760 torr. The crucible is then heated to a temperature of 300° C. Next, the growth chamber is pumped down to a pressure of $10^{-3}$ torr. The system is then back filled with high purity $N_2$ to a pressure of 1,000 torr.

The pressure is held constant at 1,000 torr by throttling gas through the magnetic control valve while the crucible bottom temperature, as measured by the optical pyrometer, is increased from 300° C. to 2365° C. in a linear ramp over 2 hours and 15 minutes.

Next, the system pressure is reduced to 2 torr in a linear ramp over 30 minutes. The seed temperature, as measured by the optical pyrometer, is held at 2,260° C. by adjusting the water flow to the thermal sink.

Next, $N_2$ is flowed at a total rate of 1.2 standard cubic centimeters per minute into gas injectors 122 and 124 via an MKS Instruments mass flow controller.

Finally, the vertical raise/lower mechanism is set to pull the seed up at a rate of 2 mm per hour.

The system is then held in this configuration for 24 hours with an effusion rate of $N_e$=64% of $N_t$. Next, the crucible temperature is reduced from 2,365° C. to 1,200° C. in a linear ramp over a period of 1 hour and 30 minutes. The system is then back filled with nitrogen to a pressure of 760 torr in a linear ramp over a period of 1 hour as the power to the heating elements is reduced to zero in a linear ramp at the same time. After two hours the crucible is then removed from the crystal growth chamber. The resulting AlN crystal is two inches in diameter and 44–48 mm thick.

(2) Production of Bulk Single Crystals of Aluminum Nitride:Silicon Carbide Alloy by Condensing Source Vapor Species of Al, Si, N and C on a Growing Crystal Interface The process for producing bulk single crystals of aluminum nitride as described above may be modified to make available desired percentages of silicon and carbon source vapor species at the growing crystal interface so that SiC will substitute for AlN at locations in the lattice structure of the crystal. One manner of producing bulk single crystals of AlN:SiC alloy by this process is by utilizing the system of FIGS. 1 and 2 and adding solids to the solid source material 53 that will preferentially sublime Si and C source vapor species into the crucible along with the Al and N source vapor species. This process is set forth in Example III, below.

EXAMPLE III

Bulk $AlN_{0.7}$:$SiC_{0.3}$ single crystals are grown using pure polycrystalline AlN:SiC source crystals having a ratio of approximately 70 atomic percent AlN and 30 atomic percent SiC. The pyrolytic graphite growth crucible 90 of FIGS. 1 and 2 is loaded with 720 grams of AlN:SiC source crystals in a glove box under purified $N_2$ atmosphere. A 2.25 inch diameter 0.8 mm thick single crystalline on-axis 6H SiC seed (basil plane orientation) is placed in the bottom of the high density graphite thermal sink tube 68 and secured in place by pressure exerted through thermal sink rod 76.

The effusion system components are properly positioned in the crucible and the thermal sink which is connected to the crucible top is screwed into place. The entire apparatus is then loaded into the crystal growth furnace chamber. After sealing the growth chamber, the system is pumped down to $10^{-3}$ torr with the mechanical vacuum pump in a linear ramp of 20 minutes. The turbomolecular pump is used to reduce the chamber pressure to $10^{-5}$ torr in 30 minutes. The growth chamber is back filled with high purity $N_2$ to a pressure of 760 torr. The crucible is then heated to a temperature of 300° C. Next, the growth chamber is pumped down to a pressure of $10^{-3}$ torr. The system is then back filled with high purity $N_2$ to a pressure of 1,000 torr.

The pressure is held constant at 1,000 torr by throttling gas through the magnetic control valve while the crucible bottom temperature, as measured by the optical pyrometer, is increased from 300° C. to 2335° C. in a linear ramp over 2 hours and 15 minutes.

Next, the system pressure is reduced to 7 torr in a linear ramp over 30 minutes. The seed temperature, as measured by the optical pyrometer, is held at 2215° C. by adjusting the water flow to the thermal sink.

The system is then held in this configuration for 14 hours with an effusion rate of $N_e$=28% of Nt. Next, the crucible temperature is reduced from 2335° C. to 1,200° C. in a linear ramp over a period of 1 hour and 30 minutes. The system is then back filled with nitrogen to a pressure of 760 torr in a linear ramp over a period of 1 hour as the power to the heating elements is reduced to zero in a linear ramp at the same time. After two hours the crucible is removed from the crystal growth chamber. The resulting AlN:SiC alloy single crystal is two inches in diameter and 18–22 mm thick.

Another representative process for producing bulk single crystals of AlN:SiC alloy is carried out utilizing a system substantially as shown in FIGS. 1 and 2 but with the growth crystal 490 of FIG. 6, as described below in Example IV.

EXAMPLE IV

Bulk $AlN_{0.7}$:$SiC_{0.3}$ single crystals are grown using pure polycrystalline AlN:SiC source crystals having a ratio of approximately 70 atomic percent AlN and 30 atomic percent SiC. The high-density carbon impregnated graphite growth crucible 490 of FIG. 6 is loaded with 720 grams of AlN:SiC source crystals in a glove box under purified $N_2$ atmosphere. A 2.25 inch diameter 0.8 mm thick single crystalline on-axis 6H SiC seed (basil plane orientation) is placed in the bottom of the high density graphite thermal sink tube 68 and secured in place by pressure exerted through the thermal sink rod.

The effusion system components are properly positioned in the crucible and the high density graphite outer sleeve is screwed into place. The entire apparatus is then loaded into the crystal growth furnace chamber and the graphite gas injectors are screwed into the crucible. After sealing the growth chamber, the system is pumped down to $10^{-3}$ torr with the mechanical vacuum pump in a linear ramp of 20 minutes. The turbomolecular pump is used to reduce the chamber pressure to $10^{-5}$ torr in 30 minutes. The growth chamber is back filled with high purity $N_2$ to a pressure of 760 torr. The crucible is then heated to a temperature of 300° C. Next, the growth chamber is pumped down to a pressure of $10^{-3}$ torr. The system is then back filled with high purity $N_2$ to a pressure of 1,000 torr.

The pressure is held constant at 1,000 torr by throttling gas through the magnetic control valve while the crucible bottom temperature, as measured by the optical pyrometer, is increased from 300° C. to 2335° C. in a linear ramp over 2 hours and 15 minutes.

Next, the system pressure is reduced to 7 torr in a linear ramp over 30 minutes. The seed temperature, as measured by the optical pyrometer, is held at 2215° C. by adjusting the water flow to the thermal sink.

Next, a 95% $N_2$/5% CN gas is flowed at a total rate of 1.2 standard cubic centimeters per minute into gas injectors 122 and 124 via an MKS Instruments mass flow controller.

Finally, the vertical raise/lower mechanism is set to pull the seed up at a rate of 2.1 mm per hour.

The system is then held in this configuration for 24 hours with an effusion rate of $N_e$=64% of $N_t$. Next, the crucible temperature is reduced from 2335° C. to 1200° C. in a linear ramp over a period of 1 hour and 30 minutes. The system is then back filled with nitrogen to a pressure of 760 torr in a linear ramp over a period of 1 hour as the power to the heating elements is reduced to zero in a linear ramp at the same time. After two hours the crucible is then removed from the crystal growth chamber. The resulting AlN:SiC alloy single crystal is two inches in diameter and 46–50 mm thick.

With reference to FIGS. 8B2, 8C and 8D, bulk single crystals of AlN:SiC alloy may also be grown by vaporizing a combined Al—Si liquid bath or individual Al and Si liquid baths to produce Al and Si source vapors in the growth crucible with C and N vapor species being provided by injection of a C and N containing gas into the growth crucible.

FIG. 8B2 illustrates a crystal growth system incorporating a vapor source apparatus 800 that is utilized to create a constant flow of Al, Si, N and C source vapor. In this system Al—Si vapor produced by heating liquid Al—Si to a specific temperature is combined with C and N vapor in the growth crucible to produce the desired flow and stoichiometry of source vapor. The area inside the growth crucible near the seed or growing crystal interface becomes saturated with Al, Si, C and N components that react to form AlN:SiC single crystalline alloy at the growing crystal interface. More particularly, vapor source apparatus 800 includes a graphite crucible 990 having the shape shown in FIG. 8B2, a cylindrical resistance heating element 952, a thermal sink 967 holding a seed 72 and an effusion system similar to the effusion system shown in FIG. 4. Liquid Al—Si is contained in a lower crucible 975 that is electrically insulated at 977 by a BN insulator ring, or a physical gap, or other suitable means. Crucible 975 may be a cold crucible, for example, a water-cooled copper crucible the contents of which is heated by a water-cooled induction heating coil 980 as shown in FIG. 8B2. Alternatively, crucible 975 may be formed of high density graphite, pyrolytic graphite, silicon carbide coated graphite or boron nitride. These crucibles may be heated by either resistance heating or induction heating, as appropriate. The C and N vapors are produced by a C and N containing source gas introduced through gas injector 993. In one embodiment, the C and N containing source gas is CN that is transported in an appropriate carrier gas such as $N_2$. The flow of the C and N containing source gas is achieved by an appropriate apparatus such as, in the case of CN, utilizing a thermal mass controller 999 that controls the flow of $N_2$ across paracyanogen at an elevated temperature (e.g. >850° C.) so that a desired flow of CN in $N_2$ is produced. The liquid Al—Si is maintained at a temperature sufficient to create a suitable vapor flow under the conditions maintained in the crucible, particularly crucible pressure. For example, for a 30% AlN/70% SiC (atomic percentage) composition the total Al and Si vapor pressure will be on the order of 5.46 torr at 1727° C. To create a suitable vapor flow rate, a temperature above about 700° C. is preferred.

FIG. 8C illustrates another crystal growth system incorporating a vapor source apparatus 800' that is similar to apparatus 800 of FIG. 8B2, but with a different geometry and the addition of a horizontal baffle plate 995 above the molten liquid Al-Si to facilitate introduction of Al and Si source vapor into the portion of growth crucible 990 that contains the growing crystal interface. More particularly, horizontal baffle plate 995, containing a central opening 996, extends across the flow passage through which the Al and Si source vapor flows to create a pressure gradient thereacross and a resultant velocity increase to the Al and Si vapor moving into crucible 990. This arrangement serves to reduce the back diffusion of CN or other C and N containing gases toward the liquid Al—Si, while also serving to propel the Al and Si source vapor toward the growing crystal interface. This is particularly important when the crystal growth temperature is higher than the temperature required to vaporize the liquid Al and Si. Apparatus 800' also includes a lower profile crucible structure that facilitates vapor deposition at the growing crystal interface under certain operating conditions.

Figure 8D:
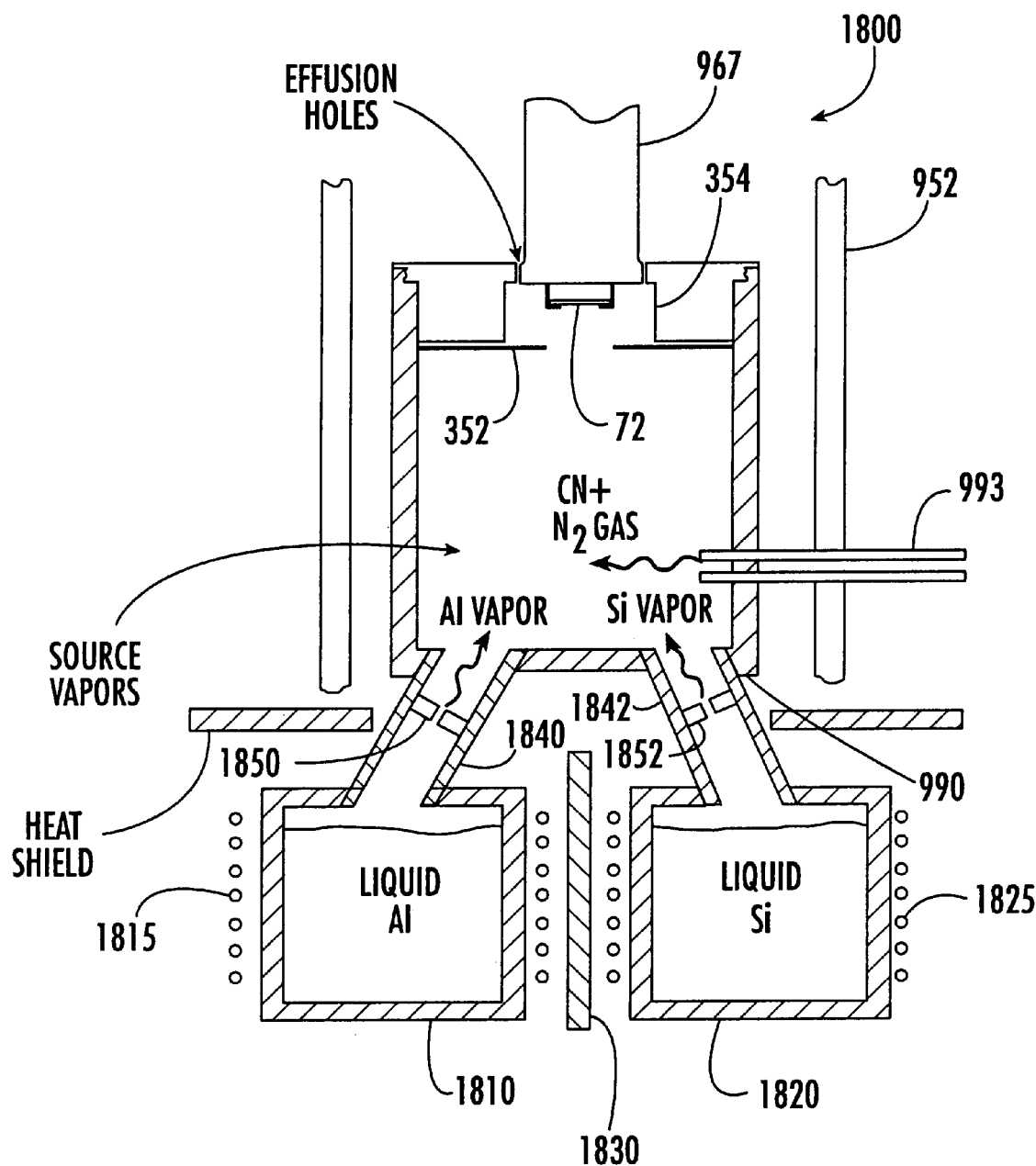
FIG. 8D shows a crystal growth apparatus similar to the apparatus of FIGS. 8B and 8C with separately contained molten liquid sources of Al and Si source vapors.

FIG. 8D illustrates a crystal growth apparatus 1800 that is similar to those shown in FIGS. 8B2 and 8C, but with separately contained molten liquid sources of Al and Si source vapors. More particularly, apparatus 1800 includes a first crucible 1810 that holds liquid Al at a temperature controlled by a water-cooled induction heating coil 1815 and a second crucible 1820 that holds liquid Si at a temperature controlled by heating coil 1825. A thermal and electrical insulator 1830 separates crucibles 1810 and 1820. Crucibles 1810 and 1820 communicate with growth crucible 990 by respective Al/Si vapor flow conduits 1840, 1842 which preferably include baffles 1850, 1852 with central openings for creating a pressure gradient and facilitating vapor flow in the manner described above in connection with the embodiment of FIG. 8C. The independent crucibles for producing Al and Si vapors are advantageous because the vapor pressure of Al is considerably higher than that of Si. Thus, when Al and Si are contained in liquid form in a common crucible, as in FIGS. 8B2 and 8C, the percentage composition of the Al—Si liquid must be controlled to produce the proper ratio of Al and Si vapors under the common temperature and pressure conditions in the crucible. Stated differently, a combined molten solution of Al—Si would typically require a high (atomic weight) percentage of Si therein to obtain the desired Al and Si vapor composition in the growth crucible. On the other hand, the separate crucibles of FIG. 8D permit independent temperature control for better control of vaporization rates of the Al and Si.

It will be appreciated that the systems of FIGS. 8B2, 8C and 8D permit the use of very pure source vapors and the ability to carefully control the stoichiometry. These factors, coupled with the preferential placement of the seed crystal near the molten Al and Si, makes possible the operation of a system with little or no effusion, with it being understood that effusion is preferred.

It will also be appreciated with respect to the systems of FIGS. 8B2, 8C and 8D that under certain pressure and temperature conditions the Si and Al, either combined or separately contained, may be vaporized from the solid form, instead of liquid.

The growth of the bulk single crystals of AlN or AlN:SiC alloy has been described sometimes herein as being accomplished by what is commonly referred to as a "sublimation" technique wherein the source vapor is produced at least in part when crystalline solids of AlN, SiC or other solids or liquids containing AlN, Al, N, SiC, Si or C sublime preferentially and thereafter recondense on the growing crystal interface. IN other instances the source vapors, particularly Al and Si, are produced by vaporizing Al and Si liquids. Furthermore, according to the invention, the source vapor may be achieved in whole or in part by the injection of source gases or like techniques. In describing these and other techniques that are used to grow bulk AlN:SiC alloy single crystals according to this invention, the terms "depositing", "depositing vapor species" and like terms will sometimes be used.

While the method and apparatus of the present invention may serve to produce single crystals of AlN:SiC alloy in varying lattice structures, it will be appreciated that under the growth conditions set forth herein, the preferred lattice structure is "2H" wherein AlN and SiC substitute for each other in the lattice structure to produce a single crystal. In that regard, the term "single crystal" is used herein to refer to single crystals and certain solid solutions with long range order sufficient to provide isotropic electronic and/or optical properties.

Figure 12:
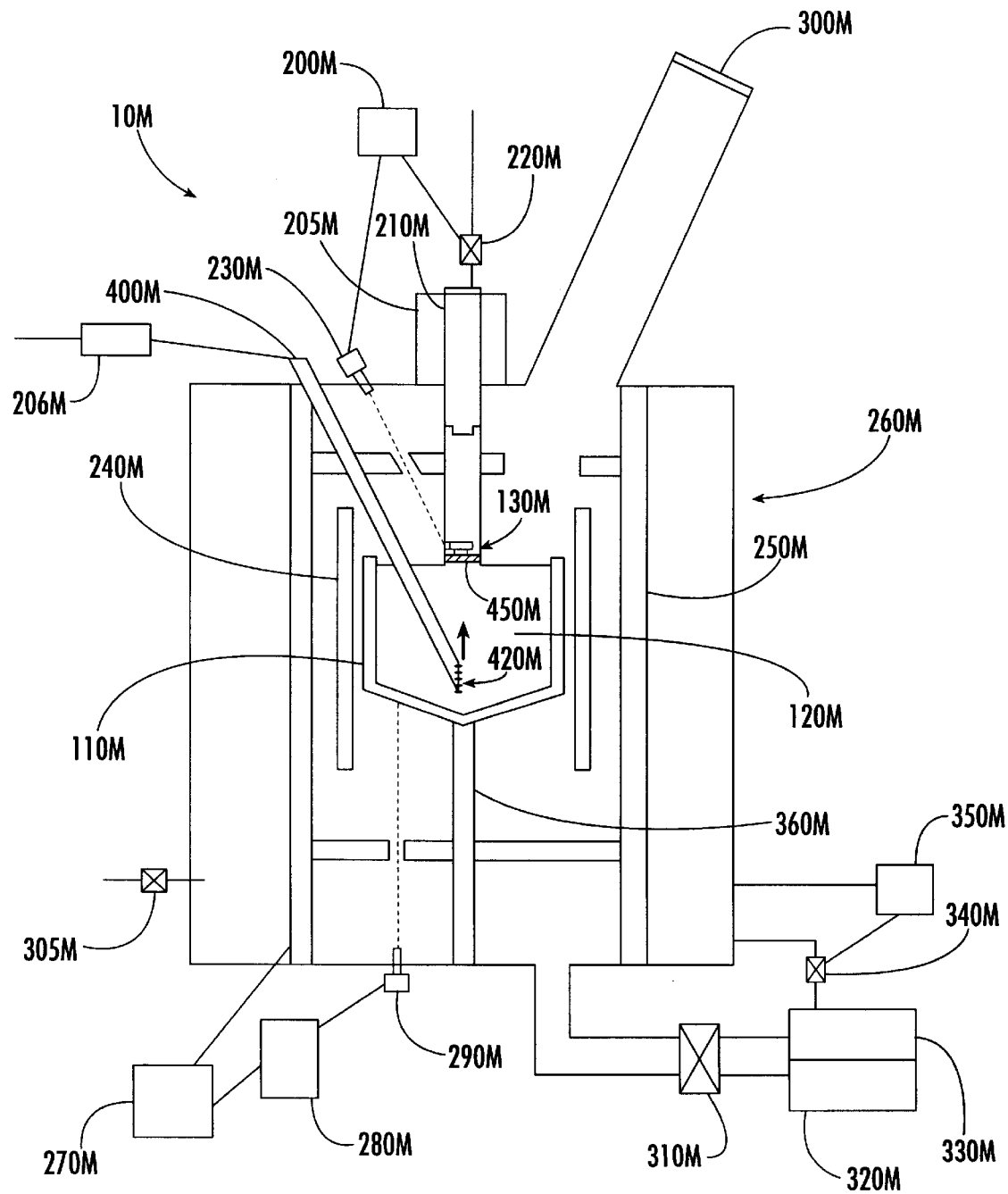
FIG. 12 is a schematic representation of one system for growing bulk single crystals of aluminum nitride by pulling the crystals from an aluminum melt.

(3) Production of Bulk Single Crystals of Aliminum Nitride by Pulling the Crystals From a Melt of Aluminum Bulk single crystals of aluminum nitride may also be produced by a process where the crystal is pulled from a melt of aluminum into which an N-containing gas is bubbled. Referring to FIG. 12, such a system will be described. System 10M includes a boron nitride (BN) gas injector 400M that is utilized to force $N_2$ gas into the bottom of a graphite crucible 110M containing liquid Al 120M such that the $N_2$ gas will form AlN and redeposit on a seed crystal 130M that is held at a temperature below the temperature of the liquid Al. The crucible is contained in a chamber 260M and is heated by a cylindrical resistant heating element 240M. Heat shields 250M as known in the art are utilized.

Figure 13:
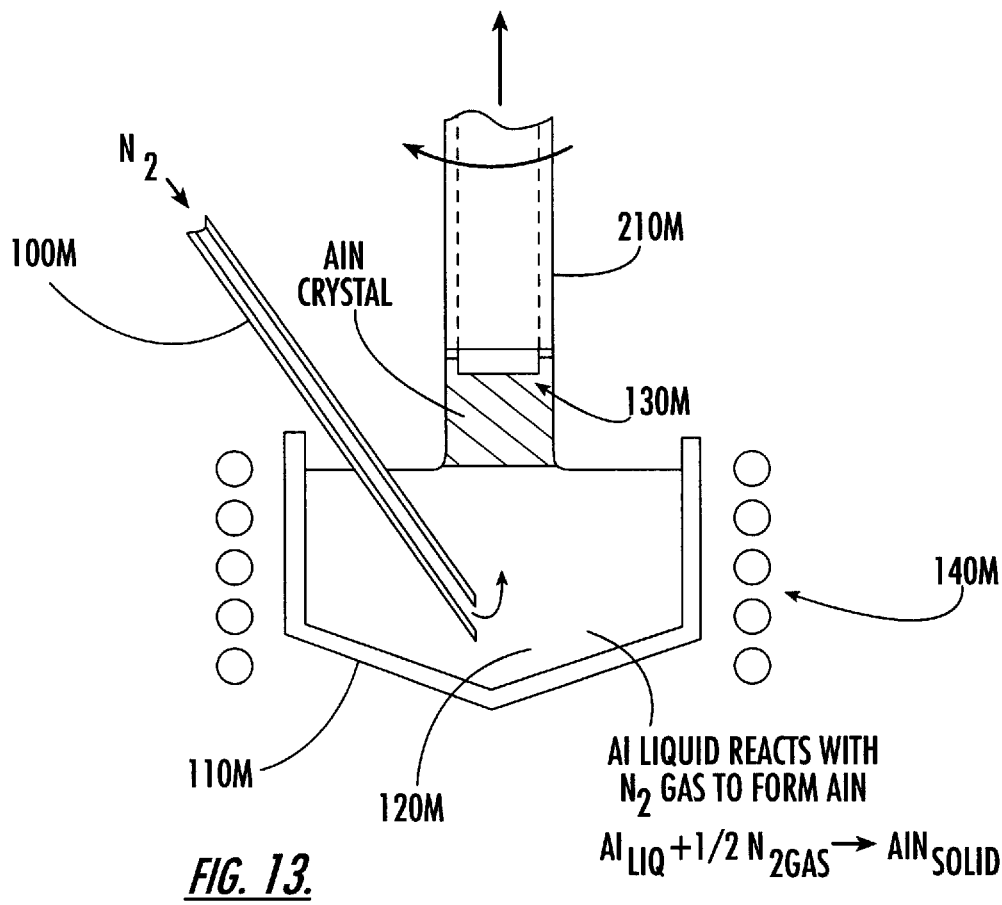
FIG. 13 is a view of a subassembly of a system such as that of FIG. 12, wherein the crucible is heated by an induction heating coil.

In another embodiment of the invention (subassembly 2) shown in FIG. 13, the crucible is heated by an induction heating coil 140M.

In other embodiments of the invention, the crucible may be heated by more than one resistance heating element so as to produce a vertical thermal gradient through the crucible containing liquid Al. Multiple heating elements can take the form of cylindrical rings, a flat plate at the bottom of the crucible used in combination with a cylindrical heating element along the side of the crucible, flat plates above and below the crucible or any other combination that allows control of the thermal profile through the crucible.

The crucible can be fabricated from graphite, high density graphite, pyrolytic graphite, silicon carbide coated graphite, Al$_2$O$_3$, zirconium oxide, BN or other suitable material. In addition, a water cooled cold-crucible fabricated from copper may be used when employing induction heating.

The seed temperature can be controlled by controlling the flow of cooling water to the thermal sink 210M (shown most clearly in FIG. 13), with it being understood that seed 130M is in intimate heat transfer relationship with thermal sink 210M. The temperature control loop includes an optical pyrometer 230M linked to a temperature controller 200M which, in turn, is linked to a cooling water control valve 220M.

Gas injector 400M may be fabricated from BN, high density graphite or other suitable material. The gas is preferably injected in the liquid Al directly below the growing crystal interface 450M. A gas diffuser 420M located at the end of gas injector 400M containing a plurality of holes may be employed to ensure that large unreacted N$_2$ bubbles do not form in the liquid Al.

The seed is fabricated from single crystalline SiC, Al$_2$O$_3$, W or AlN.

Means for visual observation and control of the system is supplied by a view port 300M.

Other elements of system 10M will be described, along with their functions, in the Examples V and VI immediately below.

EXAMPLE V

Gas injector 400M is inserted into crucible 110M. Al material weighing 850 grams having a purity level greater than 99.999% is loaded into crucible 110M. The crucible is placed into chamber 260M and screwed into graphite crucible support rod 360M. The chamber is then sealed and pumped down to 10$^{-3}$ torr with mechanical pump 330M in a linear ramp over 10 minutes. Magnetic control valve 340M is utilized to control the pressure down to 10 torr. A three inch diameter throttle valve 310M is utilized to control the pressure below 10 torr. A turbomolecular pump 320M is then used to pump the chamber down to 10$^{-5}$ torr. Next, the chamber is backfilled with high purity using control valve 305M to a pressure of 3,000 torr. Pressure controller 350M is used to maintain the chamber pressure at 3,000 torr during the growth process.

The crucible temperature is then increased to 1470° C. in a linear ramp over one hour using temperature controller 280M. The 0.5 inch diameter seed 130M is then lowered into the liquid Al using the vertical pull/rotate mechanism 205M, and rotation is set at 1.5 rpm. The N$_2$ flow rate is set at 3.5 standard cubic centimeter per minute into the injector 400M with thermal mass flow controller 206M. The seed temperature is set at 1425° C. using temperature controller 280M which is linked to an optical pyrometer 290M and the power supply 270M for heater 240M. The seed is then pulled up to create a meniscus 2–3 mm in height at the seed liquid interface. The vertical pull mechanism is then set to raise the seed at 0.5 mm per hour. This pull rate is adjusted every 4 minutes to maintain the meniscus at 2–3 mm in height. When the diameter of the crystal reaches 2 inches the pull rate is increased to 0.8 mm per hour and adjusted every 4 minutes to maintain a meniscus of 3–5 mm and to maintain the crystal diameter at 2 inches. The crystal is pulled in this configuration for 16 hours.

The crystal is then pulled approximately 0.5 cm out of the Al and the power to the heating element is reduced to zero in a linear ramp over 1 hour. The system is allowed to cool for an additional 2 hours and the N$_2$ pressure is reduced to 760 torr via control valve 340M.

The resulting AlN single crystal is 11–15 mm in height and 2 inches in diameter.

EXAMPLE VI

The N$_2$ gas injector 400M is inserted into crucible 110M. Al material weighing 1400 grams having a purity level greater than 99.999% is loaded into crucible 110M. The crucible is placed into chamber 260M and screwed into graphite crucible support rod 360M. The chamber is then sealed and pumped down to 10$^{-3}$ torr with mechanical pump 330M in a linear ramp over 10 minutes. Magnetic control valve 340M is utilized to control the pressure down to 10 torr. The three inch diameter throttle valve 310M is utilized to control the pressure below 10 torr. The turbomolecular pump 320M is then used to pump the chamber down to 10$^{-5}$ torr. Next, the chamber is backfilled with high purity N$_2$ using control valve 300M to a pressure of 3,000 torr. Pressure controller 350M is used to maintain the chamber pressure at 3,000 torr during the growth process.

The crucible temperature is then increased to 1540° C. in a linear ramp over one hour using temperature controller 280M. The 0.5 inch diameter seed is then lowered into the liquid Al using the vertical pull/rotate mechanism 205M, and rotation is set at 1.5 rpm. The N$_2$ flow rate is set at 6.5 standard cubic centimeter per minute into the injector 400M with thermal mass flow controller 206M. The seed temperature is set at 1495° C. using temperature controller 280M which is linked to an optical pyrometer 290M and the power supply 270M for heater 240M. The seed is then pulled up to create a meniscus 2–3 mm in height at the seed liquid interface. The vertical pull mechanism is then set to raise the seed at 0.7 mm per hour. This pull rate is adjusted every 4 minutes to maintain the meniscus at 2–3 mm in height. When the diameter of the crystal reaches 2 inches, the pull rate is increased to 1.6 mm per hour and adjusted every 4 minutes to maintain a meniscus of 3–5 mm and to maintain the crystal diameter at 2 inches. The crystal is pulled in this configuration for 16 hours.

The crystal is then pulled approximately 0.5 cm out of the Al melt and the power to the heating element is reduced to zero in a linear ramp over 1 hour. The system is allowed to cool for an additional 2 hours, and the N$_2$ pressure is reduced to 760 torr via control valve 340M.

The resulting AlN single crystal is 25–30 mm in height and 2 inches in diameter.

One important feature of the melt technique is that it is particularly well suited for growth of crystals greater than 1 inch in diameter and having a length greater than 5 mm, for example, a length on the order of 5–100 mm. As discussed above, such large crystals are desirable, if not necessary, for many applications.

Another feature of the melt technique is that in preferred embodiments it employs a gas reaction, which permits the system designer to utilize a wide range of melt temperatures. At lower temperatures the system designer has a relatively wide latitude with respect to crucible materials that will not materially contaminate the melt due to the relatively lower solubility of crucible materials at lower temperatures. On the other hand, with the use of appropriate crucible materials as discussed above, the system may operate at higher melt temperatures, up to approximately 2200° C. for example, to obtain higher crystal growth rates.

It will be appreciated that it is relatively easy to control the temperature of a melt as compared to controlling temperatures throughout a sublimation growth system, thus making for more reliably consistent growth conditions at the crystal growth interface.

Another feature of the melt technique is that it may be carried out utilizing inexpensive raw materials which are commercially available at low cost in sufficiently pure form.

Figure 14:
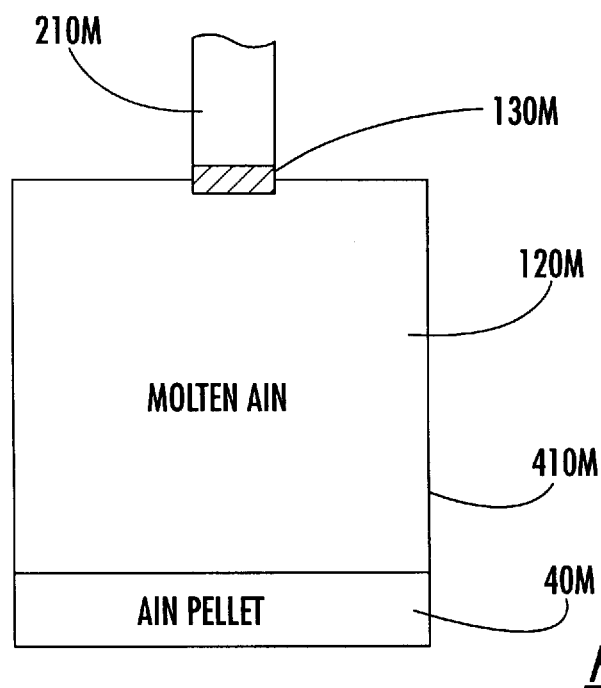
FIG. 14 is a view of an alternative embodiment of the crystal-pulling system.

It will be appreciated that the embodiment of FIGS. 12 and 13, and the processes described above, may be varied in numerous ways. For example, instead of injecting a nitrogen-containing gas into the melt, the nitrogen-containing gas may be provided at the surface of the melt where AlN can form, go into solution and then be deposited on the crystal growth surface. Also, as another alternative, nitrogen may be supplied to the melt in a solid nitrogen-containing compound. One manner of providing nitrogen in solid form is shown in FIG. 14 wherein an AlN pellet 400M, for example a pellet formed of isostatically pressed AlN powder, is maintained at the bottom of a crucible 410M, with the molten Al positioned above the AlN pellet and the seed crystal at the top of the melt. A temperature gradient is maintained with the highest temperature at the solid AlN and the lowest temperature at the crystal.

As yet another alternative embodiment of the melt technique, the single crystal may be deposited without pulling the seed crystal. While pulling the crystal has the advantages mentioned earlier in this specification, under certain circumstances suitable growth may be achieved on the seed crystal without pulling provided the crystal growth surface is properly cooled.

While a pressure of 3000 torr has been disclosed in Examples V and VI as a suitable chamber pressure during the crystal growth operation, other pressures may be used, with it being understood that a pressure substantially above the vapor pressure of aluminum at the given growth temperature is necessary under the growth conditions discussed above. In this regard, it should be understood that techniques such as known gas encapsulation techniques may be utilized to suppress vaporization of the Al, thus allowing relatively high growth temperatures at a given pressure.

Figure 15:
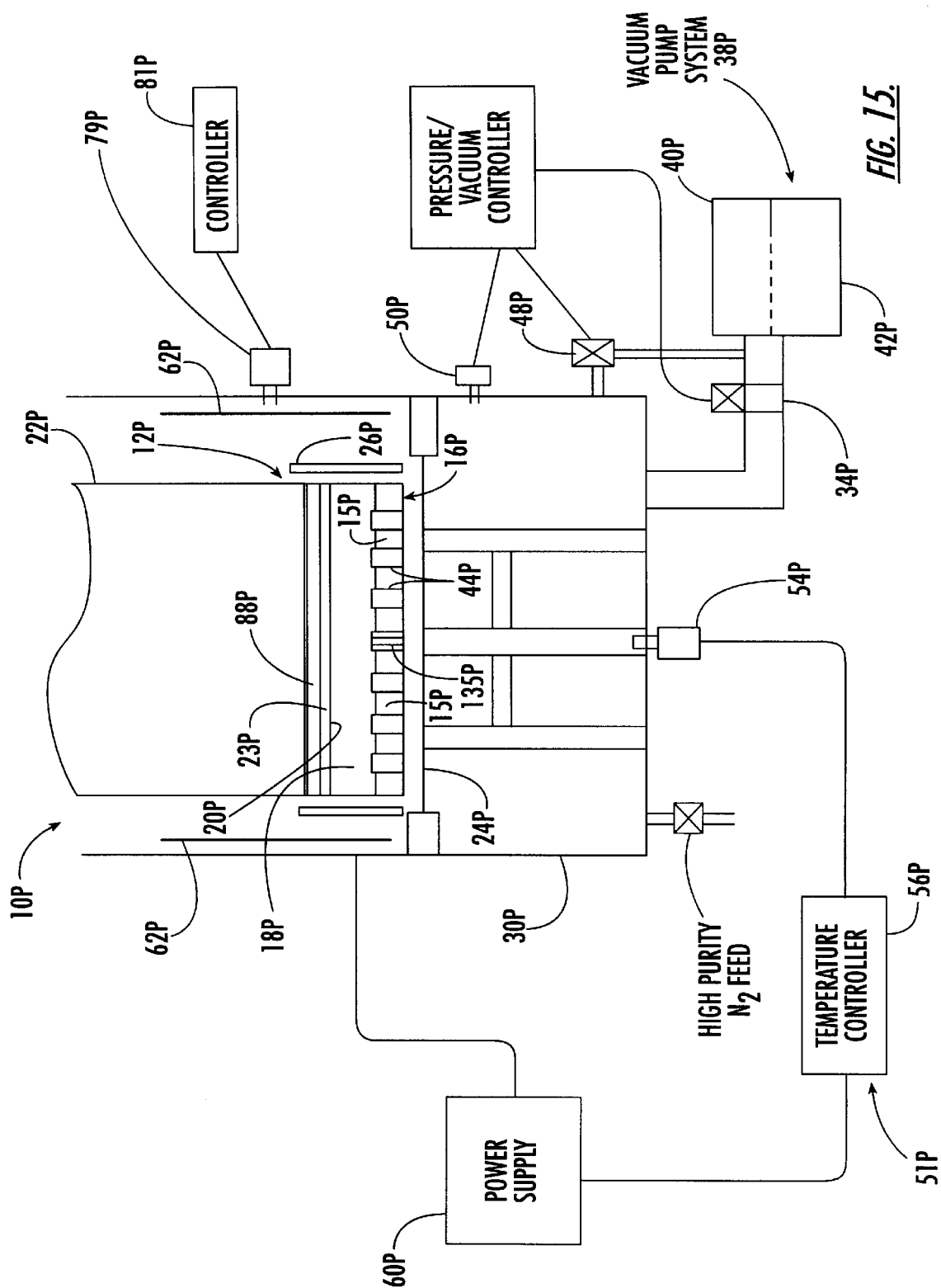
FIG. 15 is a schematic representation of an overall system for growing bulk single crystals of AlN or AlN:SiC alloy by a high output, low cost batch process employing multiple preferentially cooled nucleation sites.
Figure 16:
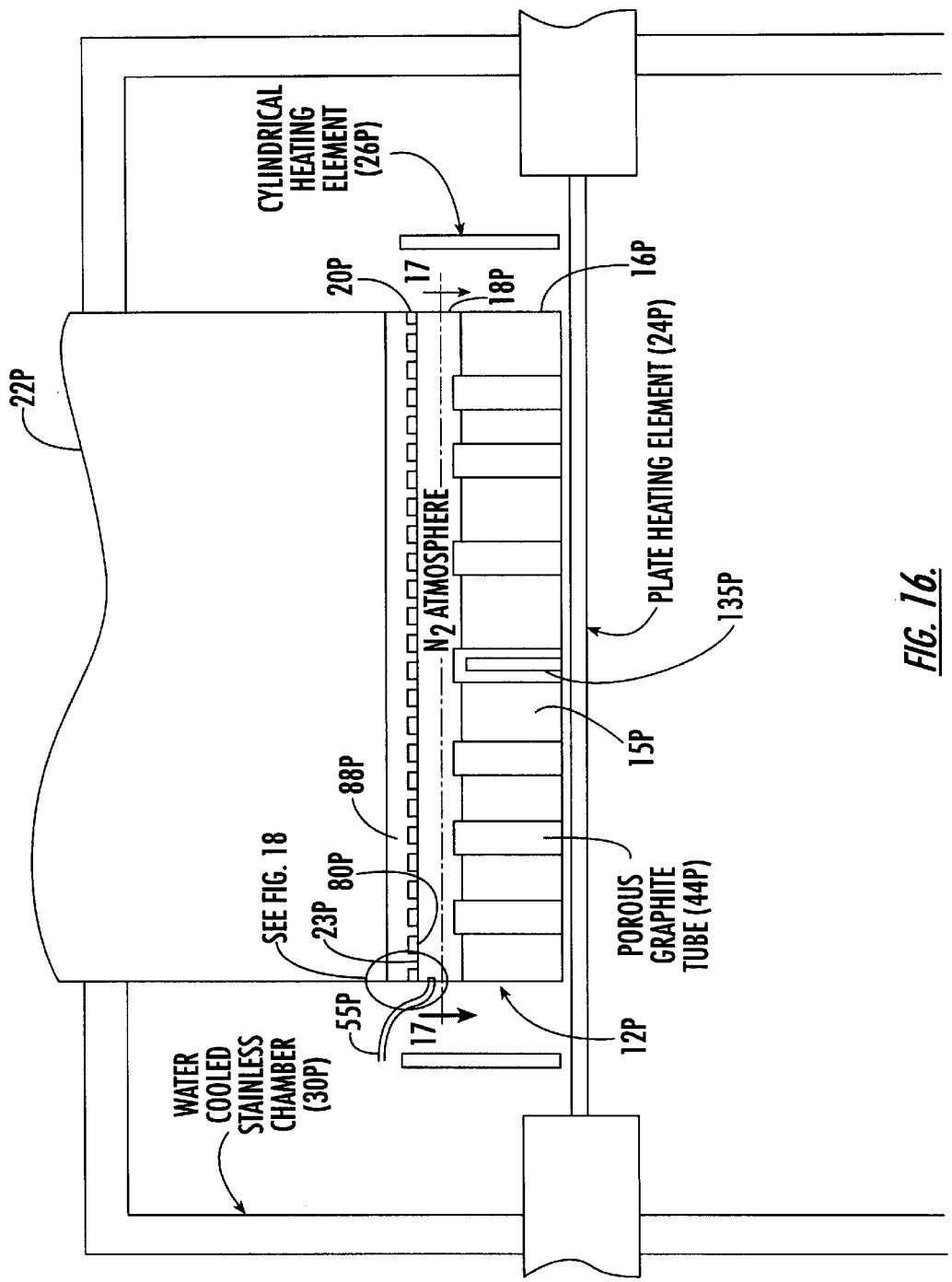
FIG. 16 is a side view of the furnace portion and related components of the crystal growth system shown in FIG. 15.

(4) Production of Bulk Single Crystals of Aluminum Nitride and Aluminum Nitride:Silicon Carbide Alloys by Low Cost, High Output Batch Process Employing Preferentially Cooled Nucleation Sites Referring to FIGS. 15 and 16, there is shown one form of a crystal growth system loP of the present invention that is designed for low cost, high output production of low defect density, low impurity bulk single crystals of AlN, SiC and AlN:SiC alloys. System 10P includes a crystal growth enclosure in the form of an upstanding cylindrical sublimation furnace 12P having a lower zone 16P containing solid source material 15P, a central zone 18P containing a selected atmosphere, for example $N_2$, through which sublimed source vapor species travel to the nucleation sites, and an upper zone 20P where crystal growth occurs when the sublimed source vapor species recondense at the preferentially cooled nucleation sites. A water-cooled stainless steel heat sink rod 22P serves to preferentially cool the nucleation sites through a graphite cooling disc member 23P that overlies the nucleation sites. Furnace 12P is heated by a horizontal plate heating element 24P and an upstanding cylindrical heating element 26P. A stainless steel chamber 30P serves as the outer containment structure for system 10P. Chamber 30P is water cooled (detail not shown) according to principles well known in the art.

System pressure within chamber 30P below 10 torr is controlled via a throttle valve 34P (for example, a 3 inch diameter throttle valve manufactured by MKS Instruments, Inc. of Andover, Mass., USA) located in series with a vacuum pumping system 38P. In accordance with techniques known in the art, the vacuum pumping system 38P is composed of a mechanical pump 40P to reduce the system pressure to the $10^{-3}$ torr and a turbomolecular pump 42P to pump the system down to $10^{-5}$ torr. Pressure control above 10 torr is maintained through a magnetic control valve 48P that is also in series with vacuum pumping system 38P. System pressure is measured from $10^{-3}$ torr to 1,000 torr with a highly accurate temperature controlled absolute capacitance manometer 50P such as the MKS Instruments, Inc., model no. 390. Horizontal heating element 24P serves as the primary heat source for system 10P, while cylindrical heating element 26P provides supplemental heat and also provides a means for controlling heat losses at the perimeter of furnace 12P.

Temperature control is facilitated by an optical pyrometer 54P (FIG. 15) sited on the back of the heating element. Pyrometer 54P provides a constant input signal to a digital temperature controller 56P that maintains the temperature at a set point by controlling the output of a power supply 60P. According to principles known in the art, heat generated by heating elements 24P, 26P is shielded from the stainless steel walls of chamber 30P by heat shields 62P, preferably formed of graphite. Regardless of the precise form taken by the horizontal plate heating element, such an arrangement enables the system to maintain a highly uniform thermal profile across a large diameter.

Figure 17:
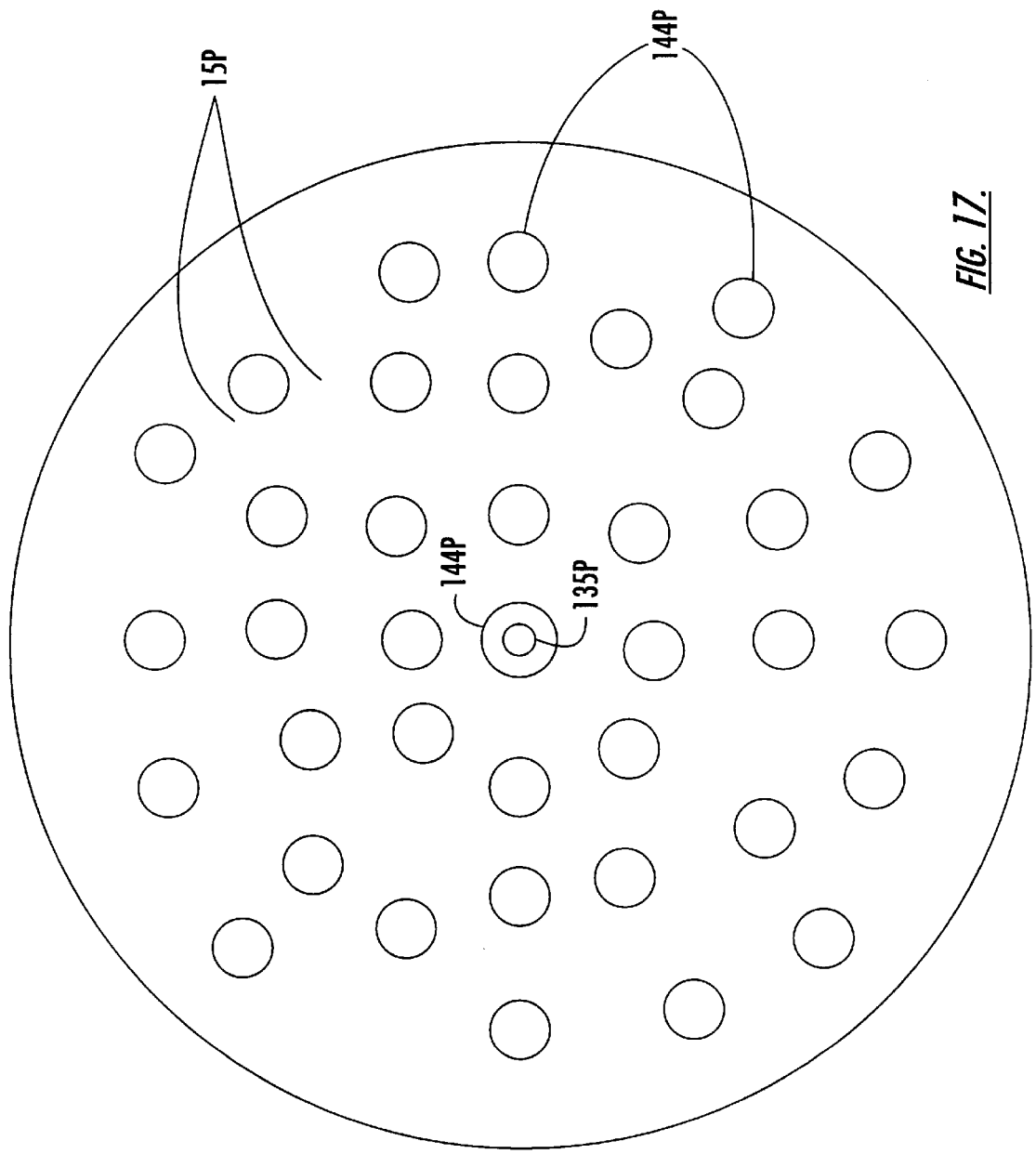
FIG. 17 is a section view taken substantially along line 17—17 of FIG. 16 showing the source material and associated upright porous tubes at the bottom of the furnace.

Furnace lower zone 16P contains source material 15P in the spaces between a plurality of upstanding porous graphite tubes 44P (FIGS. 16 and 17). During operation, when the solid source material preferentially sublimes to produce vapor species for growing the crystals, the vapor species move through the walls of porous tubes 44P and are thereby transported through the open tops of the tubes to furnace central zone 18P. As discussed above, the source material may take the form of AlN powder, SiC powder, AlN:SiC alloy solid material (for example, isostatically pressed AlN:SiC solid pellets), a combination of AlN and SiC powders, other solid forms containing Al, other solid forms containing Si, or other material that will sublime or vaporize to produce the desired vapor species. Tubes 44P are positioned in furnace lower zone 16P so that the sublimed vapor species will not have to diffuse more than a predetermined distance, for example 3 cm, before reaching the porous wall of one of the tubes.

As described below in more detail, the thermal gradient between the source material (at, for example, 2400° C.) and the preferentially cooled nucleation sites (at, for example, 2200° C.) along with the chemical gradient drive the vapor species through tubes 44P and central zone 18P to the nucleation sites.

The nucleation sites 80P are located on the lower face of the circular graphite disc member 23P that serves as the upper boundary of the furnace upper zone 20P. Disc member 23P is held in physical contact and heat transfer relationship to an overlying circular graphite member 88P that serves to preferentially cool the nucleation sites. Member 88P is, in turn, threadingly connected to the stainless steel water cooled rod 22P that serves as the heat sink.

Figure 18:
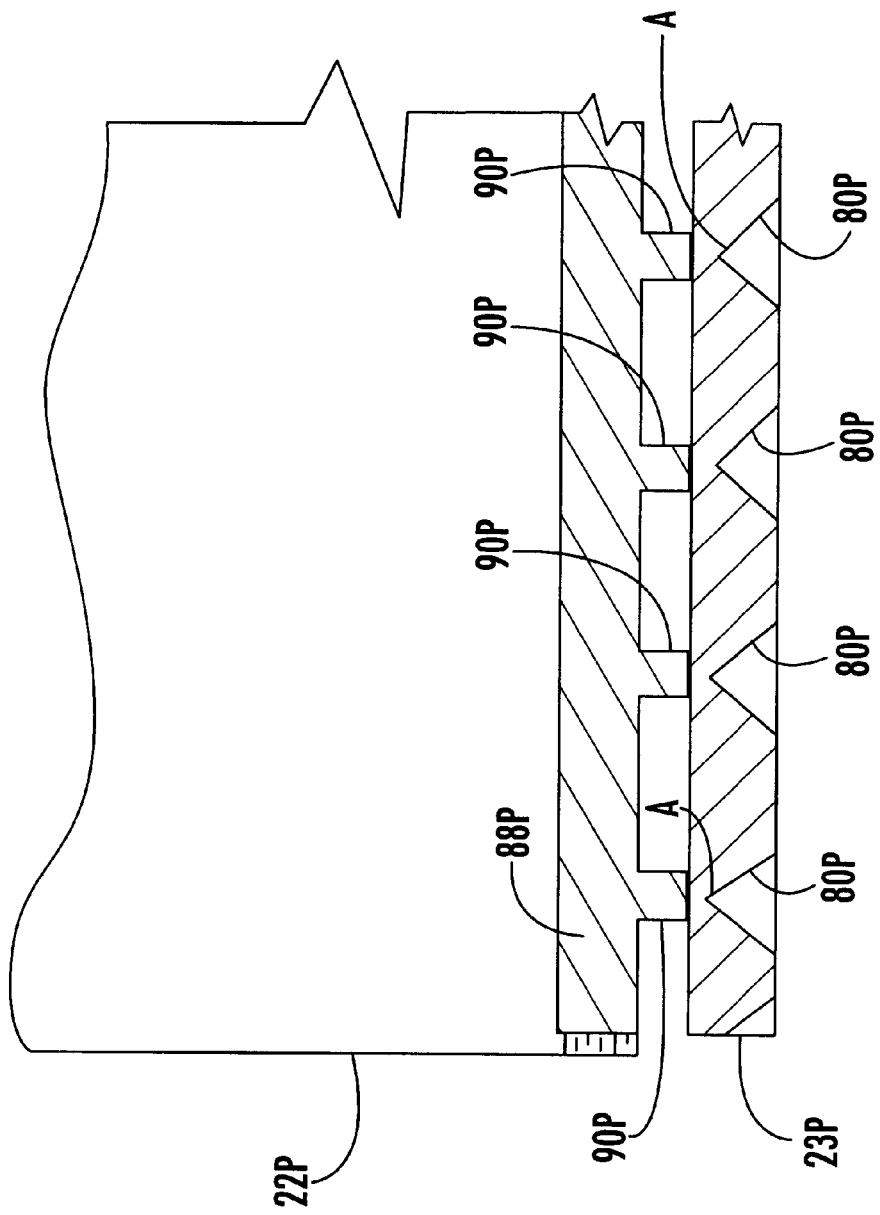
FIG. 18 is an enlarged view of the area in circle 18 in FIG. 16 showing a portion of the upper furnace plate containing unseeded nucleation sites and the associated heat sink structure having downwardly depending pegs at each nucleation site for providing preferential cooling thereat.

FIG. 18 shows, on an enlarged scale, four adjacent nucleation sites 80P on disc member 23P and portions of the overlying member 88P and heat sink rod 22P. In one embodiment, disc member 23P is a circular, thin solid graphite disc having a thickness on the order of 0.5 cm and a diameter (e.g. 45.5 cm) that is approximately the same as the diameter of cylindrical furnace 12P. A large number of unseeded nucleation sites 80P (e.g. 254 sites) are formed in disc member 23P by removing material having a conical shape from the underside of member 23P. In one preferred embodiment, each conical nucleation site 80P may extend to an apex point A within approximately 0.05 cm of the upper surface of disc member 23P. The overlying circular member 88P has approximately the same diameter as disc member 23P and includes downwardly projecting pegs 90P, with one peg overlying each nucleation site 80P in physical and heat transfer relationship with respect to disc member 23P. Preferably, the overlying circular member 88P is threaded at its periphery and connected by mating threads to heat sink rod 22P. Thus, in operation, pegs 90P press downwardly on the upper surface of disc member 23P just above each nucleation site 80P in order to preferentially cool each site. The relatively short heat transfer path (e.g. 0.05 cm) from the apex A of each nucleation site 80P aids in significant localized cooling throughout the crystal growth operation, and especially at the beginning when initial nucleation occurs at or near the apex. Both the conical nucleation sites and the pegs may be formed in respective members 23P, 88P by computer controlled milling operations, or like operations that are well known in the art. It will be appreciated that the apex A of each conical nucleation site 80P is cooled to the lowest temperature within the furnace crucible for two related, but distinct reasons. First, the apex is positioned in direct, underlying proximity to a respective one of the cooling pegs 90P. Second, of all the exposed surfaces on the underside of disc member 23P, the apex has the shortest heat transfer path to the heat removal means above disc member 23P. Thus, even without the use of discrete cooling pegs overlying each nucleation site (i.e. utilizing uniform heat removal across the top of disc member 23P) the nucleation sites, particularly at each apex A, would be the coolest surfaces on the underside of disc member 23P and would therefore serve as nucleation sites. Also, if disc member 23P were formed without structural formations encouraging localized cooling, e.g., with a flat underside, but with the overlying cooling pegs, the localized areas below each peg would be the coolest surfaces on the underside of disc member 23P and would serve as nucleation sites. Nevertheless, a combination of localized heat removal (e.g., pegs 90P) and structural formations encouraging localized cooling (e.g., nucleation sites 80P) is preferred.

Figure 19B:
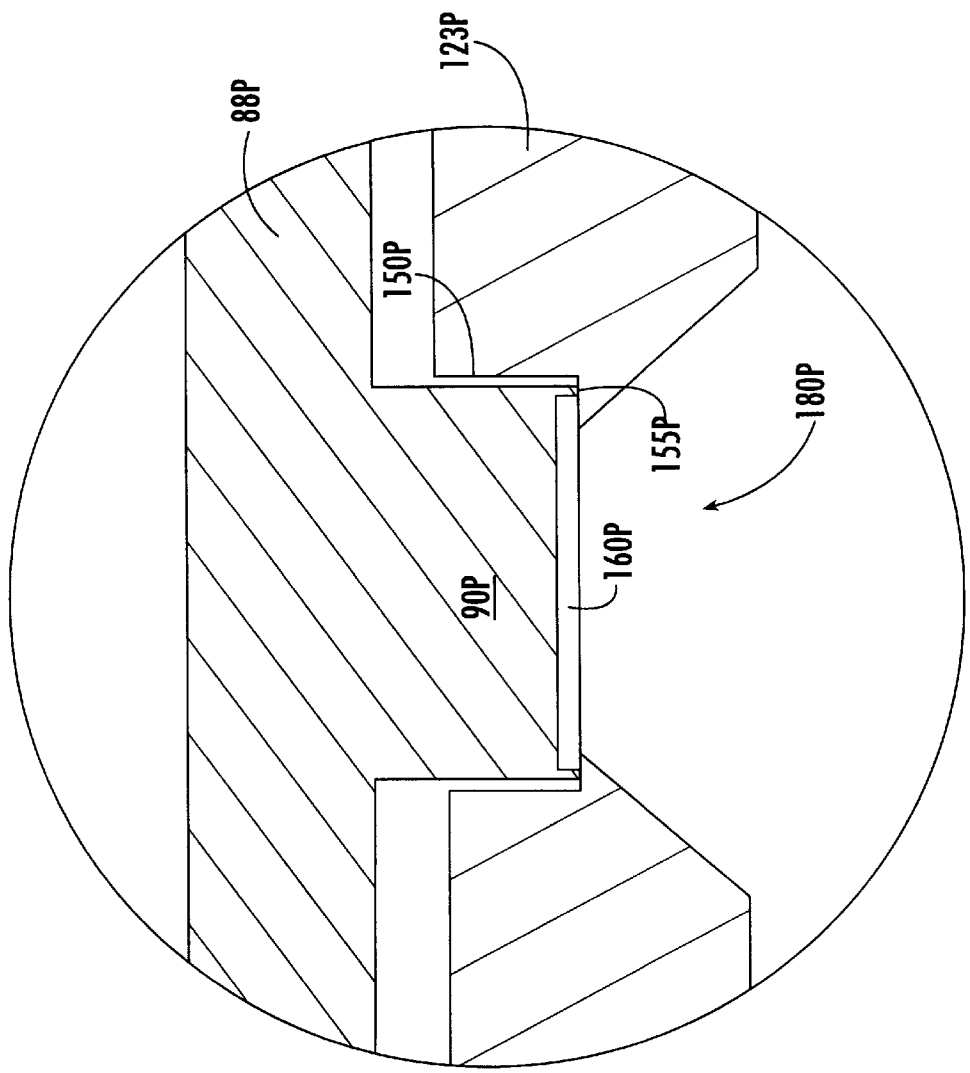
FIG. 19B is a further enlarged view of the area within the circle 19B of FIG. 19A.

FIGS. 19A and 19B show a structure similar to that of FIG. 18, but with a disc member 123P that provides seeded nucleation sites 180P instead of the unseeded sites of FIG. 18. In the illustrated embodiment, disc member 123P has the same diameter as disc member 23P and can be interchangeably used with the same overlying member 88P, the same thermal sink rod 22P and without changing the furnace structure. Each nucleation site 180P on disc member 123P is formed by first milling out a conical portion from the underside of member 123P as described above, and thereafter drilling a cylindrical bore 150P directly overlying the conical portion. Bore 150P is sized slightly larger than peg 90P and extends to a depth sufficient to create an annular, horizontal shoulder 155P (FIG. 19B) where the cone is truncated. Shoulder 155P serves to support a circular seed 160P which is, in turn, engaged on its upper surface by its respective peg 90P. Thus, the alternative structure of FIGS. 19A and 19B serves to present seeded preferentially cooled nucleation sites. In a particular embodiment, disc member 123P has a diameter of approximately 45 cm, a thickness of approximately 0.5 cm and a cylindrical bore 150P having a diameter of approximately 1.0 cm. Bore 150P extends approximately halfway through disc member 23P. Seed 160P is a 0.08 cm thick, approximately 1 cm diameter 6H or 4H SiC seed cut on axis with the basal plane exposed. Shoulder 155P has a width of approximately 0.1 cm, so that an approximately 0.8 cm diameter portion of seed 160P is exposed.

While systems of the invention may be operated on a largely closed basis without significant effusion, preferred embodiments include effusion openings that permit venting or effusion of gases from the furnace central chamber 18P so as to remove impurities and stoichiometric excess and thereby maintain the proper source vapor constituents at the growing crystal interfaces afforded by the nucleation sites. To this end, effusion may be provided by a selected number (e.g. 8) effusion outlets 55P (FIG. 16) symmetrically disposed at the perimeter of furnace central zone 18P. Alternatively, effusion openings may be formed through circular disc member 23P in a symmetrical fashion, for example, with one or more effusion openings (not shown) located at each nucleation site. The effusion assist gas, e.g. $N_2$, that enters the system at the high purity $N_2$ feed (FIG. 15) may be directed to a thermally insulated effusion assist gas conveyance tube 135P that extends upwardly through the centermost porous graphite tube 44P as shown in FIGS. 16 and 17. More details of systems and processes for effective effusion at a growing crystal interface are contained in the applicant's application Ser. No. 08/730,882, filed Oct. 17, 1996, now U.S. Pat. No. 5,858,086, the contents of which are incorporated herein by reference in entirety.

The components that are exposed to the high furnace temperatures preferably are formed of a suitable material that is not chemically reactive in the furnace environment and will withstand temperatures up to approximately 2400° C. To this end, these components are preferably formed of polished graphite, polished silicon carbide, polished tungsten, or other suitable material, with polished graphite being preferred.

The temperature at the growing crystal interface is carefully controlled to create the desired thermal gradient by use of an optical pyrometer 79P and associated controller 81P according to principles known in the art.

Figure 20A:
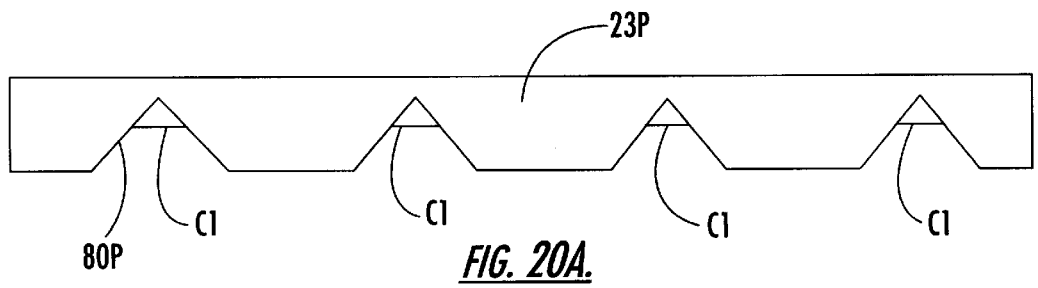
FIGS. 20A, 20B, 20C, 20D show the unseeded nucleation sites of FIG. 18 at various stages of a representative crystal growing operation.
Figure 20B:
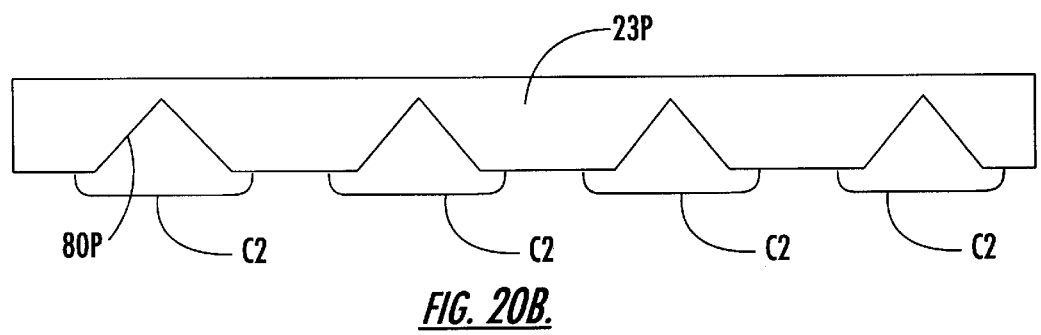
Figure 20C:
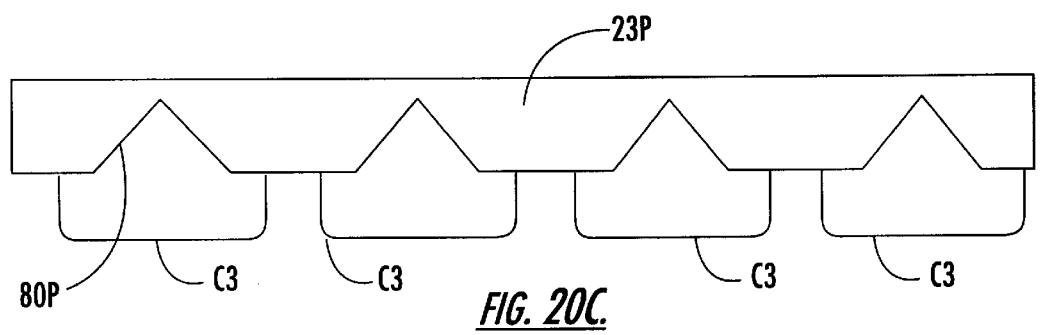
Figure 20D:
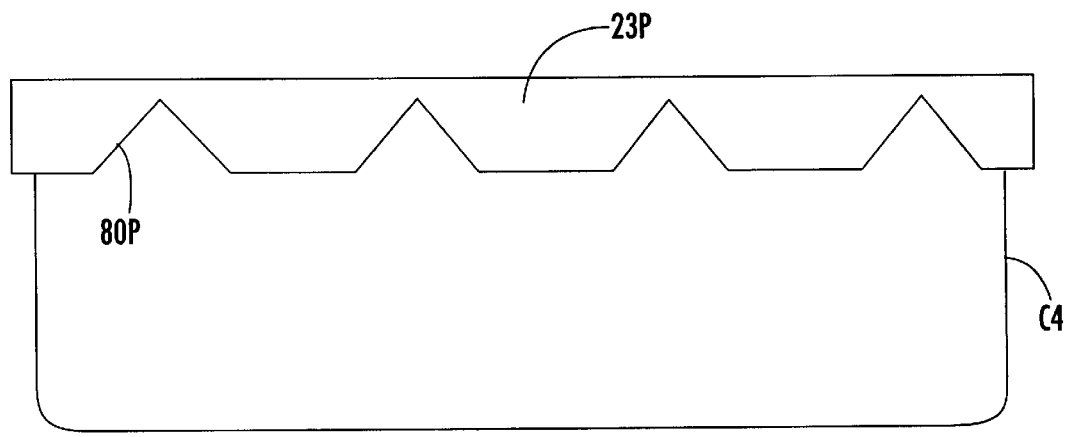
Figure 21A:
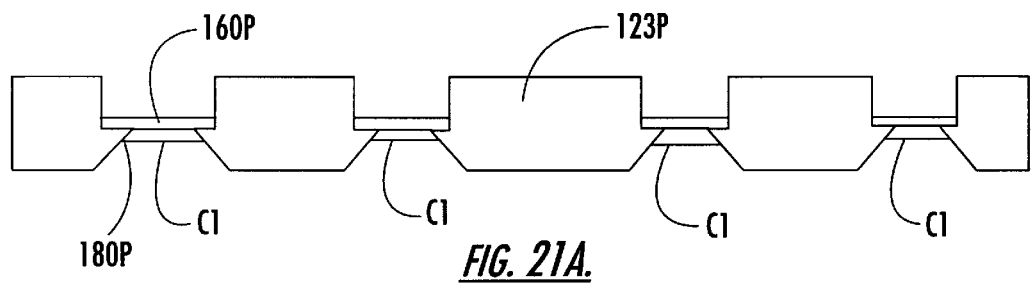
FIGS. 21A, 21B, 21C, 21D show the seeded nucleation sites of FIGS. 19A and 19B at various stages of a representative crystal growing operation.
Figure 21B:
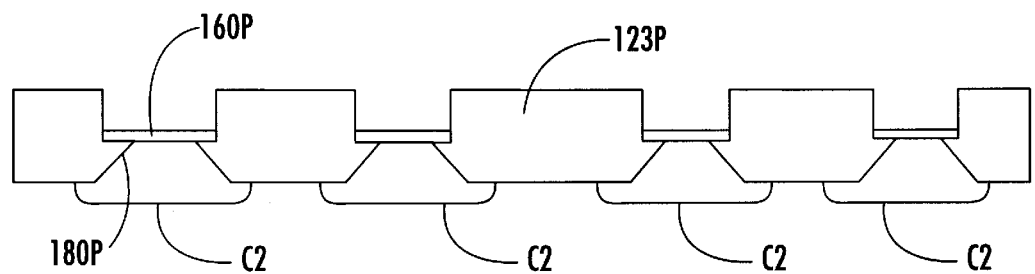
Figure 21C:
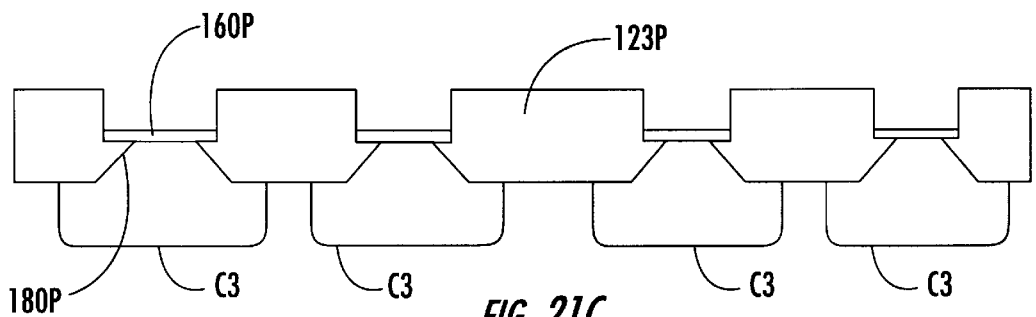
Figure 21D:
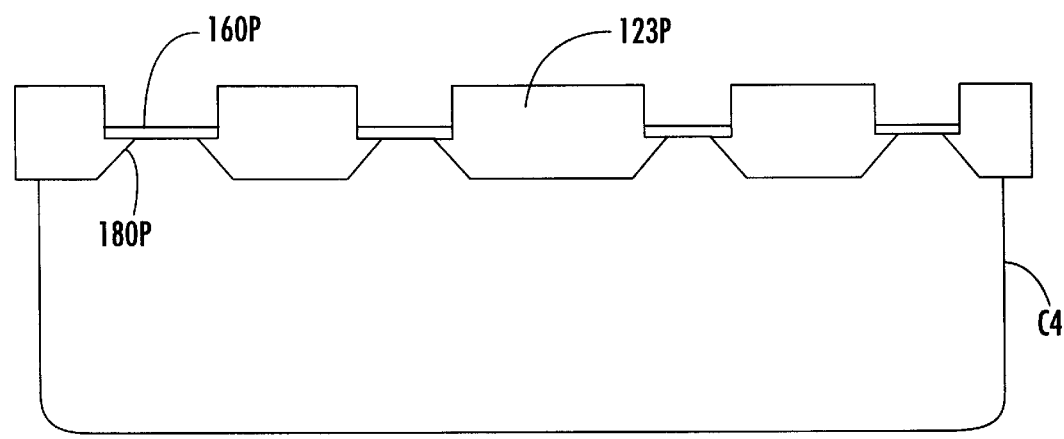

FIGS. 20A–20D show the sequential growth of bulk single crystals at four adjacent unseeded nucleation sites 80P. FIG. 20A illustrates the initial nucleation C1 of the crystal which will typically occur at the coolest region which is at or near the apex of the conical nucleation site. FIG. 20B shows the continued growth C2 of the crystal just beyond the conical opening. FIG. 20C shows the continued growth C3 of the crystal further beyond the conical structure. FIG. 20D shows the situation where the nucleation sites are close enough together that the growth C4 of adjacent crystals in the horizontal plane bring adjacent crystals into contact. In this regard, during longer crystal growth operations under favorable growth conditions, a large plate of single crystalline structure may be grown.

FIGS. 21A–21D illustrate a similar sequential crystal growth pattern for the seeded nucleation sites 180P.

Operation of the above-described crystal growth system will be described in more detail in the Example below.

EXAMPLE VII

A crystal growth system 10P incorporating the unseeded preferentially cooled nucleation sites of FIG. 18 is constructed and operated in accordance with the following parameters to produce bulk AlN: SiC alloy single crystals:

Inside diameter of water cooled chamber 30P: 122 cm

Inside diameter of furnace crucible containing the source material: 46 cm

Height of porous tubes 44P: 20.32 cm

Diameter of porous tubes: 3 cm

Number of porous tubes: 37

Source material: high purity 70% AlN:30% SiC powder

Tube volume: 16%

Source material volume: 84%

Weight of source material: 33,625 gm

Number of nucleation sites: 254

Structure of nucleation sites: unseeded, preferentially cooled

Temperature at bottom of source material: 2350° C.

Nucleation site temperature: 2125° C.

Thermal gradient from bottom of source material to nucleation sites: 9.3° C./cm

Conversion rate of source material to crystals: 22%

Crystal formation: 7397 gm (36,987 carats)

After loading the source material and aligning and securing the thermal sink rod 22P, member 88P and pegs 90P in heat transfer relation with respect to the nucleation sites, the system is pumped down to $10^{-3}$ torr with the mechanical vacuum pump in a linear ramp of 20 minutes. The turbomolecular pump is used to reduce the chamber pressure to $10^{-5}$ torr in 30 minutes. The growth chamber is back filled with high purity $N_2$ to a pressure of 760 torr. The furnace crucible is then heated to a temperature of 300° C. Next, the growth chamber in the central furnace zone is pumped down to a pressure of $10^{-3}$ torr. The system is then back filled with high purity $N_2$ to a pressure of 1,000 torr.

The pressure is held constant at 1,000 torr by throttling gas through the magnetic control valve while the crucible bottom temperature, as measured by the optical pyrometer, is increased from 300° C. to 2,350° C. in a linear ramp over 2 hours and 15 minutes.

Next, the system pressure is reduced to 8 torr in a linear ramp over 30 minutes. The seed temperature, as measured by the optical pyrometer, is held at 2,125° C. by adjusting the water flow to the thermal sink.

Next, $N_2$ effusion gas is flowed at a total rate of 45 standard cubic centimeters per minute via an MKS Instruments mass flow controller.

The system is then held in this configuration for 20 hours with an effusion rate of $N_e$=28% of $N_t$. Next, the crucible temperature is reduced from 2,350° C. to 1,200° C. in a linear ramp over a period of 1 hour and 30 minutes. The system is then back filled with nitrogen to a pressure of 760 torr in a linear ramp over a period of 1 hour as the power to the heating elements is reduced to zero in a linear ramp at the same time. After two hours the crucible is removed from the crystal growth chamber. Single crystalline AlN:SiC forms at the nucleation sites at a thickness in the range of about 14 mm to 22 mm. Over the course of the growth cycle the crystals at adjacent nucleation sites grow outward to form common boundaries, resulting in a large plate or plates containing a number of individual single crystals. (See FIG. 20D.)

Figure 22:
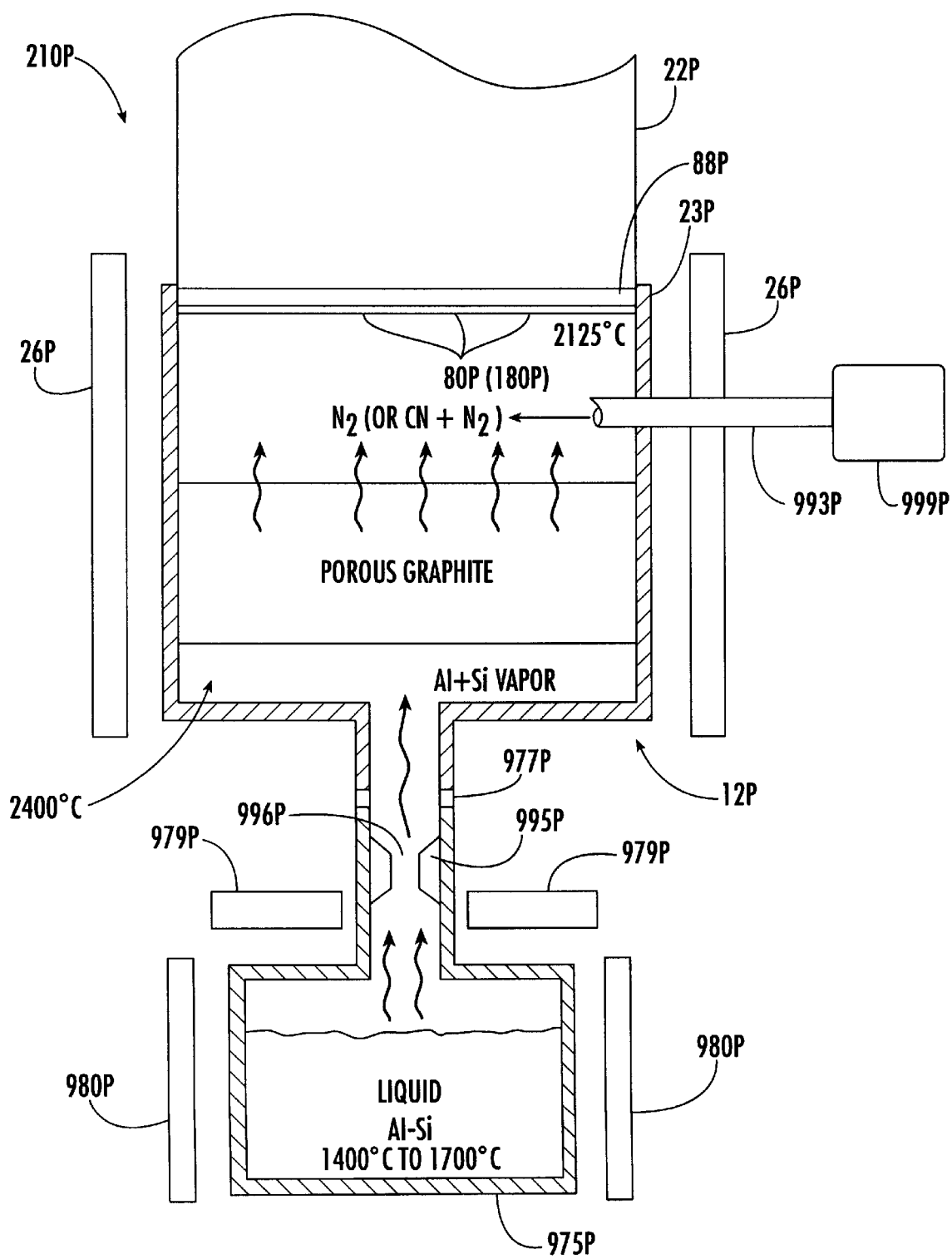
FIG. 22 is a schematic representation of portions of an alternative system for growing bulk single crystals of AlN:SiC alloy wherein Al and Si source vapor species emanate from a liquid Al—SiC melt and flow through a porous graphite medium.

FIG. 22 illustrates an alternative crystal growth system incorporating a vapor source apparatus 210P that is utilized to create a flow of Al, Si, N and C source vapor. In this system Al—Si vapor produced by heating liquid Al—Si to a specific temperature is combined with C and N vapor in the growth crucible to produce the desired flow and stoichiometry of source vapor. The area inside the growth crucible near the seeded or unseeded nucleation sites becomes saturated with Al, Si, C and N components that react to form AlN:SiC single crystalline alloy at the nucleation sites. More particularly, vapor source apparatus 210P includes the same or similar disc member 23P, nucleation sites 80P, pegs 90P, heat sink rod 22P and effusion openings as shown in FIGS. 15, 16 and 18. Liquid Al—Si is contained in a lower crucible 975P that if required, as in the case of a cold crucible, may be electrically insulated at 977P by a BN insulator ring, or a physical gap, or other suitable means. Thermal insulation may be provided by heat shields 979P. Crucible 975P may be a cold crucible, for example, a water-cooled copper crucible the contents of which is heated by a water-cooled induction heating coil 980P. Alternatively, crucible 975P may be formed of high density graphite, pyrolytic graphite, silicon carbide coated graphite or boron nitride. These crucibles may be heated by either resistance heating or induction heating, as appropriate. The liquid Al—Si is maintained at a temperature sufficient to create a suitable vapor flow under the conditions maintained in the crucible, particularly crucible pressure. For example, for a 30% Al/70% SiC (atomic percentage) composition the total Al and Si vapor pressure preferably is on the order of 5.46 torr at 1727° C. To create a suitable vapor flow rate, a temperature above about 700° C. is preferred. The Al and Si source vapor passes through a C containing gas-permeable medium such as porous graphite that provides C source vapor species. Additionally, a source of N vapor species is provided through a gas injector 993P in the form of $N_2$ or other N containing gas as discussed above. The gas injected through injector 993P may also take the form of a C and N containing source gas. In one embodiment, the C and N containing source gas is CN that is transported in an appropriate carrier gas such as $N_2$. The flow of the C and N containing source gas is achieved by an appropriate apparatus such as, in the case of CN, utilizing a thermal mass controller 999P that controls the flow of $N_2$ across paracyanogen at an elevated temperature (e.g. >850° C.) so that a desired flow of CN in $N_2$ is produced. System 210P includes a horizontal baffle plate 995P above the molten liquid Al—Si to facilitate transportation of Al and Si source vapor into the portion of the growth crucible that contains the nucleation sites. More particularly, horizontal baffle plate 995P, containing a central opening 996P, extends across the flow passage through which the Al and Si source vapor flows to create a pressure gradient thereacross and a resultant velocity increase to the Al and Si vapor moving into the growth crucible. This arrangement serves to reduce the back diffusion of CN or other C and N containing gases toward the liquid Al—Si, while also serving to propel the Al and Si source vapor toward the growing crystal interface. This is particularly important when the crystal growth temperature is higher than the temperature required to vaporize the liquid Al and Si. As shown in FIG. 22, in one representative crystal growth cycle the liquid Al—Si in crucible 975P may be held at 1400° C. to 1700° C. to produce sufficient Al—Si vapor at system pressure. The bottom of the furnace crucible is at approximately 2400° C. while the nucleation sites are preferentially cooled to approximately 2125° C. For a furnace chamber having a height of 20 cm, this produces a thermal gradient of approximately 11.25 cm.

Figure 23:
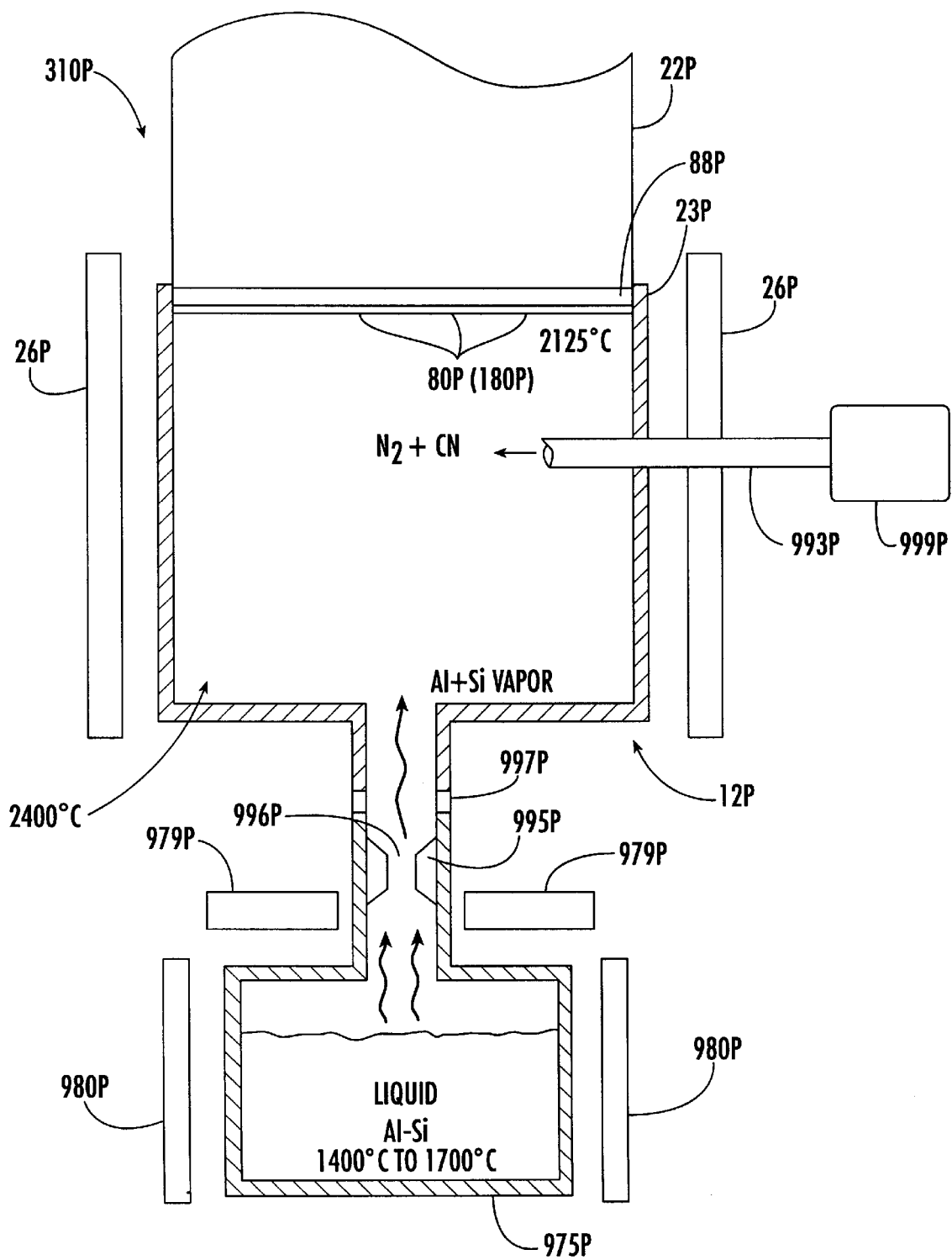
FIG. 23 shows a system similar to the system of FIG. 22 but with the porous graphite medium removed and the carbon vapor species being provided by injected CN gas.

FIG. 23 shows a crystal growth system 310P that is similar to the system of FIG. 22 except that the carbon containing gas-permeable medium has been removed so that the Al and Si vapor species are provided by vaporizing the liquid melt while the N and C vapor species are provided by C and N containing source gas(es), in this case CN carried by $N_2$ as produced utilizing paracyanogen as described above.

Figure 24:
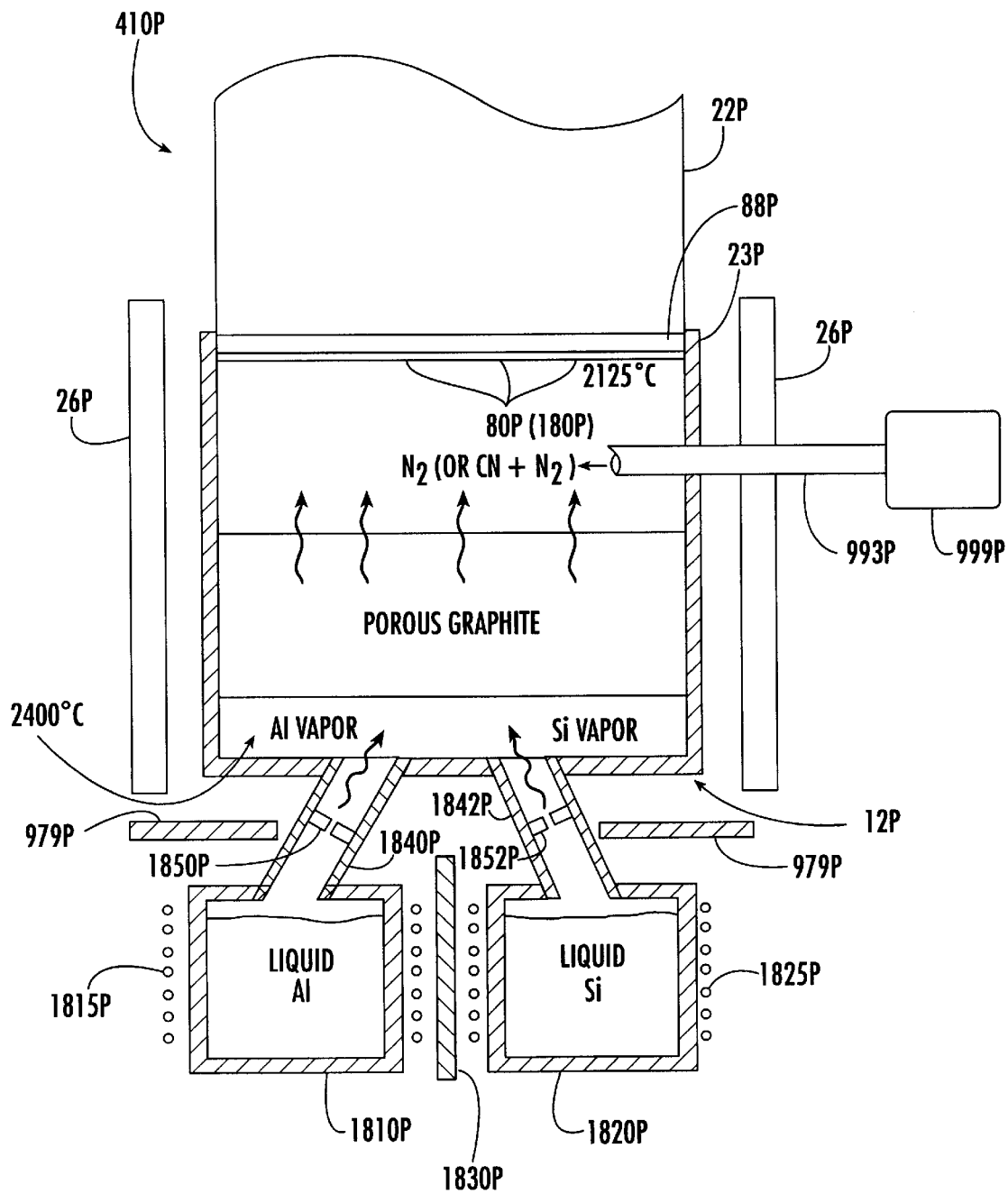
FIG. 24 is a schematic representation of portions of another alternative system for growing bulk single crystals of AlN:SiC alloy wherein Al and Si source vapor species emanate from individual separately controlled liquid melts of Al and Si respectively.

FIG. 24 illustrates a crystal growth apparatus 410P that is similar to the system shown in FIG. 22, but with separately contained molten liquid sources of Al and Si source vapors. More particularly, apparatus 410P includes a first crucible 1810P that holds liquid Al at a temperature controlled by a water-cooled induction heating coil 1815P and a second crucible 1820P that holds liquid Si at a temperature controlled by heating coil 1825P. A thermal and electrical insulator 1830P separates crucibles 1810P and 1820P. Crucibles 1810P and 1820P communicate with the growth crucible by respective Al/Si vapor flow conduits 1840P, 1842P which preferably include baffles 1850P, 1852P with central openings for creating a pressure gradient and facilitating vapor flow in the manner described above in connection with the embodiment of FIG. 22. The independent crucibles for producing Al and Si vapors are advantageous because the vapor pressure of Al is considerably higher than that of Si. Thus, when Al and Si are contained in liquid form in a common crucible, as in the embodiment of FIG. 22, the percentage composition of the Al—Si liquid must be controlled to produce the proper ratio of Al and Si vapors under the common temperature and pressure conditions in the crucible. Stated differently, a combined molten solution of Al—Si would typically require a high (atomic weight) percentage of Si therein to obtain the desired Al and Si vapor composition in the growth crucible. On the other hand, the separate crucibles of FIG. 24 permit independent temperature control for better control of vaporization rates of the Al and Si.

Figure 25:
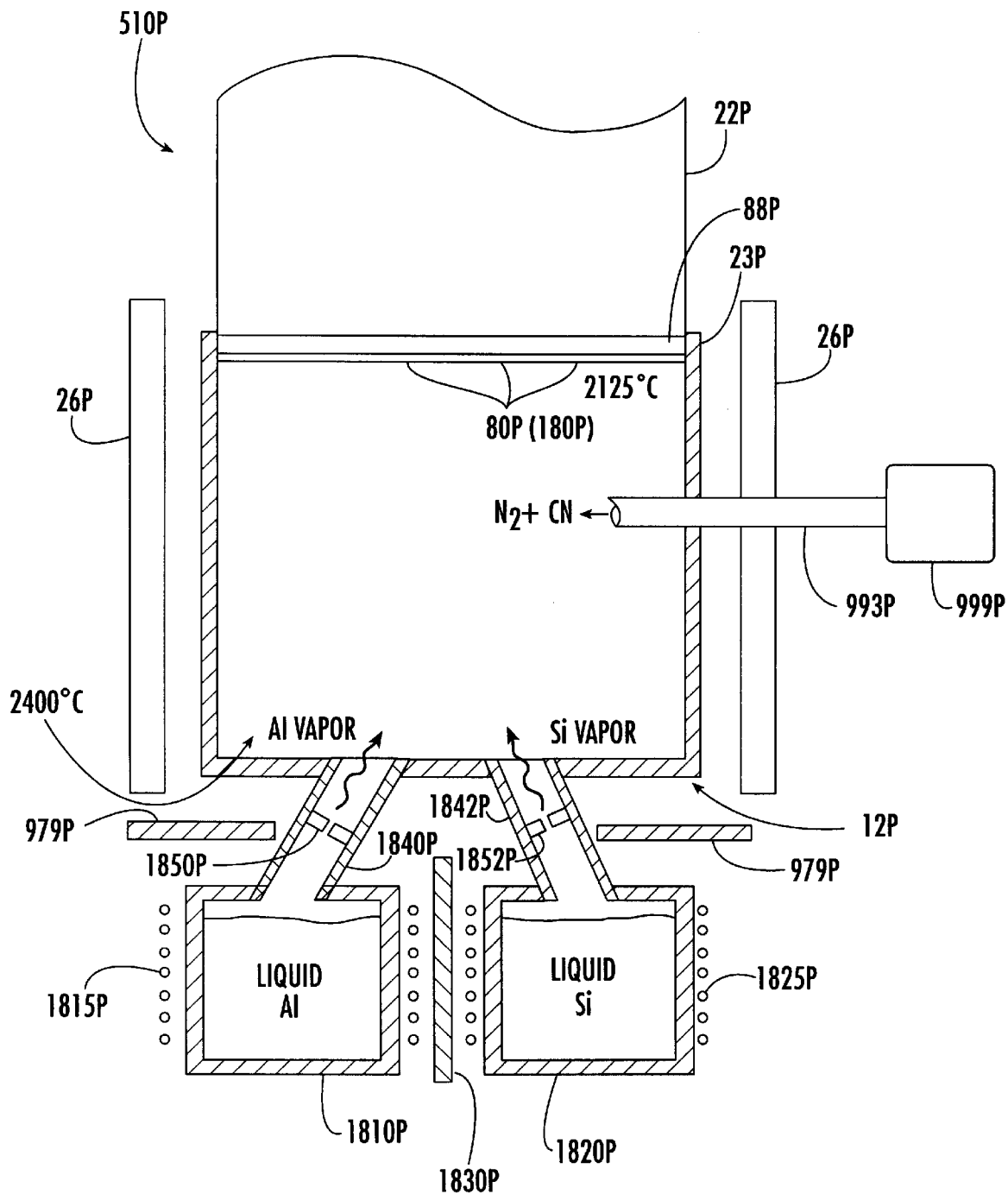
FIG. 25 shows a system similar to the system of FIG. 24 but with the porous graphite medium removed and the carbon vapor species being provided by injected CN gas.

FIG. 25 shows another crystal growth system 510P that is similar to the system of FIG. 24 except that the carbon containing gas-permeable medium has been removed so that the Al and Si vapor species are provided by vaporizing the liquid melt while the N and C vapor species are provided by C and N containing source gas(es), in this case CN carried by $N_2$ as produced utilizing paracyanogen as described above.

It will be appreciated that the systems of FIGS. 22–25 permit the use of very pure source vapors and the ability to carefully control the stoichiometry. These factors, coupled with the placement of the nucleation sites (either unseeded or seeded) near the molten liquid vapor sources, makes possible the operation of a system with little or no effusion, with it being understood that effusion is preferred.

It will also be appreciated with respect to the embodiments of FIGS. 22–25 that under certain pressure and temperature conditions the Si and Al, either combined or separately contained, may be vaporized from the solid form, instead of liquid.

The description will now turn to a discussion of another form of preferentially cooled multiple nucleations sites. FIGS. 26A and 26B schematically show top and side views respectively of a disc member 223P that forms a crucible upper surface in the same manner as disc members 23P and 123P served in connection with the embodiments of FIGS. 15–19.

FIGS. 26A and 26B shows the situation at time t=0 in the crystal growth cycle, while FIGS. 27A, 27B through 31A, 31B show the crystal growth sequence at other times through the end of a 20 hour growth cycle. Disc member 223P is divided into five concentric ring cooling zones 1–5. Above each cooling zone is a respective heat removal system (not shown) that removes heat from that zone. The heat removal systems are separately operated to preferentially cool the respective underlying portions of disc member 223P. In operation, at t=0 (FIGS. 26A and 26B) zone 1 is activated to cool the center of disc member 223P and to create a preferentially cooled nucleation site thereunder. At t=1 hour (FIG. 27A and FIG. 27B) zone 2 is activated along with zone 1. By this time, nucleation of single crystalline $AlN_X$:$SiC_Y$ has begun at the center of disc member 223P in zone 1. At t=2 hour (FIGS. 28A and 28B) zone 3 is activated in addition to zones 1 and 2. At this time, the crystal has grown radially outwardly in a rapid manner, preferably in the direction of the basal plane of the crystal. At t=3 hours (FIGS. 29A and 29B) zone 4 is activated along with zones 1–3. By this time the crystal has grown well into zone 3. At t=4 hours (FIGS. 30A and 308B) zone 5 is activated so that the entire disc member 223P may be cooled from that time until the end of the growth cycle. At t=20 hours (FIGS. 31A and 31B) the growth cycle is terminated and the crystal has grown to a desired thickness on the order of 20–50 mm. It will be appreciated that in accordance with the present invention, the system described in FIGS. 26–31 describes sequential preferential cooling of nucleation sites as the growth of single crystalline $AlN_X$:$SiC_Y$ progresses. While not illustrated, the heat removal system above each zone 1–5 may comprise separate, computer controlled concentric cooling water circulation zones contained within a heat sink rod. Also, the lower surface of disc member 223P may include structural formations that encourage localized cooling, e.g. structure similar to sites 80P shown in FIG. 18. When such structure is incorporated into the embodiment of FIGS. 26–31, the system includes both sequential, localized heat removal and structural formations encouraging localized cooling.

It will be appreciated that the crystals are typically produced on a batch basis. Following each run and cooldown period, the furnace is opened and the crystals are removed from the nucleation sites.

Figure 32:
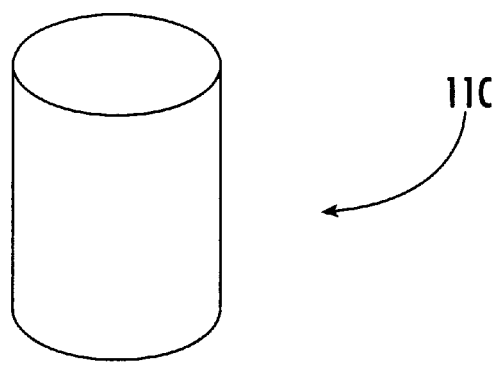
FIG. 32 is a pictorial view of a boule comprising a large single crystal.
Figure 33:
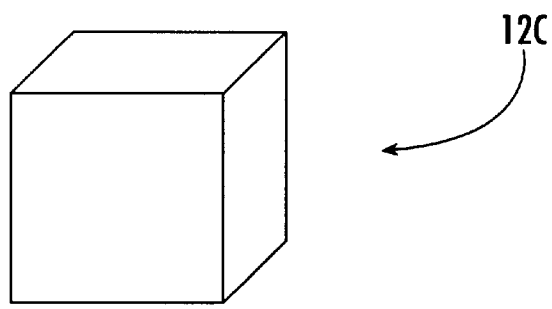
FIG. 33 is an enlarged pictorial view of a rough synthetic gemstone cut from the single crystal of FIG. 32.
Figure 34:
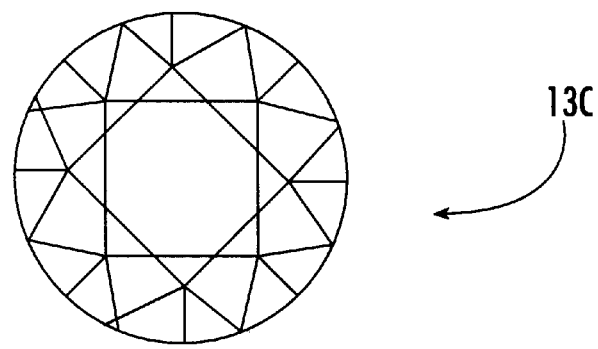
FIG. 34 is an enlarged view of a finished synthetic gemstone fashioned from the rough stone of FIG. 33.

Fashioning the Bulk Single Crystals of AlN and AlN:SiC Alloy into Finished Gemstones Referring to FIGS. 32–34, a bulk AlN or AlN:SiC alloy crystal 11C (FIG. 32) is cut into multiple rough synthetic gemstones 12C (one shown in FIG. 33) having a selected weight, for example, 0.2 to 5 carats. The rough gemstone 12C may have a cubic or approximately cubic shape. In order to produce a finished gemstone as illustrated in FIG. 34, it has been found desirable to fashion the rough gemstone 12C into a finished gemstone having precise angles and very sharp edges associated with diamond gemstones in order to take full advantage of the toughness and hardness of the material and to create maximum fire and brilliance. A more complete description of the fashioning process will be set forth below following a brief discussion of fashioning, in general, and certain aspects of fashioning colored gemstones such as rubies, sapphires and emeralds.

Fashioning in General (Prior Art)

Gemstone fashioning includes four techniques: faceting, tumbling, cabbing and carving. Faceting produces flat faces (facets) on gems of many different shapes. Transparent and highly translucent gems are normally faceted. Less translucent and opaque materials are usually tumbled, cabbed or carved because the optical properties associated with faceting depend on light reflecting from inside the stone.

A gem's shape is its outline face up, the position in which it is meant to be seen when it is mounted. Shapes other than round are called fancy. Some popular fancy shapes include the well-known emerald cut, cushion, antique cushion, oval, pear and marquis. Colored stones (and diamonds over three carats) are generally cut into fancy shapes because a lapidary can keep more weight of the original gemstone by utilizing a fancy shape, thus improving the weight yield.

The precise, standardized faceting seen in diamonds is rare in colored stones. One reason is the inability of some colored stones, because of their lower hardness and toughness, to be faceted into sharp angles without breaking or chipping. Another is the difference in what professionals and consumers expect of diamonds versus other stones. "Oriental or native cut" are terms used to describe faceted gems which have distorted shapes and irregularly placed facets and are more common on colored stones. The jewelry industry accepts not perfected faceted colored stones. Most colored stones are faceted just enough to let light in.

Most faceted gems have three main parts: crown, girdle and pavilion. The crown is the top part, the girdle is the narrow section that forms the boundary between the crown and pavilion; it is the gem's setting edge. The pavilion is the bottom. Colored stones usually have facets on the pavilion and crown.

The Fashioning Process in General for Colored Stones (Prior Art)

The colored gemstone faceter begins by grinding the rough colored gemstone into the approximate shape and dimensions of the finished stone. This is called preforming. Preforming takes a coarse abrasive. Diamond grit embedded in a nickel-plated copper disc is the best choice for preforming very hard colored stones (corundum, chrysoberyl, spinel and silicon carbide).

Water is the wetting agent in preforming and the rest of the faceting sequence. Lapidaries use various arrangements to keep the wheels wet. Preforming roughs in the girdle outline and the general profile of the crown and pavilion, leaving a frosted surface all around the stone. Before grinding in the facets, the lapidary needs to mount the colored stone on dopstick. The procedure is called dopping. The stone is gently heated, then brought up against the end of the dop, which has been dipped into melted dopping wax. Once the preform has set in position, it is set aside to cool.

The facets of the colored stone are ground and polished on horizontally spinning wheels called laps. Lapidaries use a series of cutting laps with progressively finer grit to grind in the facets, gradually smoothing out their surfaces. Then they do final polishing on a special polishing lap.

Polishing laps are made from a variety of materials. The polishing agents with which these are charged are very finely ground powders, including diamond, corundum, cerium oxide and tin oxide. To cut and polish consistently at the same desired angles, the faceter attaches the dopstick to a device that holds the stone in position as it meets the lap. The traditional setup used in many colored stone shops is the jamb peg. This has a block mounted on a vertical post. The dopstick fits into one of a series of holes on the side of the block. The position of each hole sets a specific angle (from the girdle plane) at which the facet is cut. Turning the dopstick in the hole places all the facets of a given type at the same angle in their circuit around the stone.

The Fashioning Process for AlN and AlN:SiC Alloy Gemstones

Because the beauty of most diamonds depends on sparkle, brilliance and fire (not color), diamond cutters must carefully control the cutting factors that affect these characteristics. Because the refractive indices of the AlN and AlN:SiC alloy crystals are comparable to that of diamond, according to the present invention the gemstones are fashioned with precision diamond cuts. First, the rough gemstone is attached to a dop by a suitable adhesive, preferably an epoxy or a superglue. The dop is installed in a conventional faceting machine having precision guidance and placement mechanisms for faceting and polishing the stone on a flat, rotating lap. The initial rough faceting is performed using an 80 mesh size (approximately 200 micron particle size) diamond grit lap. In the case of a typical round brilliant stone, the pavilion facets may be formed first, usually 24 facets. The 80 mesh size diamond grit lap may be followed sequentially by the diamond grit laps in the table below:

| Mesh Size | Approximate Particle Size |
| --- | --- |
| 325 | 50 microns |
| 1200 | 15 microns |
| 8000 | 3 microns |
| 14,000 | 2 microns |
| 50,000 to 100,000 | 0.25 to 1 micron |

The 14,000 mesh size lap produces a suitable final polish substantially without polish lines visible to the naked eye. However, 50,000 to 100,000 mesh produces an even finer polish, with polish lines substantially absent at 10× magnification.

After the pavilion is fully faceted and polished, the stone is turned 180° and attached to a dop so that the crown can be faceted and polished using the same progression of laps. According to this faceting and polishing method, water is utilized on the lap to serve as both a coolant and a lubricant. Once both the pavilion and crown have been fully faceted and polished, the result is the finished round brilliant gemstone 13C shown in FIG. 34.

As mentioned above, in addition to alloying aluminum nitride by substituting a desired atomic percentage of silicon carbide into the lattice structure for aluminum nitride, the properties of the resultant gemstone may, under certain circumstances, be enhanced by doping the single crystalline aluminum nitride with a nonelectronically active impurity. In this regard, doping with gallium (Ga) at concentrations in the range of $10^{-15}$ to $10^{-16}$ may be used to enhance the gemstone properties. Other dopants such as cerium, gadolinium and samarium may also be used.

While the present invention has been described in connection with certain illustrated embodiments, it will be appreciated that modifications may be made without departing from the true spirit and scope of the invention.

That which is claimed:

1. A simulated diamond gemstone comprising a single crystal of colorless, synthetic AlN or AlN:SiC alloy polished to a degree sufficient to permit the introduction of light into the gemstone for internal reflection from inside the gemstone.

2. The simulated diamond gemstone of claim 1 wherein the single crystal is an $AlN_x:SiC_y$ single crystal where x+y=1 and x is between approximately 0.05 and 1 and y is between approximately 0.95 and 0.

3. The simulated diamond gemstone of claim 1 wherein the single crystal is an $AlN_x:SiC_y$ single crystal where x+y=1 and x is between approximately 0.5 and 0.8 and y is between approximately 0.5 and 0.2.

4. A simulated diamond gemstone comprising a single crystal of colorless, synthetic AlN or AlN:SiC alloy having facets polished to a degree of smoothness characteristic of finished diamond gemstones.

5. A method of producing a simulated diamond gemstone of synthetic AlN or AlN:SiC alloy single crystal comprising the steps of:

cutting a single crystal of AlN or AlN:SiC alloy into a plurality of rough synthetic gemstones; and faceting and polishing one of the rough synthetic gemstones into a finished gemstone.

6. A method of producing a finished simulated diamond gemstone comprising:

growing a single crystal of colorless AlN or AlN:SiC alloy; and shaping and dimensioning the crystal with facets and polishing the facets to a degree of optical smoothness characteristic of finished diamond gemstones, to thereby produce a finished simulated diamond gemstone.

7. A method of producing a finished simulated diamond gemstone comprising faceting and polishing a rough gemstone formed of a single crystal of colorless synthetic AlN or AlN:SiC alloy to produce a finished simulated diamond gemstone having shape and polish characteristics permitting light to enter the gemstone and reflect from inside the gemstone.

8. A simulated diamond gemstone comprising single crystalline AlN doped with nonoptically active impurities or compensated impurities to increase the hardness and refractive index of colorless or near colorless AlN, said gemstone being polished to a degree sufficient to permit the introduction of light into the gemstone for internal reflection from inside the gemstone.

* * * * *